United States Patent
Hunt et al.

(10) Patent No.: US 7,266,489 B2
(45) Date of Patent: Sep. 4, 2007

(54) METHOD, SYSTEM AND PROGRAM PRODUCT FOR DETERMINING A CONFIGURATION OF A DIGITAL DESIGN BY REFERENCE TO AN INVERTIBLE CONFIGURATION DATABASE

(75) Inventors: Bryan Ronald Hunt, Austin, TX (US); Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 737 days.

(21) Appl. No.: 10/425,053

(22) Filed: Apr. 28, 2003

(65) Prior Publication Data

US 2004/0215435 A1  Oct. 28, 2004

(51) Int. Cl.
*G06F 17/50* (2006.01)
(52) U.S. Cl. ............................. 703/14; 707/104.1
(58) Field of Classification Search ............ 703/14, 703/15, 16; 707/104.1
See application file for complete search history.

(56) References Cited

U.S. PATENT DOCUMENTS

| | | | | |
|---|---|---|---|---|
| 5,049,814 A | * | 9/1991 | Walker et al. | ............ 714/736 |
| 5,719,783 A | | 2/1998 | Kerzman et al. | |
| 6,009,531 A | | 12/1999 | Selvidge et al. | |
| 6,141,630 A | * | 10/2000 | McNamara et al. | .......... 703/14 |
| 6,216,255 B1 | | 4/2001 | Ito et al. | |
| 6,260,177 B1 | | 7/2001 | Lee et al. | |
| 6,378,123 B1 | | 4/2002 | Dupenloup | |
| 6,466,898 B1 | | 10/2002 | Chan | |
| 6,574,787 B1 | | 6/2003 | Anderson | |
| 6,588,006 B1 | | 7/2003 | Watkins | |
| 6,618,839 B1 | | 9/2003 | Beardslee et al. | |
| 6,629,249 B2 | | 9/2003 | Gonzalez | |
| 6,823,497 B2 | | 11/2004 | Schubert et al. | |
| 6,826,732 B2 | | 11/2004 | Hunt et al. | |
| 2002/0108092 A1 | | 8/2002 | Yasuda | |
| 2003/0009477 A1 | | 1/2003 | Wilding et al. | |
| 2003/0182642 A1 | | 9/2003 | Schubert | |

(Continued)

OTHER PUBLICATIONS

U.S. Appl. No. 10/425,096, filed Apr. 28, 2003; by Bryan Ronald Hunt et al.; For: Method, System and Program Product for Specifying a Configuration of a Digital System Described by a Hardware Description Language (HDL) Model.

(Continued)

*Primary Examiner*—Paul Rodriguez
*Assistant Examiner*—Luke Osborne
(74) *Attorney, Agent, or Firm*—Casimer K. Salys; Dillon & Yudell LLP

(57) ABSTRACT

A method for determining the configuration of a digital design first obtains a set of latch values of a plurality of latches within the digital design. A setting of a Dial instance is then determined based upon the set of latch values by reference to a configuration database that specifies a mapping table uniquely associating each a plurality of different settings of the Dial with a respective one of a plurality of different sets of latch values. The setting of the Dial instance is then output. In one embodiment, the setting of the Dial is contained in a simulation setup file utilized to configure a simulation model to a state approximating the state of the digital design represented by the set of latch values.

20 Claims, 43 Drawing Sheets

U.S. PATENT DOCUMENTS

2004/0088689 A1    5/2004    Hammes
2005/0050509 A1    3/2005    Fields, Jr. et al.

OTHER PUBLICATIONS

U.S. Appl. No. 10/425,074; filed Apr. 28, 2003; by Wolfgang Roesner et al.; For: Method, System and Program Product for Automatically Transforming a Configuration of a Digital System Utilizing Traceback of Signal States.

U.S. Appl. No. 10/425,041; filed Apr. 28, 2003; by Bryan Ronald Hunt et al.; For: Method, System and Program Product for Configuring a Simulation Model of a Digital Design.

U.S. Appl. No. 10/425,075; filed Apr. 28, 2003; by Bryan Ronald Hunt et al.; For: Method, System and Program Product for Utilizing a Configuration Database to Configure a Hardware Digital System.

U.S. Appl. No. 10/425,076, filed Apr. 28, 2003; by Wolfgang Roesner et al.; For: Method, System and Program Product that Utilize a Configuration Database to Configure a Hardware Digital System Having an Arbitrary System Size and Component Set.

U.S. Appl. No. 10/425,070, filed Apr. 28, 2003; by Bradley Nelson et al.; For: Method, System and Program Product for Specifying a Dial Group for a Digital System Described by a Hardware Description Language (HDL) Model.

U.S. Appl. No. 10/425,079, filed Apr. 28, 2003; by Wolfgang Roesner et al.; For: Method, System and Program Product for Specifying and Using a Dial Having a Default Value to Configure a Digital System Described by a Hardware Description Language (HDL) Model.

U.S. Appl. No. 10/425,051, filed Apr. 28, 2003; by Wolfgang Roesner et al.; For: Method, System and Program Product for Specifying a Configuration for Multiple Signal or Dial Instances in a Digital System.

U.S. Appl. No. 10/425,080, filed Apr. 28, 2003; by Wolfgang Roesner et al.; For: Method, System and Program Product for Implementing a Read-Only Dial in a Configuration Database of a Digital Design.

U.S. Appl. No. 10/425,089, filed Apr. 28, 2003; by Wolfgang Roesner et al.; For: Method, System and Program Product that Utilizes a Configuration Database to Configure a Hardware Digital System Having Multiple Access Methods.

U.S. Appl. No. 10/425,072, filed Apr. 28, 2003; by Wolfgang Roesner et al.; For: Method, System and Program Product for Reducing a Size of a Configuration Database Utilized to Configure a Hardware Digital System.

* cited by examiner

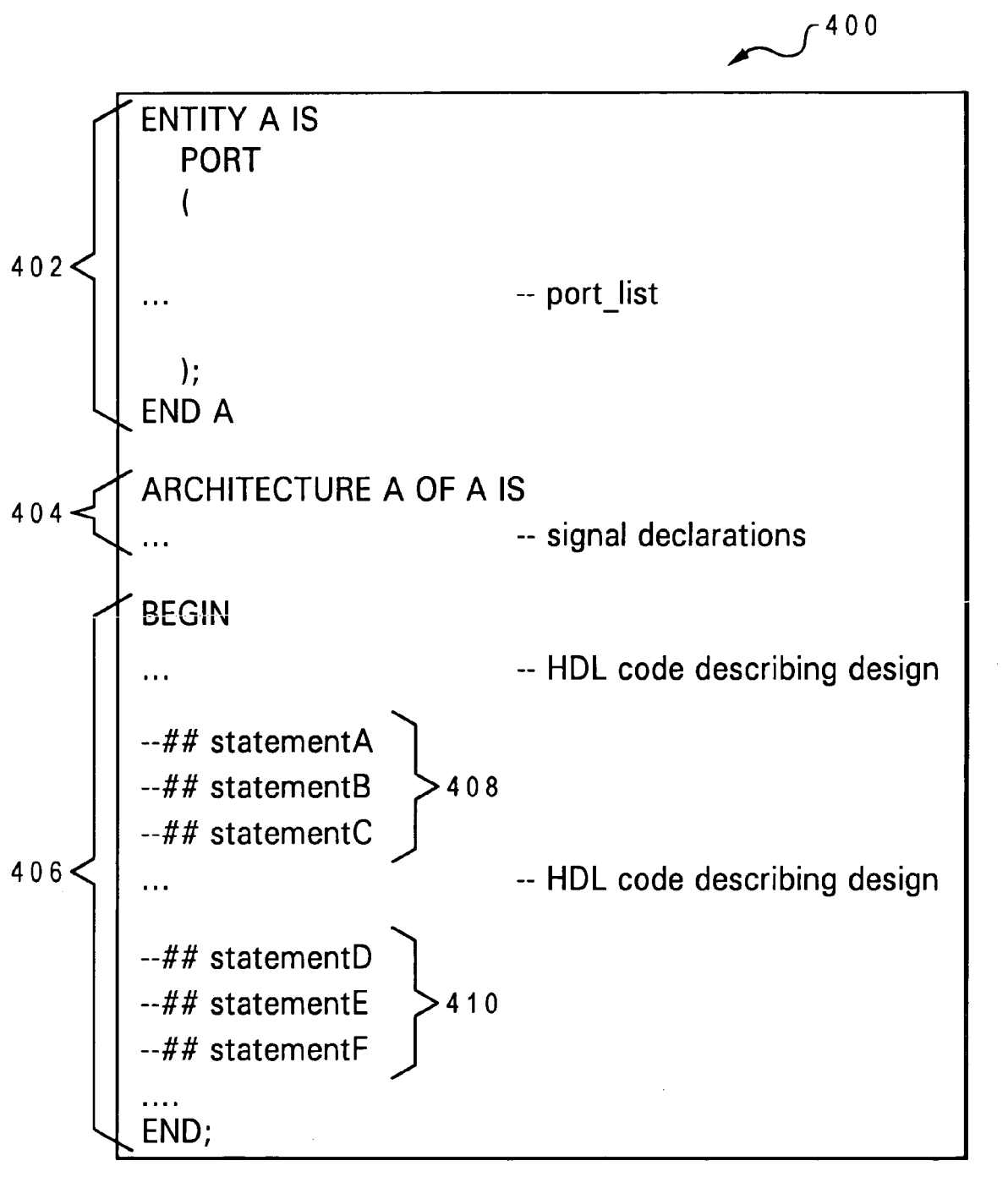

```
                                                    ┌─ 400
ENTITY A IS
    PORT
    (

402 ...                           -- port_list

);
END A

404  ARCHITECTURE A OF A IS
     ...                          -- signal declarations BEGIN
     ...                          -- HDL code describing design --## statementA  ⎫
     --## statementB  ⎬ 408
     --## statementC  ⎭
406  ...                          -- HDL code describing design --## statementD  ⎫
     --## statementE  ⎬ 410
     --## statementF  ⎭
     ....
     END;
```

*Fig. 4A*

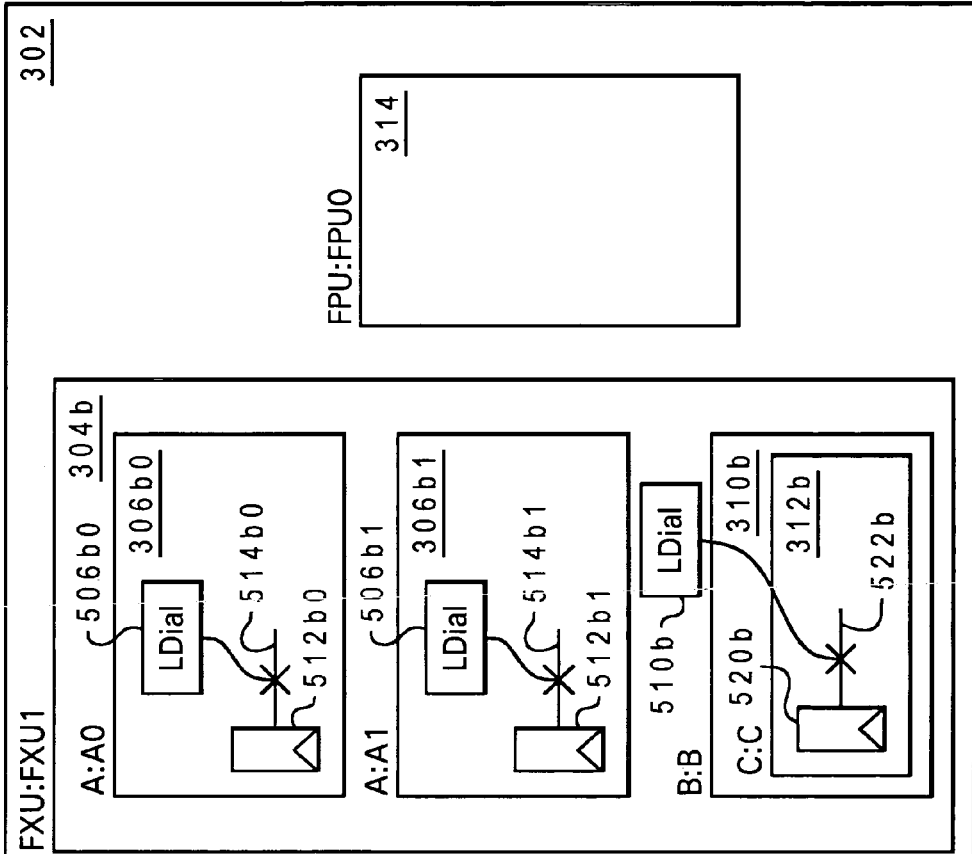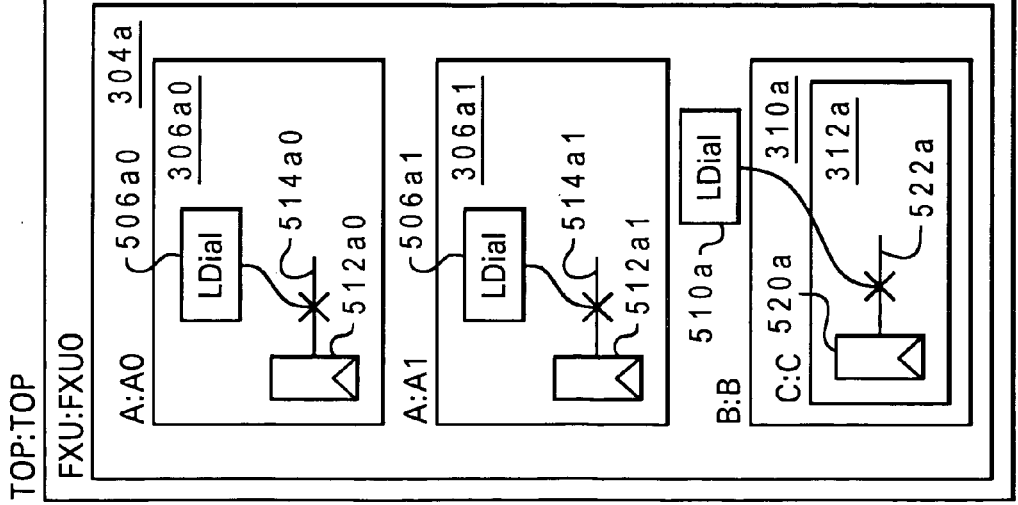
Fig. 5B

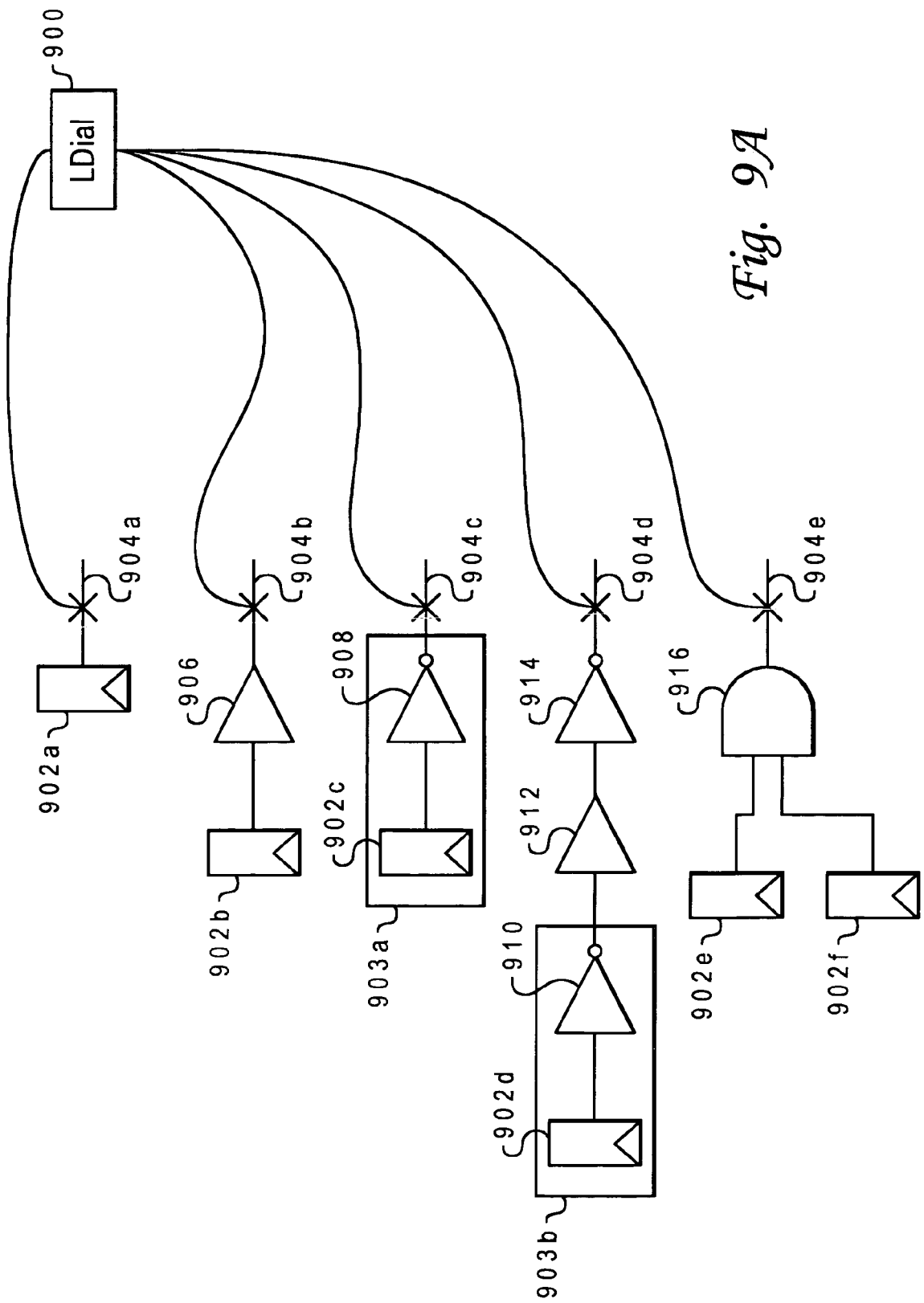

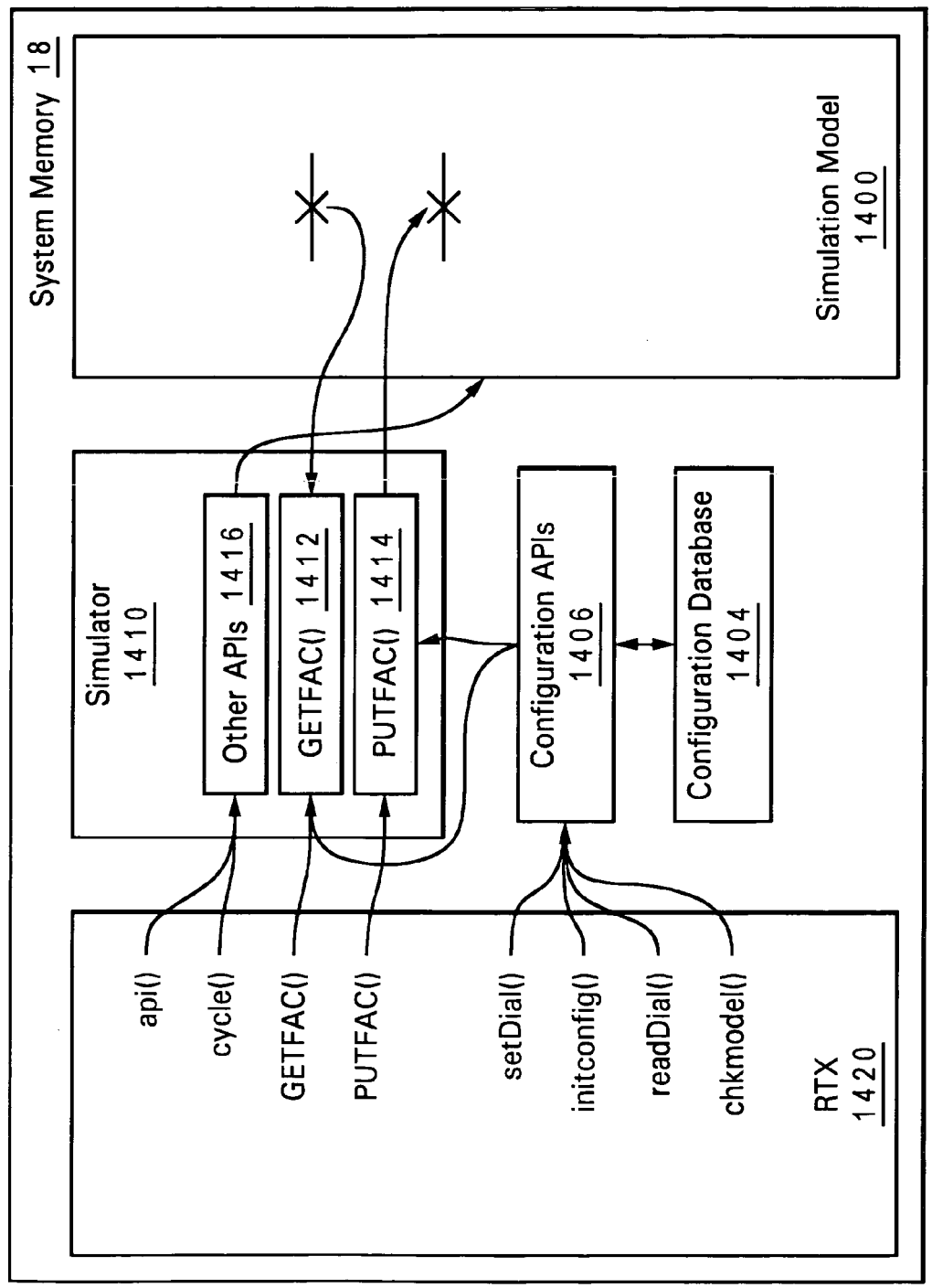

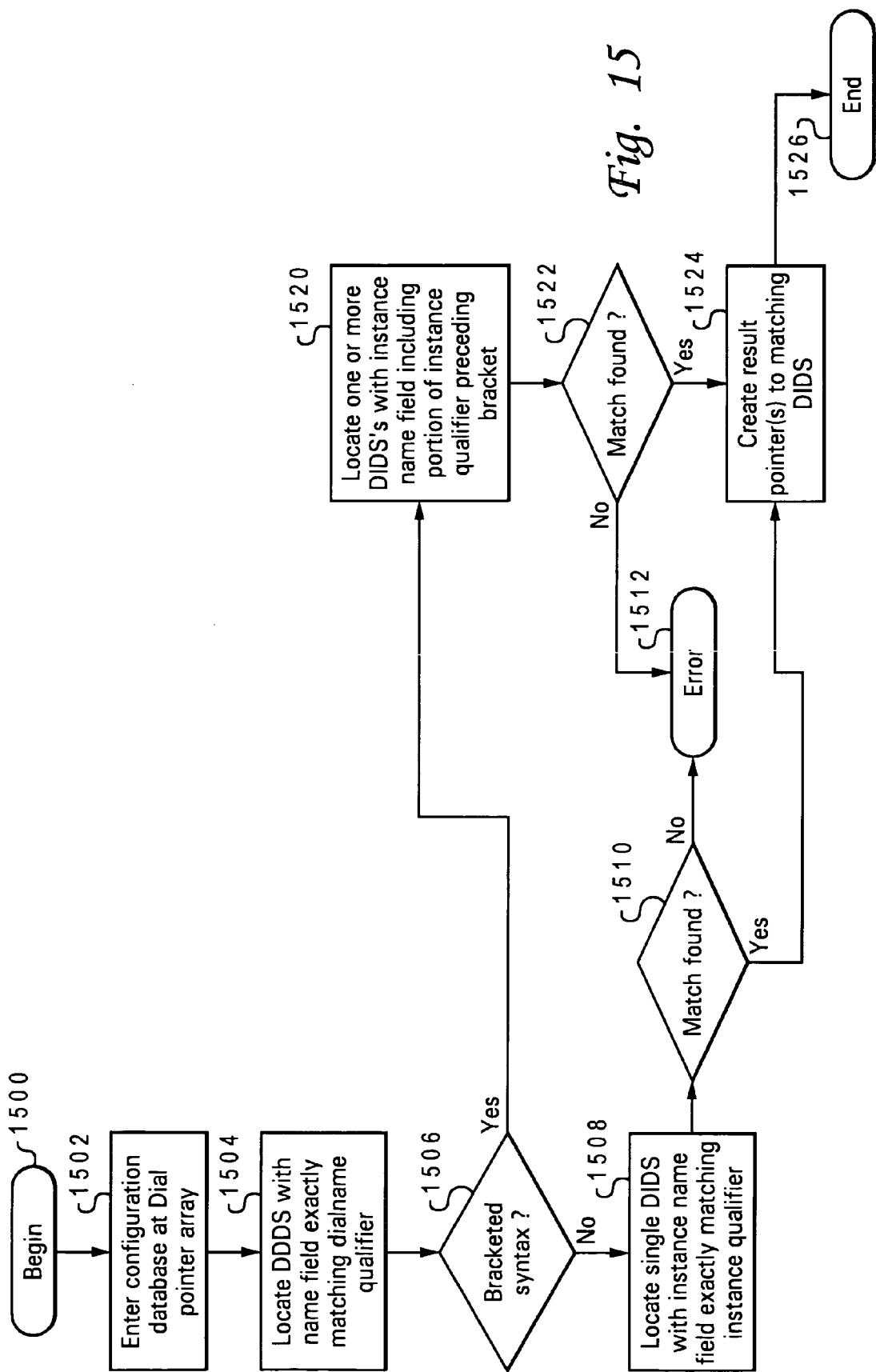

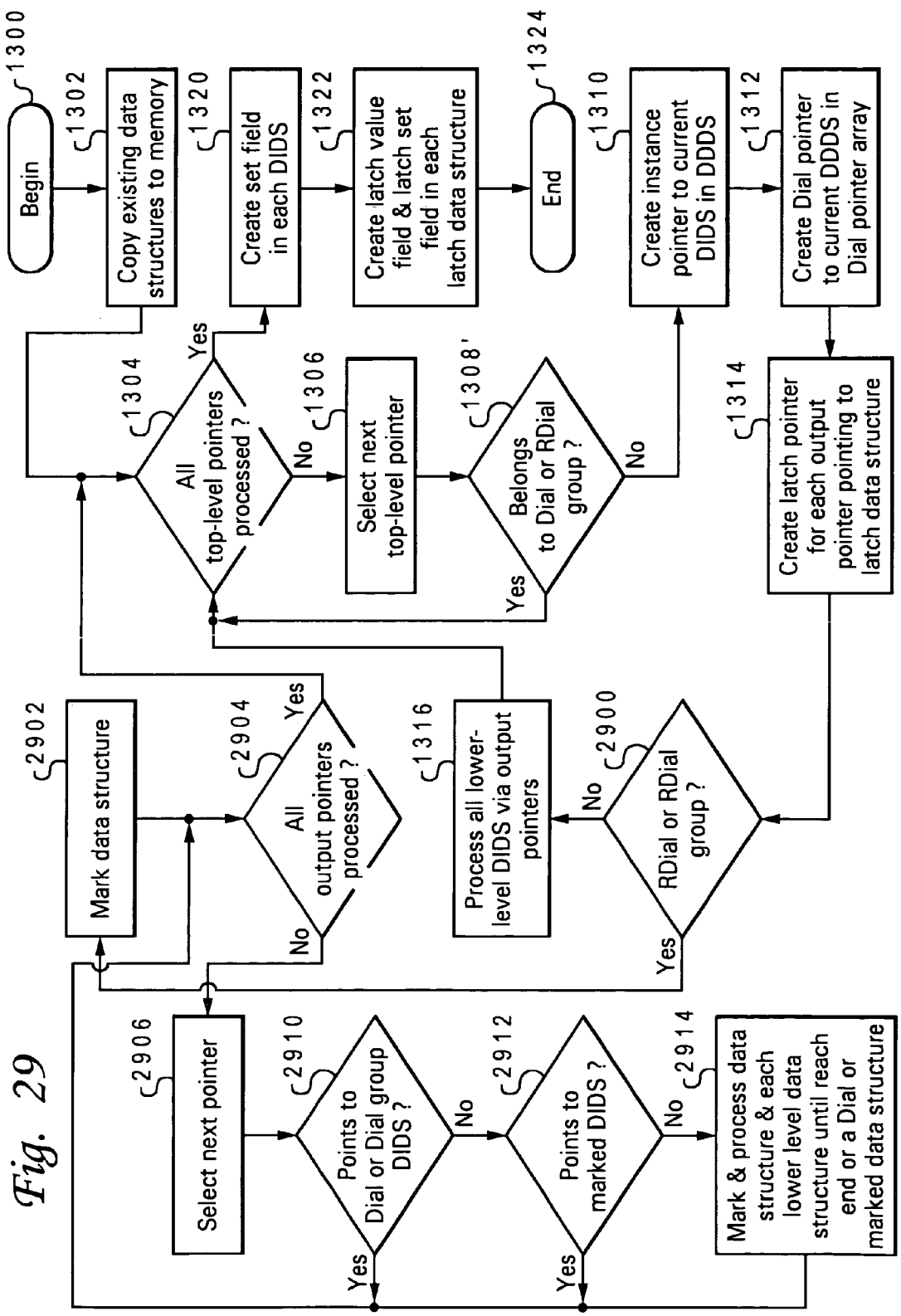

METHOD, SYSTEM AND PROGRAM PRODUCT FOR DETERMINING A CONFIGURATION OF A DIGITAL DESIGN BY REFERENCE TO AN INVERTIBLE CONFIGURATION DATABASE

CROSS-REFERENCE TO RELATED APPLICATIONS

The present application is related to the following co-pending U.S. patent applications tiled on even date herewith:

(1) U.S. patent application Ser. No. 10/425,096 now U.S. Pat. No. 7,080,347

(2) U.S. patent application Ser. No. 10/425,074 now U.S. Pat. No. 7,080,346

(3) U.S. patent application Ser. No. 10/425,041 now U.S. Pat. No. 7,162,404

(4) U.S. patent application Ser. No. 10/425,075 now U.S. Pat. No. 6,826,732

(5) U.S. patent application Ser. No. 10/425,076 now U.S. Pat. No. 7,146,302

(6) U.S. patent application Ser. No. 10/425,070 now U.S. Pat. No. 6,993,729

(7) U.S. patent application Ser. No. 10/425,079 now U.S. Pat. No. 7,062,745

(8) U.S. patent application Ser. No. 10/425,051 now U.S. Pat. No. 7,134,098

(9) U.S. patent application Ser. No. 10/425,080 now U.S. Pat. No. 7,168,061

(10) U.S. patent application Ser. No. 10/425,089 now U.S. Pat. No. 7,602,746 and

(11) U.S. patent application Ser. No. 10/425,072 now U.S. Pat. No. 6,941,527

All of the above-mentioned patent applications are assigned to the assignee of the present invention and incorporated herein by reference in their entireties.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In a typical digital design process, verifying the logical correctness of a digital design and debugging the design (if necessary) are important steps of the design process performed prior to developing a circuit layout. Although it is certainly possible to test a digital design by actually building the digital design, digital designs, particularly those implemented by integrated circuitry, are typically verified and debugged by simulating the digital design on a computer, due in part to the time and expense required for integrated circuit fabrication.

In a typical automated design process, a circuit designer enters into an electronic computer-aided design (ECAD) system a high-level description of the digital design to be simulated utilizing a hardware description language (HDL), such as VHDL, thus producing a digital representation of the various circuit blocks and their interconnections. In the digital representation, the overall circuit design is frequently divided into smaller parts, hereinafter referred to as design entities, which are individually designed, often by different designers, and then combined in a hierarchical manner to create an overall model. This hierarchical design technique is very useful in managing the enormous complexity of the overall design and facilitates error detection during simulation.

The ECAD system compiles the digital representation of the design into a simulation model having a format best suited for simulation. A simulator then exercises the simulation model to detect logical errors in the digital design.

A simulator is typically a software tool that operates on the simulation model by applying a list of input stimuli representing inputs of the digital system. The simulator generates a numerical representation of the response of the circuit to the input stimuli, which response may then either be viewed on the display screen as a list of values or further interpreted, often by a separate software program, and presented on the display screen in graphical form. The simulator may be run either on a general-purpose computer or on another piece of electronic apparatus specially designed for simulation. Simulators that run entirely in software on a general-purpose computer are referred to as "software simulators," and simulators that run with the assistance of specially designed electronic apparatus are referred to as "hardware simulators."

As digital designs have become increasingly complex, digital designs are commonly simulated at several levels of abstraction, for example, at functional, logical and circuit levels. At the functional level, system operation is described in terms of a sequence of transactions between registers, adders, memories and other functional units. Simulation at the functional level is utilized to verify the high-level design of digital systems. At the logical level, a digital system is described in terms of logic elements such as logic gates and flip-flops. Simulation at the logical level is utilized to verify the correctness of the logic design. At the circuit level, each logic gate is described in terms of its circuit components such as transistors, impedances, capacitances, and other such devices. Simulation at the circuit level provides detailed information about voltage levels and switching speeds.

In order to verify the results of any given simulation run, custom-developed programs written in high-level languages such as C or C++, referred to as a reference model, are written to process input stimuli (also referred to as test vectors) to produce expected results of the simulation run. The test vector is then run against the simulation execution model by the simulator. The results of the simulation run are then compared to the results predicted by the reference model to detect discrepancies, which are flagged as errors. Such a simulation check is known in the verification art as an "end-to-end" check.

In modern data processing systems, especially large server-class computer systems, the number of latches that must be loaded to configure the system for operation (or simulation) is increasing dramatically. One reason for the increase in configuration latches is that many chips are being designed to support multiple different configurations and operating modes in order to improve manufacturer profit margins and simplify system design. For example, memory controllers commonly require substantial configuration information to properly interface memory cards of different types, sizes, and operating frequencies.

A second reason for the increase in configuration latches is the ever-increasing transistor budget within processors and other integrated circuit chips. Often the additional transistors available within the next generation of chips are devoted to replicated copies of existing functional units in order to improve fault tolerance and parallelism. However, because transmission latency via intra-chip wiring is not decreasing proportionally to the increase in the operating frequency of functional logic, it is generally viewed as undesirable to centralize configuration latches for all similar functional units. Consequently, even though all instances of a replicated functional unit are frequently identically configured, each instance tends to be designed with its own copy of the configuration latches. Thus, configuring an operating parameter having only a few valid values (e.g., the ratio between the bus clock frequency and processor clock frequency) may involve setting hundreds of configuration latches in a processor chip.

Conventionally, configuration latches and their permitted range of values have been specified by error-prone paper documentation that is tedious to create and maintain. Compounding the difficulty in maintaining accurate configuration documentation and the effort required to set configuration latches is the fact that different constituencies within a single company (e.g., a functional simulation team, a laboratory debug team, and one or more customer firmware teams) often separately develop configuration software from the configuration documentation. As the configuration software is separately developed by each constituency, each team may introduce its own errors and employ its own terminology and naming conventions. Consequently, the configuration software developed by the different teams is not compatible and cannot easily be shared between the different teams.

In addition to the foregoing shortcomings in the process of developing configuration code, conventional configuration software is extremely tedious to code. In particular, the vocabulary used to document the various configuration bits is often quite cumbersome. For example, in at least some implementations, configuration code must specify, for each configuration latch bit, a full latch name, which may include fifty or more ASCII characters. In addition, valid binary bit patterns for each group of configuration latches must be individually specified.

In view of the foregoing, the present invention appreciates that it would be useful and desirable to provide an improved method of configuring a digital system described by an HDL model, particularly one that permits configuration information to be specified in a logical manner with a reasonable amount of input and then shared among the various organizational constituencies involved in the design, simulation, and commercial implementation of the digital system.

SUMMARY OF THE INVENTION

Improved methods, systems, and program products for specifying the configuration of a digital system, such as an integrated circuit or collection of interconnected integrated circuits, are disclosed. According to one method, a set of latch values of a plurality of latches within the digital design is obtained. A setting of a Dial instance is then determined based upon the set of latch values by reference to a configuration database that specifies a mapping table uniquely associating each a plurality of different settings of the Dial with a respective one of a plurality of different sets of latch values. The setting of the Dial instance is then output. In one embodiment, the setting of the Dial is contained in a simulation setup file utilized to configure a simulation model to a state approximating the state of the digital design represented by the set of latch values.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 4A depicts an exemplary HDL file including embedded configuration specification statements in accordance with the present invention;

FIG. 5B depicts an exemplary digital design including a plurality of hierarchically arranged design entities in which LDials are instantiated in accordance with the present invention;

FIG. 9A illustrates a portion of a digital design illustrating the manner in which a traceback process implemented by a configuration compiler detects inverters in the signal path between a configured signal and an associated configuration latch;

FIG. 14 is a block diagram depicting the contents of volatile system memory during a simulation run of a simulation model in accordance with the present invention;

FIG. 15 is a high level logical flowchart of an exemplary method of locating one or more Dial instance data structure (DIDS) in a configuration database that are identified by a instance qualifier and dialname qualifier supplied in an API call;

FIG. 29 is a high level logical flowchart of an exemplary method of expanding a configuration database containing RDial and/or RDial groups into volatile memory;

DETAILED DESCRIPTION OF ILLUSTRATIVE EMBODIMENT

The present invention introduces a configuration specification language and associated methods, systems, and program products for configuring and controlling the setup of a digital system (e.g., one or more integrated circuits or a simulation model thereof). In at least one embodiment, configuration specifications for signals in the digital system are created in HDL code by the designer responsible for an associated design entity. Thus, designers at the front end of the design process, who are best able to specify the signal names and associated legal values, are responsible for creating the configuration specification. The configuration specification is compiled at model build time together with the HDL describing the digital system to obtain a configuration database that can then be utilized by downstream organizational groups involved in the design, simulation, and hardware implementation processes.

Figure 1:
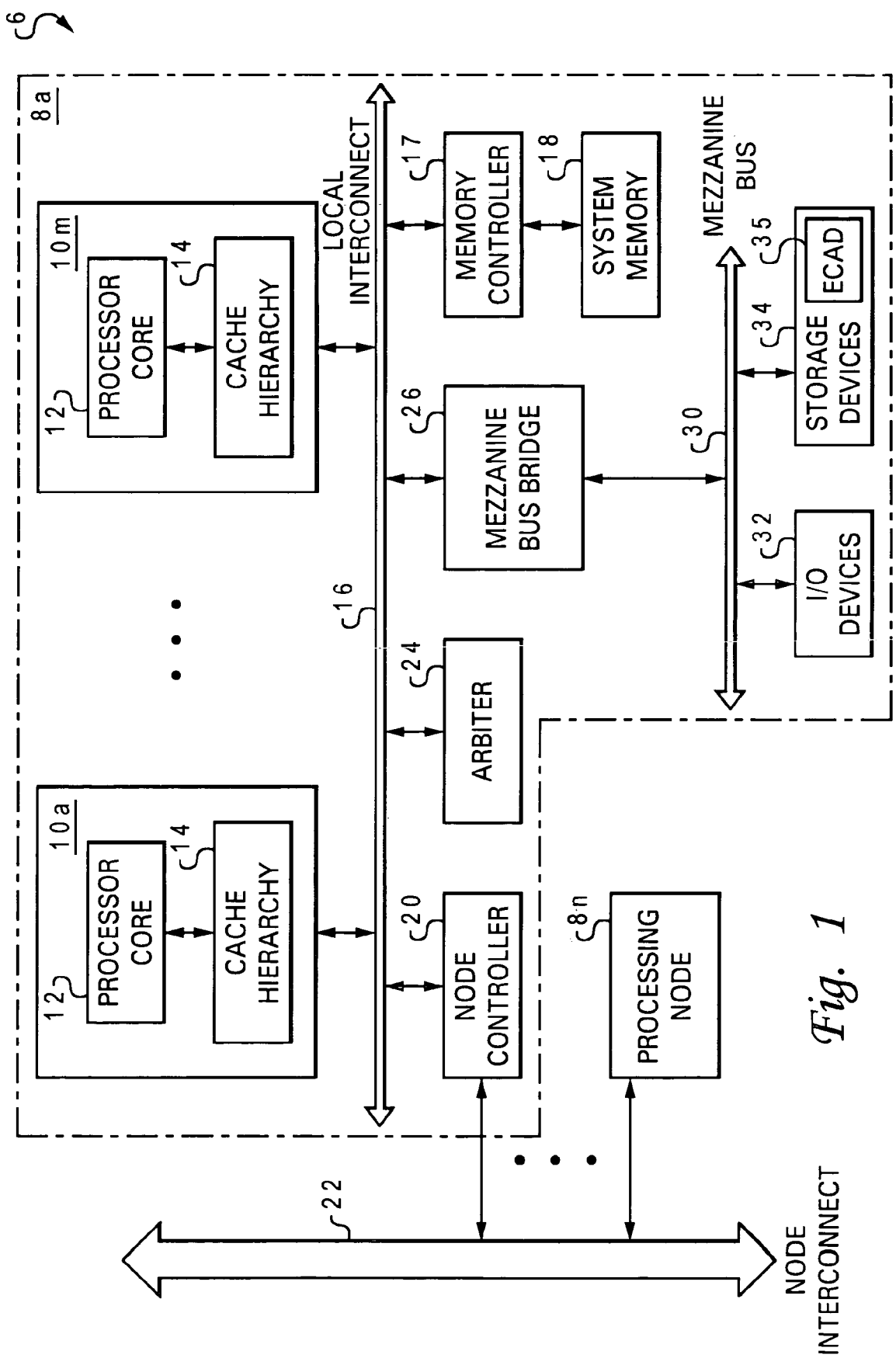
FIG. 1 is a high level block diagram of a data processing system that may be utilized to implement the present invention.

With reference now to the figures, and in particular with reference to FIG. 1, there is depicted an exemplary embodiment of a data processing system in accordance with the present invention. The depicted embodiment can be realized, for example, as a workstation, server, or mainframe computer.

As illustrated, data processing system 6 includes one or more processing nodes 8a-8n, which, if more than one processing node 8 is implemented, are interconnected by node interconnect 22. Processing nodes 8a-8n may each include one or more processors 10, a local interconnect 16, and a system memory 18 that is accessed via a memory controller 17. Processors 10*a*-10*m* are preferably (but not necessarily) identical and may comprise a processor within the PowerPC™ line of processors available from International Business Machines (IBM) Corporation of Armonk, N.Y. In addition to the registers, instruction flow logic and execution units utilized to execute program instructions, which are generally designated as processor core 12, each of processors 10*a*-10*m* also includes an on-chip cache hierarchy that is utilized to stage data to the associated processor core 12 from system memories 18.

Each of processing nodes 8*a*-8*n* further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
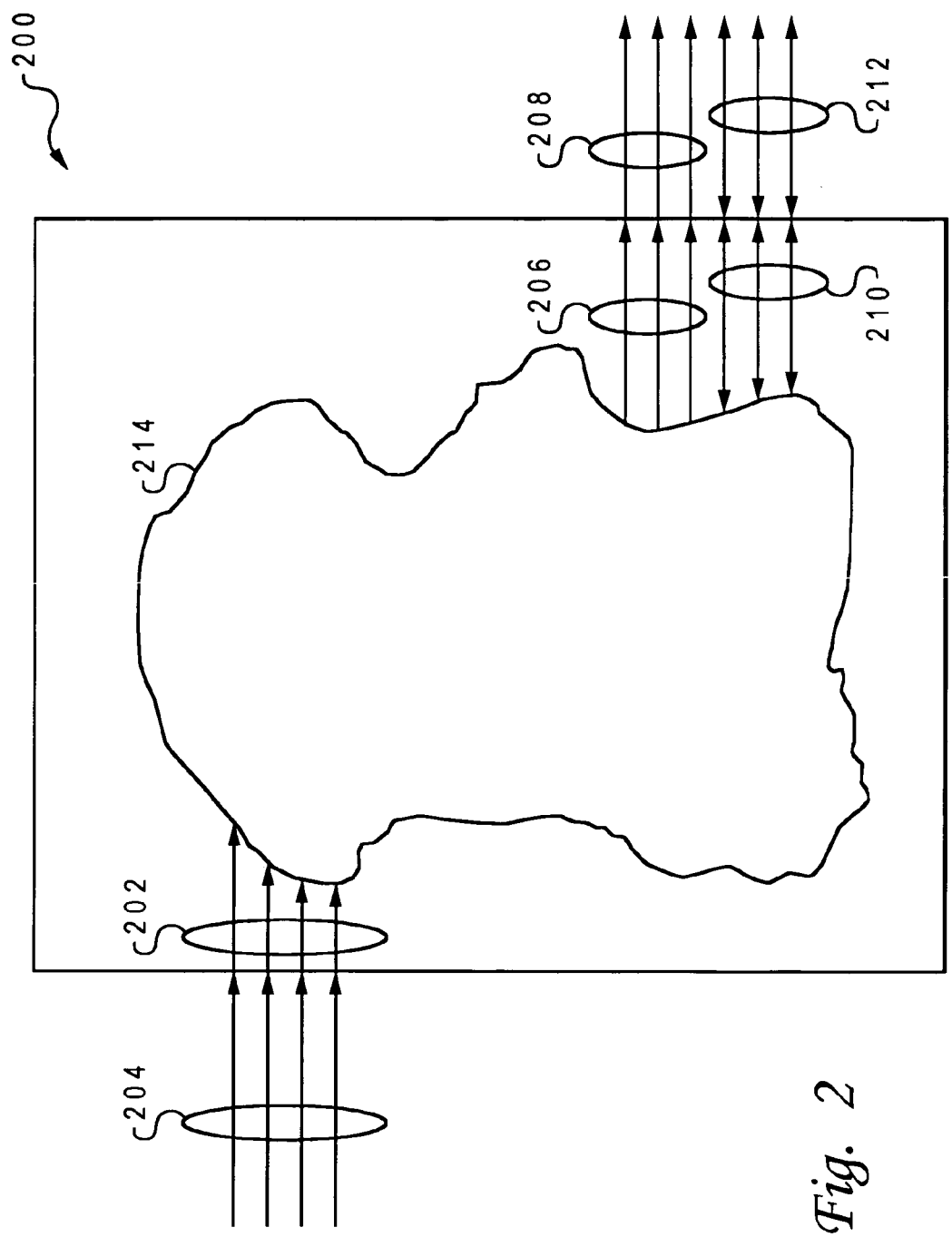
FIG. 2 is a diagrammatic representation of a design entity described by HDL code.

Simulated digital circuit design models created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
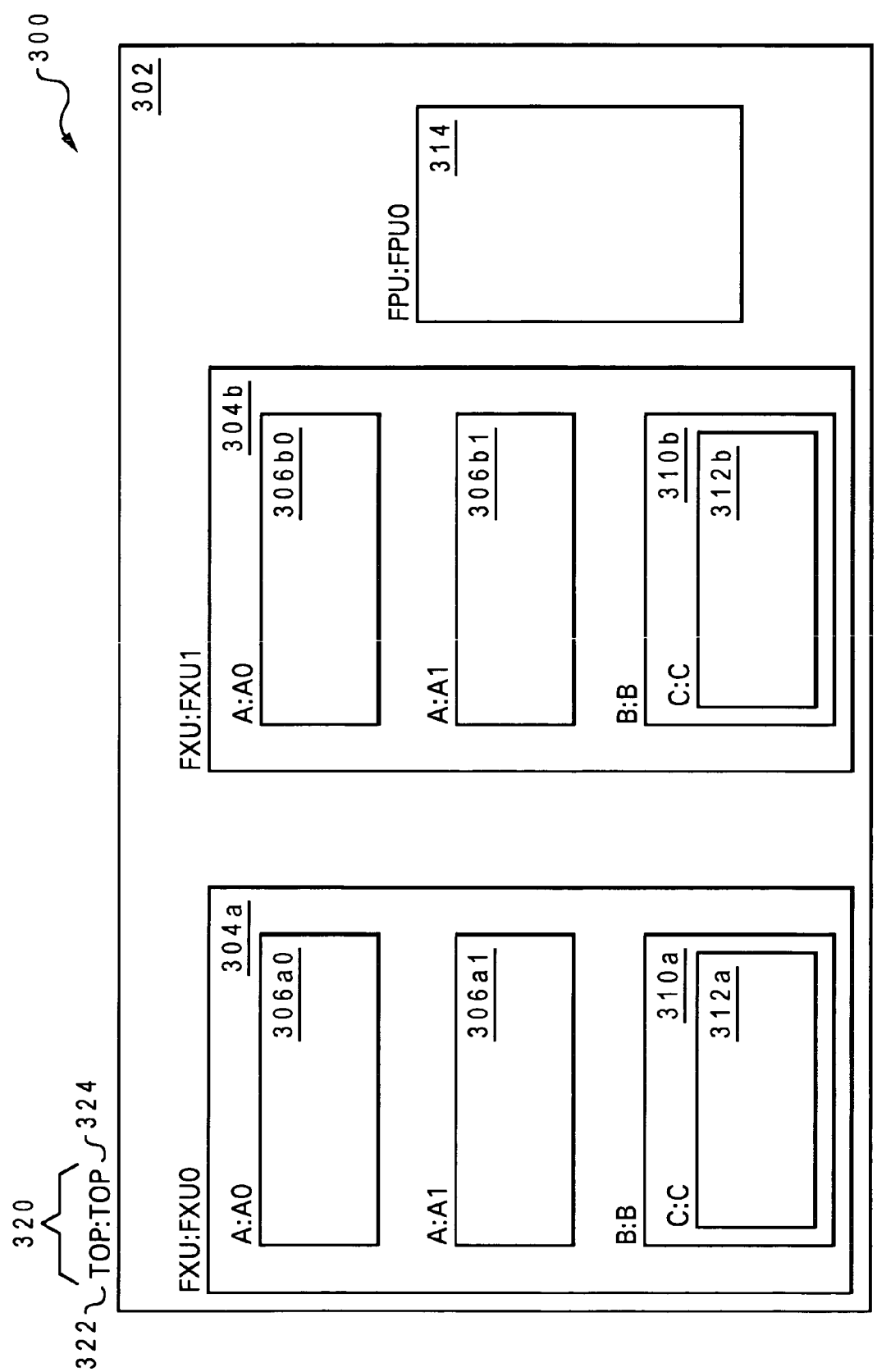
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304*a* and 304*b*, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304*a* and 304*b* have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies, which employ stand-alone configuration software created after a design is realized to load values into the configuration latches, the present invention introduces a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214. Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

Figure 4B:
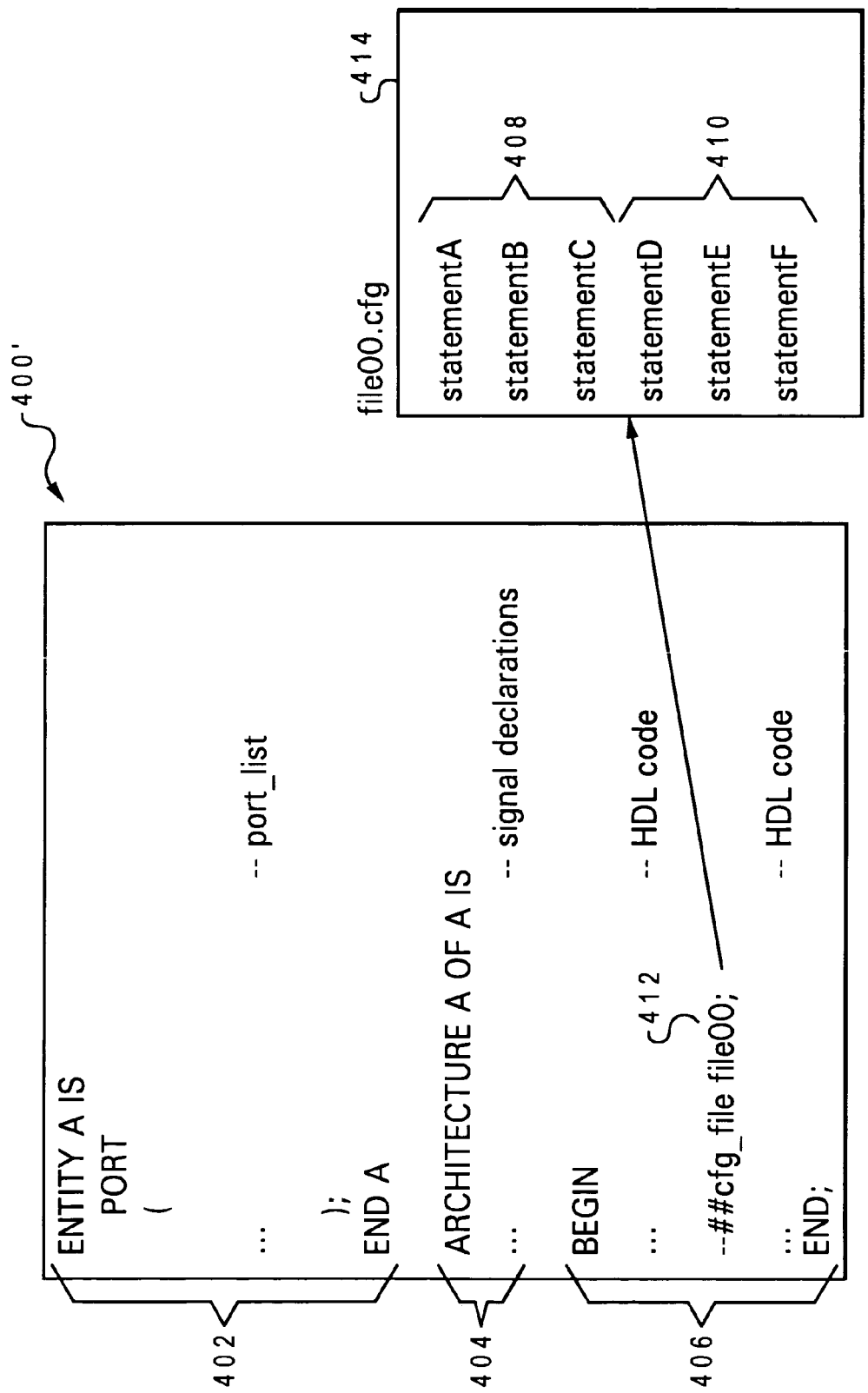
FIG. 4B illustrates an exemplary HDL file including an embedded configuration file reference statement referring to an external configuration file containing a configuration specification statement in accordance with the present invention.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 8, configuration specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, facilitate configuration of configuration latches within a digital design by instantiating one or more instances of a configuration entity referred to herein generically as a "Dial." A Dial's function is to map between an input value and one or more output values. In general, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As will become apparent, many different types of Dials can be defined, beginning with a Latch Dial (or "LDial").

Figure 5A:
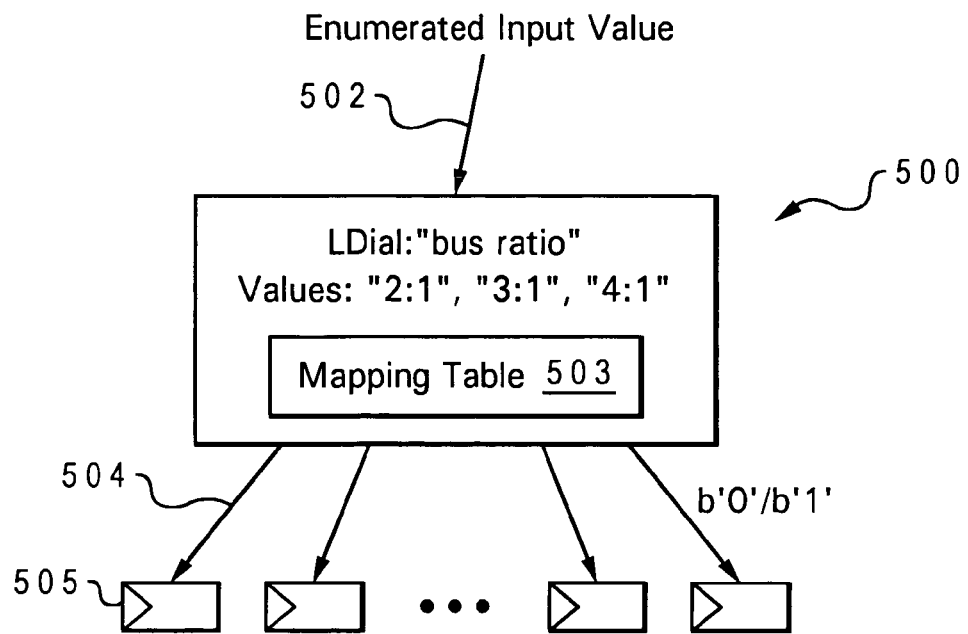
FIG. 5A is a diagrammatic representation of an LDial primitive in accordance with the present invention

Referring now to FIG. 5A, there is depicted a representation of an exemplary LDial 500. In this particular example, LDial 500, which has the name "bus ratio", is utilized to specify values for configuration latches in a digital design in accordance with an enumerated input value representing a selected ratio between a component clock frequency and bus clock frequency.

As illustrated, LDial 500, like all Dials, logically has a single input 502, one or more outputs 504, and a mapping table 503 that maps each input value to a respective associated output value for each output 504. That is, mapping table 503 specifies a one-to-one mapping between each of one or more unique input values and a respective associated unique output value. Because the function of an LDial is to specify the legal values of configuration latches, each output 504 of LDial 500 logically controls the value loaded into a respective configuration latch 505. To prevent conflicting configurations, each configuration latch 505 is directly specified by one and only one Dial of any type that is capable of setting the configuration latch 505.

At input 502, LDial 500 receives an enumerated input value (i.e., a string) among a set of legal values including "2:1 ", "3:1" and "4:1". The enumerated input value can be provided directly by software (e.g., by a software simulator or service processor firmware) or can be provided by the output of another Dial, as discussed further below with respect to FIG. 7A. For each enumerated input value, the mapping table 503 of LDial 500 indicates a selected binary value (i.e., "0" or "1") for each configuration latch 505.

With reference now to FIG. 5B, there is illustrated a diagrammatic representation of a simulation model logically including Dials. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of LDials illustrated in FIG. 5B, the designer need only code two LDial configuration specification statements utilizing either of the two techniques illustrated in FIGS. 4A and 4B. That is, the designer codes a first LDial configuration specification statement (or configuration file reference statement pointing to an associated configuration file) into the HDL file of design entity A 306 in order to automatically instantiate LDials 506$a$0, 506$a$1, 506$b$0 and 506$b$1 within entity A instantiations 306$a$0, 306$a$1, 306$b$0 and 306$b$1, respectively. The designer codes a second LDial configuration specification statement (or configuration file reference statement pointing to an associated configuration file) into the HDL file of design entity FXU 304 in order to automatically instantiate LDials 510$a$ and 510$b$ within FXU entity instantiations 304$a$ and 304$b$, respectively. The multiple instances of the LDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to generate the same output values; different instances of the same Dial can be set to generate different outputs by providing them different inputs.

The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope. For example, LDials 510$a$ and 510$b$, even though associated with FXU entity instantiations 304$a$ and 304$b$, respectively, can specify configuration latches within entity C instantiations 312$a$ and 312$b$, respectively.

FIG. 5B illustrates another important property of LDials (and other Dials that directly specify configuration latches). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying LDial 506, the designer can specify possible signal states for a signal 514 set by a configuration latch 512. Similarly, in specifying LDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522, as discussed further below.

Figure 5D:
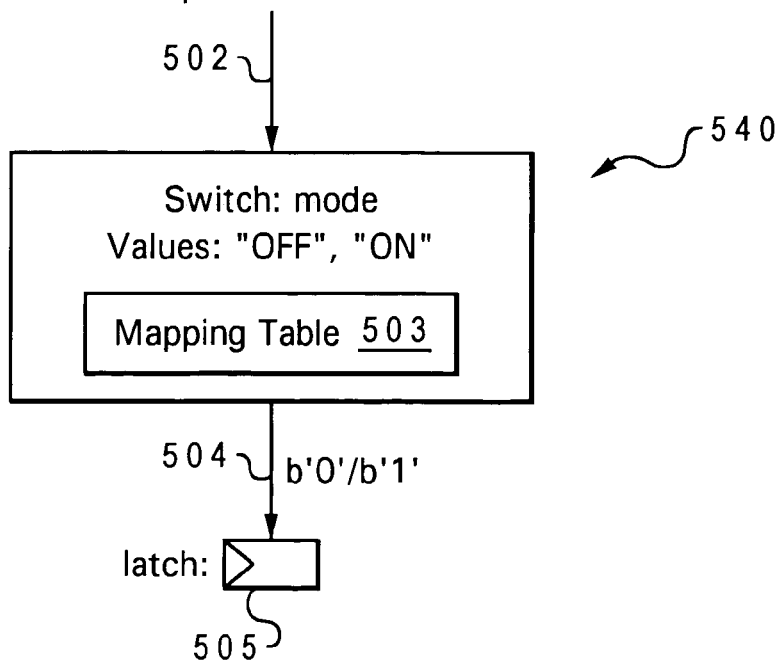
FIG. 5D is a diagrammatic representation of a Switch in accordance with the present invention.
Figure 5C:
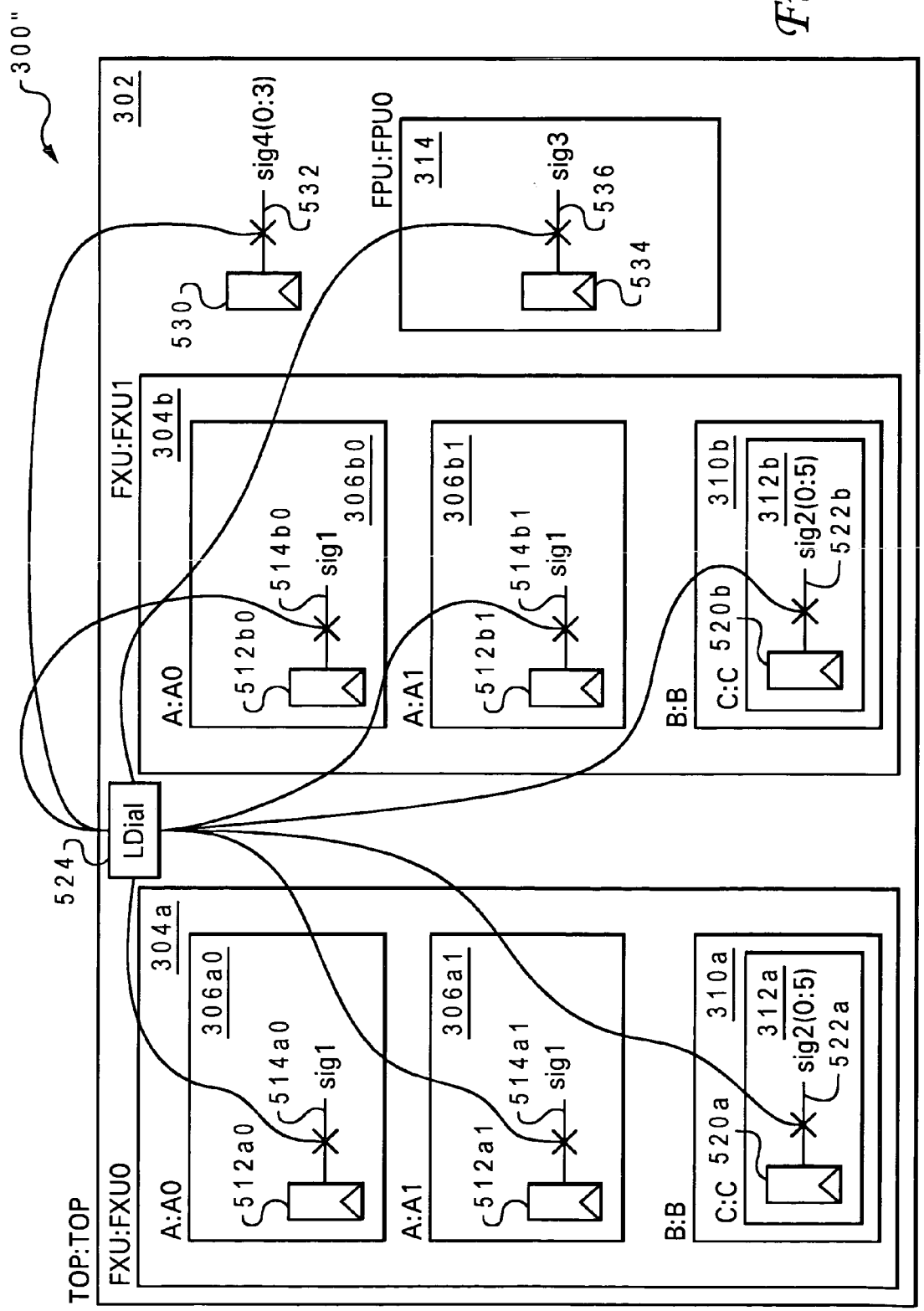
FIG. 5C illustrates an exemplary digital design including a plurality of hierarchically arranged design entities in which an LDial is employed to configure signal states at multiple different levels of the design hierarchy.

Referring now to FIG. 5C, there is depicted another diagrammatic representation of a simulation model including an LDial. As indicated by prime notation, simulation model 300" of FIG. 5C includes the same design entities arranged in the same hierarchical relation as simulation model 300 of FIG. 3.

As shown, simulation model 300" of FIG. 5C includes an LDial 524 associated with top-level design entity 302. LDial 524 specifies the signal states of each signal sig1 514, which is determined by a respective configuration latch 512, the signal states of each signal sig2 522, which is determined by a respective configuration latch 520, the signal state of signal sig4 532, which is determined by configuration latch 530, and the signal state of signal sig3 536, which is determined by configuration latch 534. Thus, LDial 524 configures the signal states of numerous different signals, which are all instantiated at or below the hierarchy level of LDial 524 (which is the top level).

As discussed above with respect to FIGS. 4A and 4B, LDial 524 is instantiated within top-level entity 302 of simulation model 300" by embedding within the HDL file of top-level entity 302 a configuration specification statement specifying LDial 524 or a configuration file reference statement referencing a separate configuration file containing a configuration specification statement specifying LDial 524. In either case, an exemplary configuration specification statement for LDial 524 is as follows:

```
LDial bus ratio (FXU0.A0.SIG1, FXU0.A1.SIG1,
       FXU0.B.C.SIG2(0..5),
       FXU1.A0.SIG1, FXU1.A1.SIG1,
       FXU1.B.C.SIG2(0..5),
       FPU0.SIG3, SIG4(0..3)
) =
{2:1 =>0b0, 0b0, 0x00,
       0b0, 0b0, 0x00,
       0b0, 0x0;
 3:1 => 0b1, 0b1, 0x01,
       0b1, 0b1, 0x01,
       0b0, 0x1;
 4:1 => 0b1, 0b1, 0x3F,
       0b1, 0b1, 0x3F,
       0b1, 0xF
};
```

The exemplary configuration specification statement given above begins with the keyword "LDial," which specifies that the type of Dial being declared is an LDial, and the Dial name, which in this case is "bus ratio." Next, the configuration specification statement enumerates the signal names whose states are controlled by the LDial. As indicated above, the signal identifier for each signal is specified hierarchically (e.g., FXU0.A0.SIG1 for signal 514$a$0) relative to the default scope of the associated design entity so that different signal instances having the same signal name are distinguishable. Following the enumeration of the signal identifiers, the configuration specification statement includes a mapping table listing the permitted enumerated input values of the LDial and the corresponding signal values for each enumerated input value. The signal values are associated with the signal names implicitly by the order in which the signal names are declared. It should again be noted that the signal states specified for all enumerated values are unique, and collectively represent the only legal patterns for the signal states.

Several different syntaxes can be employed to specify the signal states. In the example given above, signal states are specified in either binary format, which specifies a binary constant preceded by the prefix "0b", or in hexadecimal format, which specifies a hexadecimal constant preceded by the prefix "0x". Although not shown, signal states can also be specified in integer format, in which case no prefix is employed. For ease of data entry, the configuration specification language of ECAD system 35 also preferably supports a concatenated syntax in which one constant value, which is automatically extended with leading zeros, is utilized to represent the concatenation of all of the desired signal values. In this concatenated syntax, the mapping table of the configuration specification statement given above can be rewritten as:

```
{2:1 =>  0,
 3:1 =>  0x183821,
 4:1 =>  0x1FFFFF
};
``` in order to associate enumerated input value 2:1 with a concatenated bit pattern of all zeros, to associate the enumerated input value 3:1 with the concatenated bit pattern '0b110000011100000100001', and to associate the enumerated input value 4:1 with a concatenated bit pattern of all ones.

With reference now to FIG. 5D, there is illustrated a diagrammatic representation of a special case of an LDial having a one-bit output, which is defined herein as a Switch. As shown, a Switch 540 has a single input 502, a single 1-bit output 504 that controls the setting of a configuration latch 505, and a mapping table 503 that maps each enumerated input value that may be received at input 502 to a 1-bit output value driven on output 504.

Because Switches frequently comprise a significant majority of the Dials employed in a digital design, it is preferable if the enumerated value sets for all Switches in a simulation model of a digital design are the same (e.g., "ON"/"OFF"). In a typical embodiment of a Switch, the "positive" enumerated input value (e.g., "ON") is mapped by mapping table 503 to an output value of 0b1 and the "negative" enumerated input value (e.g., "OFF") is mapped to an output value of 0b0. In order to facilitate use of logic of the opposite polarity, a Negative Switch or NSwitch declaration is also preferably supported that reverses this default correspondence between input values and output values in mapping table 503.

The central advantage to defining a Switch primitive is a reduction in the amount of input that designers are required to enter. In particular, to specify a comparable 1-bit LDial, a designer would be required to enter a configuration specification statement of the form:

```
LDial mode (signal) =
    {ON =>b1;
     OFF =>b0
    };
```

A Switch performing the same function, on the other hand, can be specified with the configuration specification statement:

Switch mode (signal);

Although the amount of data entry eliminated by the use of Switches is not particularly significant when only a single Switch is considered, the aggregate reduction in data entry is significant when the thousands of switches in a complex digital design are taken into consideration.

Figure 6A:
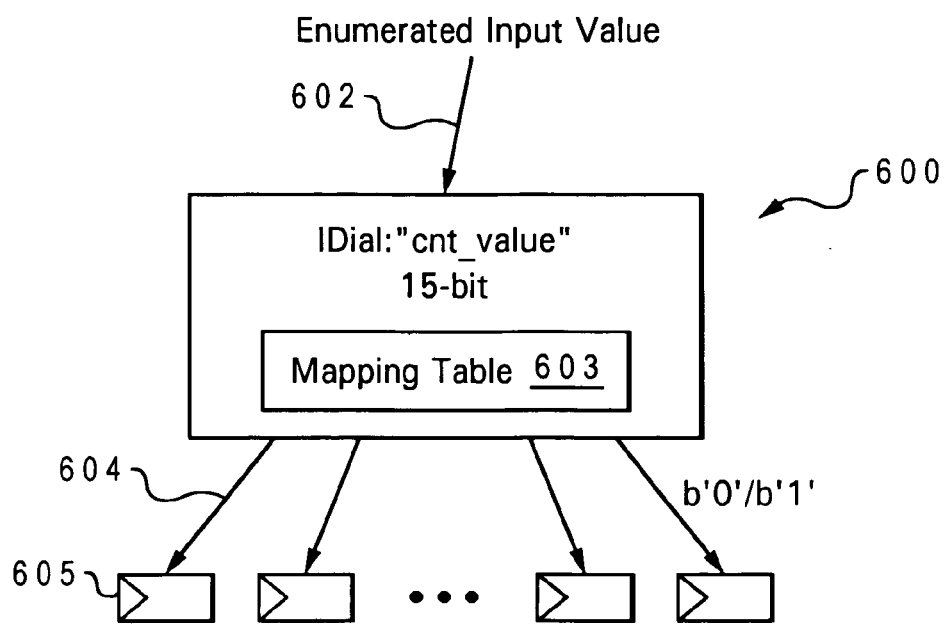
FIG. 6A is a diagrammatic representation of an IDial in accordance with the present invention.

Referring now to FIG. 6A, there is depicted a diagrammatic representation of an Integer Dial ("IDial") in accordance with a preferred embodiment of the present invention. Like an LDial, an IDial directly specifies the value loaded into each of one or more configuration latches 605 by indicating within mapping table 603 a correspondence between each input value received at an input 602 and an output value for each output 604. However, unlike LDials, which can only receive as legal input values the enumerated input values explicitly set forth in their mapping tables 503, the legal input value set of an IDial includes all possible integer values within the bit size of output 604. (Input integer values containing fewer bits than the bit size of output(s) 604 are right justified and extended with zeros to fill all available bits.) Because it would be inconvenient and tedious to enumerate all of the possible integer input values in mapping table 603, mapping table 603 simply indicates the manner in which the integer input value received at input 602 is applied to the one or more outputs 604.

IDials are ideally suited for applications in which one or more multi-bit registers must be initialized and the number of legal values includes most values of the register(s). For example, if a 4-bit configuration register comprising 4 configuration latches and an 11-bit configuration register comprising 11 configuration latches were both to be configured utilizing an LDial, the designer would have to explicitly enumerate up to $2^{15}$ input values and the corresponding output bit patterns in the mapping table of the LDial. This case can be handled much more simply with an IDial utilizing the following configuration specification statement:

IDial cnt_value (sig1(0 . . . 3), sig2(0 . . . 10));

In the above configuration specification statement, "IDial" declares the configuration entity as an IDial, "cnt_value" is the name of the IDial, "sig1" is a 4-bit signal output by the 4-bit configuration register and "sig2" is an 11-bit signal coupled to the 11-bit configuration register. In addition, the ordering and number of bits associated with each of sig1 and sig2 indicate that the 4 high-order bits of the integer input value will be utilized to configure the 4-bit configuration register associated with sig1 and the 11 lower-order bits will be utilized to configure the 11-bit configuration register associated with sig2. Importantly, although mapping table 603 indicates which bits of the integer input values are routed to which outputs, no explicit correspondence between input values and output values is specified in mapping table 603.

Figure 6B:
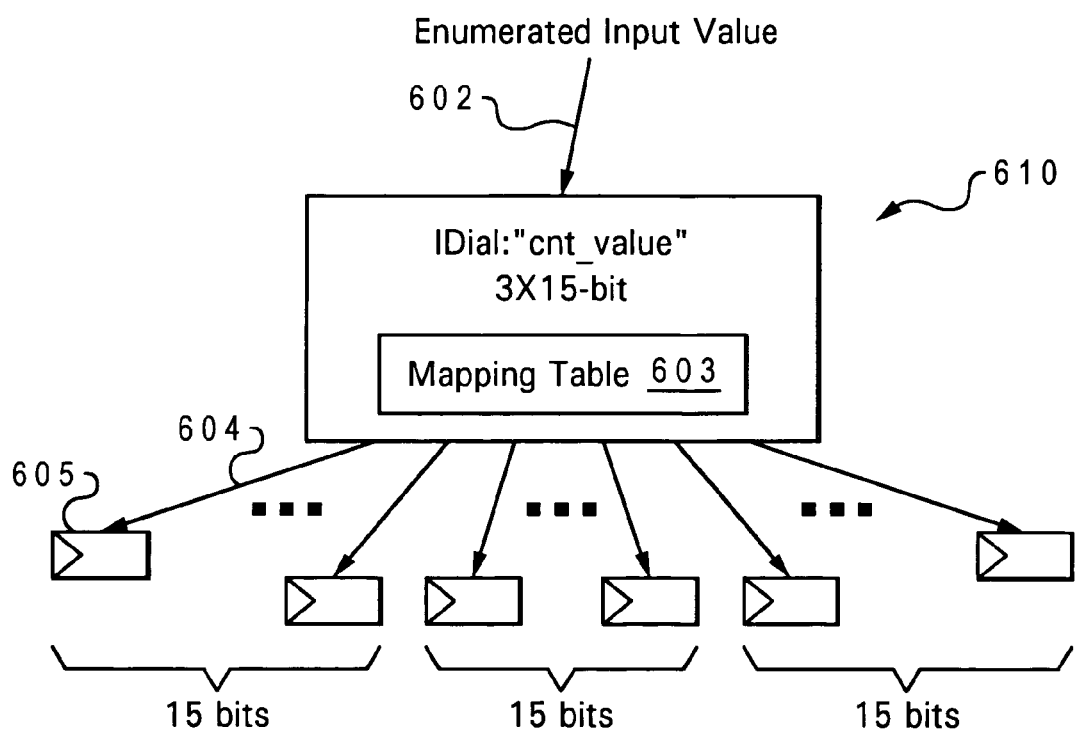
FIG. 6B is a diagrammatic representation of an IDial having a split output in accordance with the present invention.

IDials may also be utilized to specify the same value for multiple replicated configuration registers, as depicted in FIG. 6B. In the illustrated embodiment, an IDial 610, which can be described as an IDial "splitter", specifies the configuration of three sets of replicated configuration registers each comprising 15 configuration latches 605 based upon a single 15-bit integer input value. An exemplary configuration specification statement for instantiating IDial 610 may be given as follows:

```
IDial cnt_value(A0.sig1(0..7), A0.sig2(8..14);
              A1.sig1(0..7), A1.sig2(8..14);
              A3.sig1(0..7), A3.sig2(8..14)
           );
```

In the above configuration specification statement, "IDial" declares the configuration entity as an IDial, and "cnt_value" is the name of the IDial. Following the IDial name are three scope fields separated by semicolons (";"). Each scope field indicates how the bits of the input integer value are applied to particular signals. For example, the first scope field specifies that the 8 high-order bits of the integer input value will be utilized to configure the 8-bit configuration register associated with the signal A0.sig1 and the 7 lower-order bits will be utilized to configure the 7-bit configuration register associated withA0.sig2. The second and third scope fields specify that the corresponding configuration registers within design entities A1 and A3 will be similarly configured. Importantly, the integer input bits can be allocated differently in each scope field as long as the total number of bits specified in each scope field is the same.

Although the configuration of a digital design can be fully specified utilizing LDials alone or utilizing LDials and IDials, in many cases it would be inefficient and inconvenient to do so. In particular, for hierarchical digital designs such as that illustrated in FIG. 5C, the use of LDials and/or IDials alone would force many Dials to higher levels of the design hierarchy, which, from an organizational standpoint, may be the responsibility of a different designer or design group than is responsible for the design entities containing the configuration latches controlled by the Dials. As a result, proper configuration of the configuration latches would require not only significant organizational coordination between design groups, but also that designers responsible for higher levels of the digital design learn and include within their HDL files details regarding the configuration of lower level design entities. Moreover, implementing Dials at higher levels of the hierarchy means that lower levels of the hierarchy cannot be independently simulated since the Dials controlling the configuration of the lower level design entities are not contained within the lower level design entities themselves.

In view of the foregoing, the present invention recognizes the utility of providing a configuration entity that supports the hierarchical combination of Dials to permit configuration of lower levels of the design hierarchy by lower-level Dials and control of the lower-level Dials by one or more higher-level Dials. The configuration specification language of the present invention terms a higher-level Dial that controls one or more lower-level Dials as a Control Dial ("CDial").

Figure 7A:
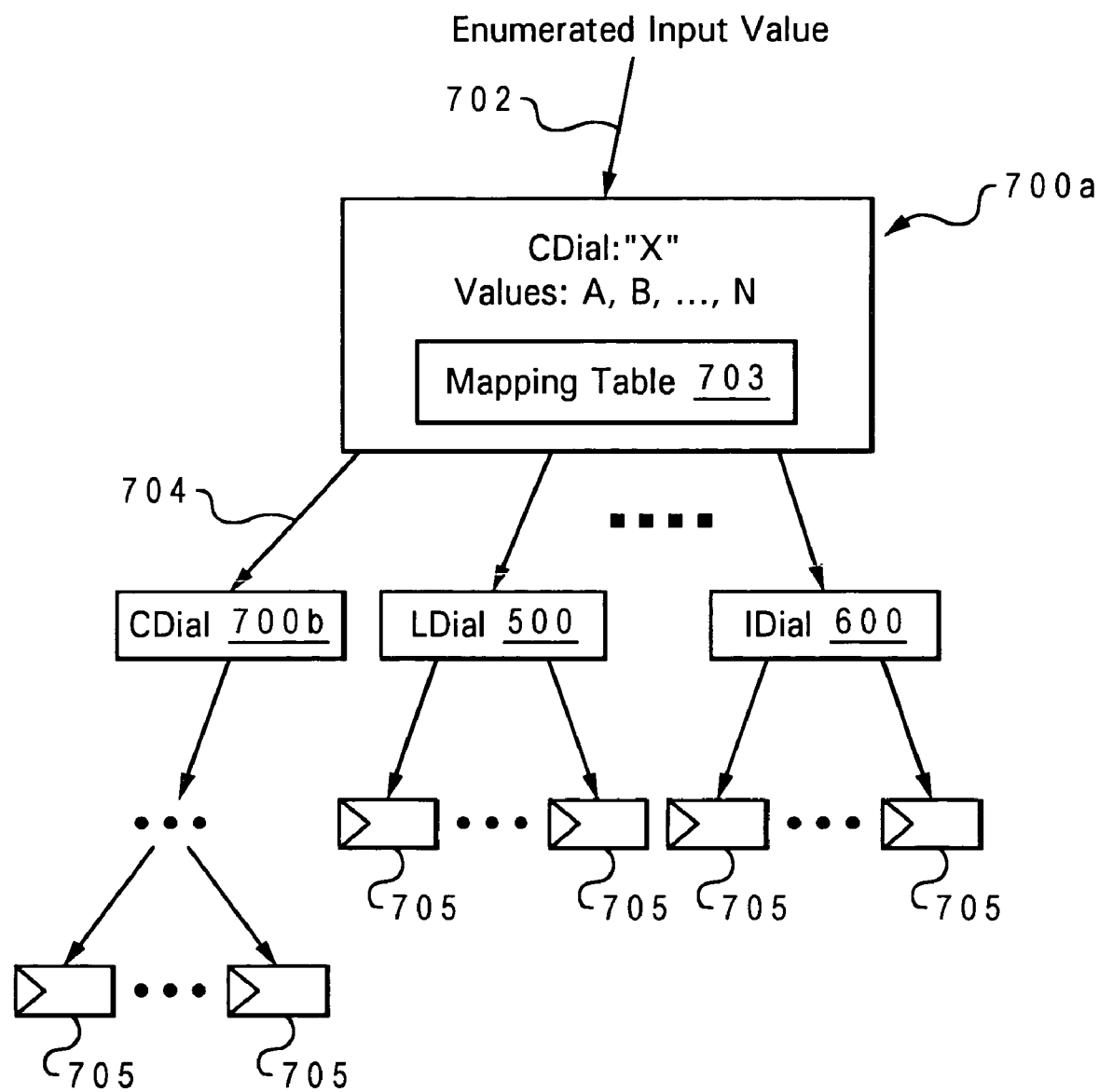
FIG. 7A is a diagrammatic representation of a CDial employed to control other Dials in accordance with the present invention.

Referring now to FIG. 7A, there is depicted a diagrammatic representation of a CDial 700a in accordance with the present invention. CDial 700a, like all Dials, preferably has a single input 702, one or more outputs 704, and a mapping table 703 that maps each input value to a respective associated output value for each output 704. Unlike LDials and IDials, which directly specify configuration latches, a CDial 700 does not directly specify configuration latches. Instead, a CDial 700 controls one or more other Dials (i.e., CDials and/or LDials and/or IDials) logically coupled to CDial 700 in an n-way "Dial tree" in which each lower-level Dial forms at least a portion of a "branch" that ultimately terminates in "leaves" of configuration latches. Dial trees are preferably constructed so that no Dial is instantiated twice in any Dial tree.

In the exemplary embodiment given in FIG. 7A, CDial 700a receives at input 702 an enumerated input value (i.e., a string) among a set of legal values including "A", . . . , "N". If CDial 700a (or an LDial or IDial) is a top-level Dial (i.e., there are no Dials "above" it in a Dial tree), CDial 700a receives the enumerated input value directly from software (e.g., simulation software or firmware). Alternatively, if CDial 700a forms part of a "branch" of a dial tree, then CDial 700a receives the enumerated input value from the output of another CDial. For each legal enumerated input value that can be received at input 702, CDial 700a specifies a selected enumerated value or bit value for each connected Dial (e.g., Dials 700b, 500 and 600) in mapping table 703. The values in mapping table 703 associated with each output 704 are interpreted by ECAD system 35 in accordance with the type of lower-level Dial coupled to the output 704. That is, values specified for LDials and CDials are interpreted as enumerated values, while values specified for IDials are interpreted as integer values. With these values, each of Dials 700b, 500 and 600 ultimately specifies, either directly or indirectly, the values for one or more configuration latches 705.

Figure 7B:
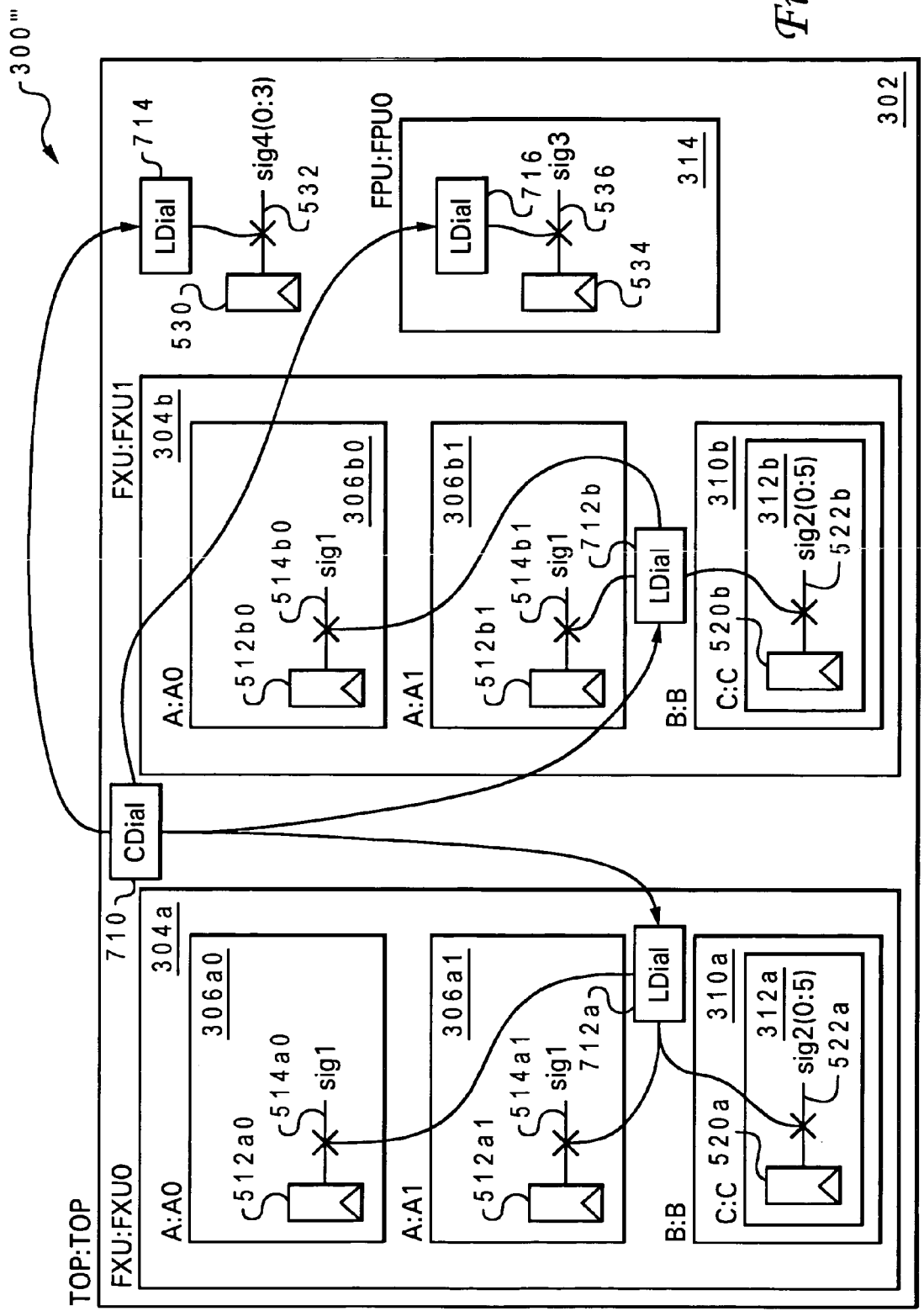
FIG. 7B depicts an exemplary digital design including a plurality of hierarchically arranged design entities in which a CDial is employed to control lower-level Dials utilized to configure signal states.

With reference now to FIG. 7B, there is illustrated another diagrammatic representation of a simulation model containing a Dial tree including a top-level CDial that controls multiple lower-level LDials. As indicated by prime notation, simulation model 300'" of FIG. 7B includes the same design entities arranged in the same hierarchical relation as simulation model 300 of FIG. 3 and contains the same configuration latches and associated signals as simulation model 300" of FIG. 5C.

As shown, simulation model 300'" of FIG. 7B includes a top-level CDial 710 associated with top-level design entity 302. Simulation model 300'" further includes four LDials 712a, 712b, 714 and 716. LDial 712a, which is associated with entity instantiation A0 304a, controls the signal states of each signal sig1 514a, which is determined by a respective configuration latch 512a, and the signal state of signal sig2 522a, which is determined by configuration latch 520a. LDial 712b, which is a replication of LDial 712a associated with entity instantiation A1 304b, similarly controls the signal states of each signal sig1 514b, which is determined by a respective configuration latch 512b, and the signal state of signal sig2 522b, which is determined by configuration latch 520b. LDial 714, which is associated with top-level entity 302, controls the signal state of signal sig4 532, which is determined by configuration latch 530. Finally, LDial 716, which is associated with entity instantiation FPU0 314, controls the signal state of signal sig3 536, which is determined by configuration latch 534. Each of these four LDials is controlled by CDial 710 associated with top-level entity 302.

As discussed above with respect to FIGS. 4A and 4B, CDial 710 and each of the four LDials depicted in FIG. 7B is instantiated within the associated design entity by embedding a configuration specification statement (or a configuration file reference statement pointing to a configuration file containing a configuration specification statement) within the HDL file of the associated design entity. An exemplary configuration specification statement utilized to instantiate each Dial shown in FIG. 7B is given below:

```
CDial BusRatio (FXU0.BUSRATIO, FXU1.BUSRATIO,
            FPU0.BUSRATIO, BUSRATIO)=
        {2:1 => 2:1, 2:1, 2:1, 2:1;
         3:1 => 3:1, 3:1, 3:1, 3:1;
         4:1 => 4:1, 4:1, 4:1, 4:1
        };
LDial BusRatio (A0.sig1, A1.sig1, B.C.sig2(0..5)) =
        {2:1 => 0b0, 0b0, 0x00;
         3:1 => 0b1, 0b1, 0x01;
         4:1 => 0b1, 0b1, 0x3F;
        };
LDial BusRatio (sig3) =
        {2:1 => 0b0;
         3:1 => 0b0;
         4:1 => 0b1
        };
LDial BusRatio (sig4(0..3)) =
        {2:1 => 0x0;
         3:1 => 0x1;
         4:1 => 0xF
        };
```

By implementing a hierarchical Dial tree in this manner, several advantages are realized. First, the amount of software code that must be entered is reduced since the automatic replication of LDials 712 within FXU entity instantiations 304a and 304b allows the code specifying LDials 712 to be entered only once. Second, the organizational boundaries of the design process are respected by allowing each designer (or design team) to specify the configuration of signals within the design entity for which he is responsible. Third, coding of upper level Dials (i.e., CDial 710) is greatly simplified, reducing the likelihood of errors. Thus, for example, the CDial and LDial collection specified immediately above performs the same function as the "large" LDial specified above with reference to FIG. 5C, but with much less complexity in any one Dial.

Many Dials, for example, Switches utilized to disable a particular design entity in the event an uncorrectable error is detected, have a particular input value that the Dial should have in nearly all circumstances. For such Dials, the configuration specification language of the present invention permits a designer to explicitly specify in a configuration specification statement a default input value for the Dial. In an exemplary embodiment, a Default value is specified by including "=default value" following the specification of a Dial and prior to the concluding semicolon. For example, a default value for a CDial, can be given as follows:

```
CDial BusRatio (FXU0.BUSRATIO, FXU1.BUSRATIO,
            FPU0.BUSRATIO, BUSRATIO)=
        {2:1 => 2:1, 2:1, 2:1, 2:1;
         3:1 => 3:1, 3:1, 3:1, 3:1;
         4:1 => 4:1, 4:1, 4:1, 4:1
        } = 2:1;
```

It should be noted that for CDials and LDials, the specified default value is required to be one of the legal enumerated values, which are generally (i.e., except for Switches) listed in the mapping table. For Switches, the default value must be one of the predefined enumerated values of "ON" and "OFF".

A default value for an IDial can similarly be specified as follows:

```
IDial cnt_value(A0.sig1(0..7), A0.sig2(8..14);
         A1.sig1(0..7), A1.sig2(8..14);
         A3.sig1(0..7), A3.sig2(8..14)
        ) = 0x7FFF;
```

In this case, a constant, which can be given in hexadecimal, decimal or binary format, provides the default output value of each signal controlled by the IDial. In order to apply the specified constant to the indicated signal(s), high order bits are truncated or padded with zeros, as needed.

The use of default values for Dials is subject to a number of rules. First, a default value may be specified for any type of Dial including LDials, IDials (including those with split outputs) and CDials. Second, if default values are specified for multiple Dials in a multiple-level Dial tree, only the highest-level default value affecting each "branch" of the Dial tree is applied (including that specified for the top-level Dial), and the remaining default values, if any, are ignored. Despite this rule, it is nevertheless beneficial to specify default values for lower-level Dials in a Dial tree because the default values may be applied in the event a smaller portion of a model is independently simulated, as discussed above. In the event that the combination of default values specified for lower-level Dials forming the "branches" of a Dial tree do not correspond to a legal output value set for a higher-level Dial, the compiler will flag an error. Third, a default value is overridden when a Dial receives an input to actively set the Dial.

By specifying default values for Dials, a designer greatly simplifies use of Dials by downstream organizational groups by reducing the number of Dials that must be explicitly set for simulation or hardware configuration. In addition, as discussed further below, use of default values assists in auditing which Dials have been actively set.

In addition to defining syntax for configuration specification statements specifying Dials, the configuration specification language of the present invention supports at least two additional HDL semantic constructs: comments and attribute specification statements. A comment, which may have the form:

```
BusRatio.comment = "The bus ratio Dial configures the circuit in
    accordance with a selected processor/interconnect frequency ratio";
``` permits designers to associate arbitrary strings delimited by quotation marks with particular Dial names. As discussed below with reference to FIG. 8, these comments are processed during compilation and included within a configuration documentation file in order to explain the functions, relationships, and appropriate settings of the Dials.

Attribute specification statements are statements that declare an attribute name and attribute value and associate the attribute name with a particular Dial name. For example, an attribute specification statement may have the form:

BusRatio.attribute (myattribute)=scom57(0:9);

In this example, "BusRatio.attribute" declares that this statement is an attribute specification statement associating an attribute with a Dial having "BusRatio" as its Dial name, "myattribute" is the name of the attribute, and "scom57(0:

9)" is a string that specifies the attribute value. Attributes support custom features and language extensions to the base configuration specification language.

Figure 8:
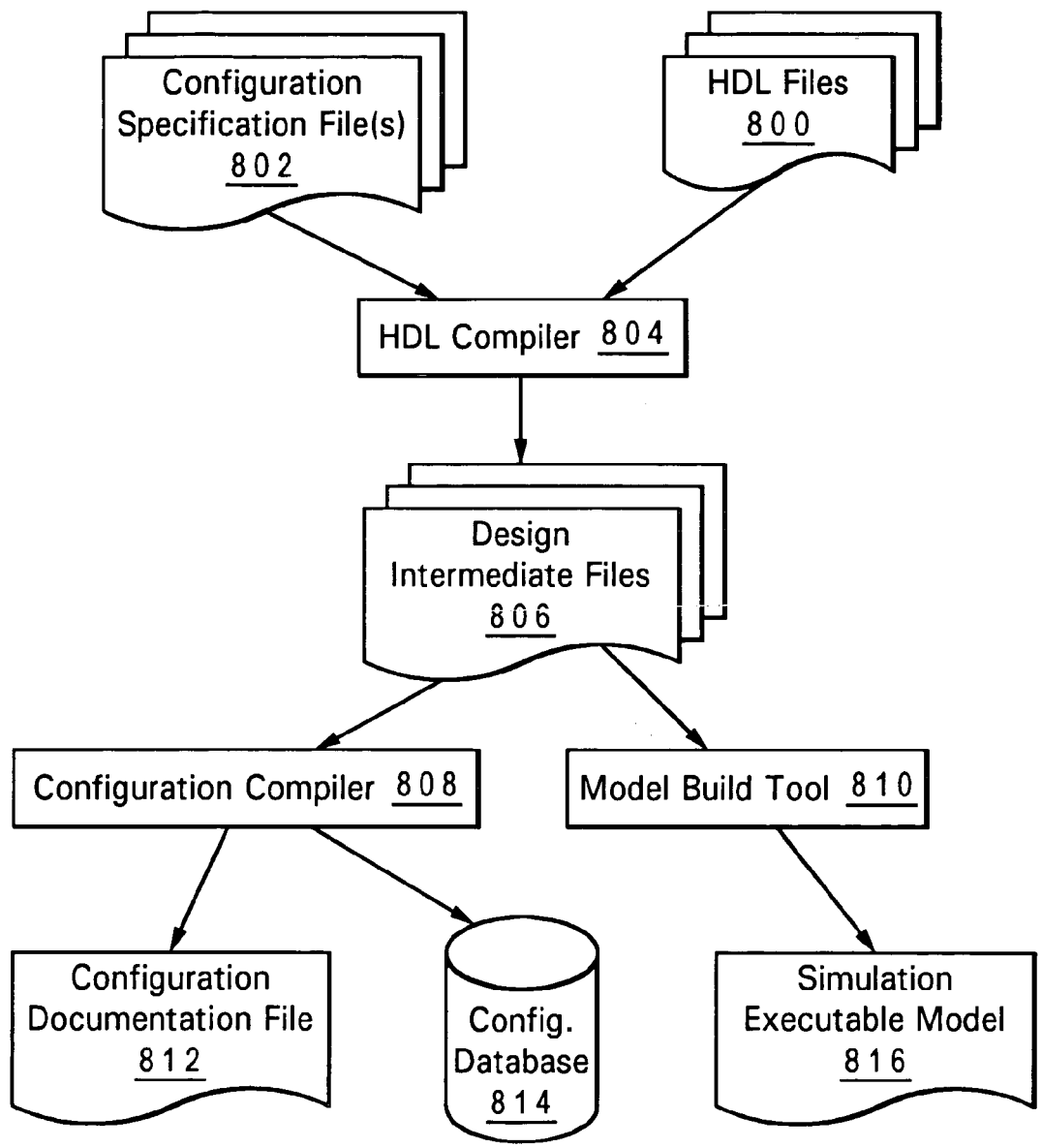
FIG. 8 is a high level flow diagram of a model build process utilized to produce a simulation executable model and associated simulation configuration database in accordance with the present invention.

Referring now to FIG. 8, there is depicted a high level flow diagram of a model build process in which HDL files containing configuration statements are compiled to obtain a simulation executable model and a simulation configuration database for a digital design. The process begins with one or more design entity HDL source code files 800, which include configuration specification statements and/or configuration file reference statements, and, optionally, one or more configuration specification reference files 802. HDL compiler 804 processes HDL file(s) 800 and configuration specification file(s) 802, if any, beginning with the top level entity of a simulation model and proceeding in a recursive fashion through all HDL file(s) 800 describing a complete simulation model. As HDL compiler 804 processes each HDL file 800, HDL compiler 804 creates "markers" in the design intermediate files 806 produced in memory to identify configuration statements embedded in the HDL code and any configuration specification files referenced by an embedded configuration file reference statement.

Thereafter, the design intermediate files 806 in memory are processed by a configuration compiler 808 and model build tool 810 to complete the model build process. Model build tool 810 processes design intermediate files 806 into a simulation executable model 816, that when executed, models the logical functions of the digital design, which may represent, for example, a portion of an integrated circuit, an entire integrated circuit or module, or a digital system including multiple integrated circuits or modules. Configuration compiler 808 processes the configuration specification statements marked in design intermediate files 806 and creates from those statements a configuration documentation file 812 and a configuration database 814.

Configuration documentation file 812 lists, in human-readable format, information describing the Dials associated with the simulation model. The information includes the Dials' names, their mapping tables, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 contains a number of data structures pertaining to Dials. As described in detail below, these data structures include Dial data structures describing Dial entities, latch data structures, and Dial instance data structures. These data structures associate particular Dial inputs with particular configuration values used to configure the digital design (i.e., simulation executable model 816). In a preferred embodiment, the configuration values can be specified in terms of either signal states or configuration latch values, and the selection of which values are used is user-selectable. Configuration database 814 is accessed via Application Programming Interface (API) routines during simulation of the digital design utilizing simulation executable model 816 and is further utilized to generate similar configuration databases for configuring physical realizations of the digital design. In a preferred embodiment, the APIs are designed so that only top-level Dials (i.e., LDials, IDials or CDials without a CDial logically "above" them) can be set and all Dial values can be read.

As described above, the configuration specification language of the present invention advantageously permits the specification of the output values of LDials and IDials by reference to signal names (e.g., "sig1"). As noted above, a key motivation for this feature is that designers tend to think in terms of configuring operative signals to particular signal states, rather than configuring the associated configuration latches. In practice, however, a signal that a designer desires to configure to a particular state may not be directly connected to the output of an associated configuration latch. Instead, a signal to be configured may be coupled to an associated configuration latch through one or more intermediate circuit elements, such as buffers and inverters. Rather than burdening the designer with manually tracing back each configurable signal to an associated configuration latch and then determining an appropriate value for the configuration latch, configuration compiler 808 automatically traces back a specified signal to the first storage element (i.e., configuration latch) coupled to the signal and performs any necessary inversions of the designer-specified signal state value to obtain the proper value to load into the configuration latch.

With reference now to FIG. 9A, there is illustrated a portion of a digital design including an LDial 900 that controls the states of a plurality of signals 904a-904e within the digital design. When configuration compiler 808 performs a traceback of signal 904a, no inversion of the designer-specified signal states is required because signal 904a is directly connected to configuration latch 902a. Accordingly, configuration compiler 808 stores into configuration database 814 the designer-specified values from the configuration specification statement of LDial 900 as the values to be loaded into configuration latch 902a. Traceback of signal 904b to configuration latch 902b similarly does not result in the inversion of any designer-specified values from the configuration specification statement of LDial 900 because the only intervening element between signal 904b and configuration register 902b is a non-inverting buffer 906.

Configuration latches, such as configuration latches 902c and 902d, are frequently instantiated by designers through inclusion in an HDL file 800 of an HDL statement referencing a latch primitive in an HDL design library. The latch entity 903a, 903b inserted into the simulation executable model in response to such HDL library references may include inverters, such as inverters 908, 910, which are not explicitly "visible" to the designer in the HDL code. The automatic traceback performed by configuration compiler 808 nevertheless detects these inverters, thus preventing possible configuration errors.

Accordingly, when performing a traceback of signal 904c, configuration compiler 808 automatically inverts the designer-specified configuration value specified for signal 904c before storing the configuration value for configuration latch 902c in configuration database 814 because of the presence of an inverter 908 between signal 904c and configuration latch 902c. When configuration compiler 808 performs traceback of signal 904d, however, configuration compiler 808 does not invert the designer-specified signal state values despite the presence of inverters 910, 914 and buffer 912 in the signal path because the logic is collectively non-inverting. It should be noted that configuration compiler 808 can accurately process both "hidden" inverters like inverter 910 and explicitly declared inverters like inverter 914.

FIG. 9A finally illustrates a signal 904e that is coupled to multiple configuration latches 902e and 902f through an intermediate AND gate 916. In cases like this in which the traceback process detects fanout logic between the specified signal and the closest configuration latch, it is possible to configure configuration compiler 808 to generate appropriate configuration values for configuration latches 902e, 902f based upon the designer-specified signal state values for signal 904e. However, it is preferable if configuration compiler 808 flags the configuration specification statement for LDial 900 as containing an error because the compiler-selected values for configuration latches 902e, 902f may affect other circuitry that receives the configuration values from configuration latches 902 in unanticipated ways.

Figure 9B:
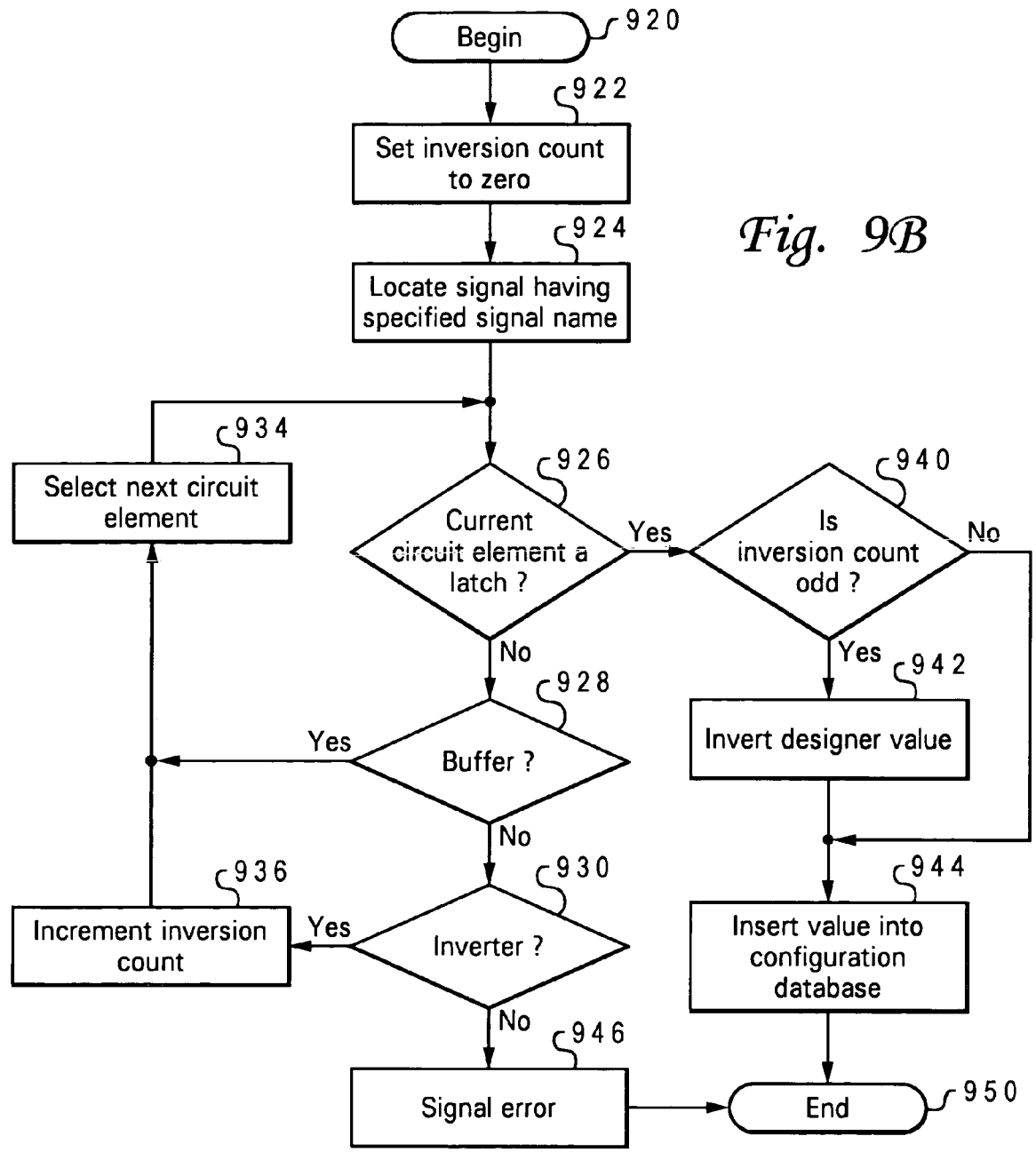
FIG. 9B is a high level flowchart of an exemplary traceback process implemented by a configuration compiler in accordance with a preferred embodiment of the present invention.

Referring now to FIG. 9B, there is depicted a high level logical flowchart of the traceback process implemented by configuration compiler 808 for each signal name specified in a configuration specification statement. As shown, the process begins at block 920 and then proceeds to block 922-924, which illustrate configuration compiler 808 initializing an inversion count to zero and then locating the signal identified by the signal name specified in a configuration specification statement.

The process then enters a loop comprising blocks 926-936, which collectively represent configuration compiler 808 tracing back the specified signal to the first latch element in the signal path. Specifically, as illustrated at blocks 926-930, configuration compiler 808 determines whether the next "upstream" circuit element in the signal path is a latch (926), buffer (928) or inverter (930). If the circuit element is a latch, the process exits the loop and passes to block 940, which is described below. If, however, the circuit element is a buffer, the process passes to block 934, which illustrates configuration compiler moving to the next upstream circuit element to be processed without incrementing the inversion count. If the circuit element is an inverter, the process passes to blocks 936 and 934, which depicts incrementing the inversion count and then moving to the next upstream circuit element to be processed. In this manner, configuration compiler traces back a specified signal to a configuration latch while determining a number of inversions of signal state implemented by the circuit elements in the path. As noted above, if configuration compiler 808 detects a circuit element other than a buffer or inverter in the signal path, configuration compiler 808 preferably flags an error, as shown at block 946. The process thereafter terminates at block 950.

Following detection of a configuration latch at block 926, configuration compiler 808 determines whether the inversion count is odd or even. As shown at blocks 940-944, if the inversion count is odd, configuration compiler inverts the designer-specified configuration values for the signal at block 942 prior to inserting the values into configuration database 814. No inversion is performed prior to inserting the configuration values into configuration database 814 if the inversion count is even. The process thereafter terminates at block 950.

As has been described, the present invention provides a configuration specification language that permits a designer of a digital system to specify a configuration for the digital system utilizing configuration statements embedded in the HDL design files describing the digital system. The configuration statements logically instantiate within the digital design one or more Dials, which provide configuration values for the digital design in response to particular inputs. The Dials, like the design entities comprising the digital design, may be hierarchically arranged. The configuration specification statements are compiled together with the HDL files describing the digital design to produce a configuration database that may be accessed to configure a simulation executable model or (after appropriate transformations) a physical realization of the digital design. The compilation of the configuration specification statements preferably supports a traceback process in which designer-specified configuration values for a signal are inverted in response to detection of an odd number of inverters coupled between the signal and an associated configuration latch.

With reference again to FIG. 5C, recall that an exemplary configuration specification statement for LDial 524 includes a parenthetical signal enumeration of the form:

```
LDial bus ratio (FXU0.A0.SIG1, FXU0.A1.SIG1,
    FXU0.B.C.SIG2(0..5),
    FXU1.A0.SIG1, FXU1.A1.SIG1,
    FXU1.B.C.SIG2(0..5),
    FPU0.SIG3, SIG4(0..3)
    ) =
    ...
```

It should be noted that the signal enumeration section of the configuration specification statement individually, hierarchically and explicitly enumerates the signal identifier of each signal instance configured by the Dial, beginning from the scope of the design entity with which the Dial is associated (which by convention is the design entity in whose HDL file the configuration specification statement or configuration reference statement instantiating the Dial is embedded). This syntax is referred to herein as a "full expression" of a signal identifier. Employing "full expression" syntax in the signal enumeration section of the configuration specification statement for an LDial or IDial or in the Dial enumeration section of the configuration specification statement of a CDial requires the designer to know and correctly enter the hierarchical identifier for each instance of a signal (or lower-level Dial) controlled by the Dial. Consequently, if a new instance of the same signal (or lower-level Dial) were later added to the digital design, the designer must carefully review the configuration specification statement of the Dial(s) referencing other instances of the same signal (or Dial) and update the signal (or Dial) enumeration section to include the full expression of the newly added instance.

In order to reduce the amount of input required to input the signal (or Dial) enumeration sections of configuration specification statements and to reduce the burden of code maintenance as new signal and Dial instances are added to the digital design, an ECAD system 35 in accordance with the present invention also supports a "compact expression" syntax for the signal (or Dial) enumeration sections of configuration specification statements. This syntax is referred to herein more specifically as "compact signal expression" when applied to the configuration specification statements of LDials and IDials and is referred to as "compact Dial expression" when referring to the configuration specification statements of CDials.

In a compact expression of a signal or dial enumeration, all instances of an entity within a selected scope for which a common configuration is desired can be enumerated with a single identifier. For example, in FIG. 5C, if the designer wants a common configuration for all four instantiations of signal sig1 514, the designer could enumerate all four instantiations in the configuration specification statement of LDial 524 with the single compact signal expression "[A]

.sig1", where the bracketed term is the name of the entity in which the signal of interest occurs. In compact expressions, the default scope of the expression is implied as the scope of the design entity (in this case top-level entity 302) with which the Dial is associated. The identifier "[A].sig1" thus specifies all four instantiations of signal sig1 514 within A entity instantiations 304 within the default scope of top-level entity 302.

The scope of the identifier in a compact expression can further be narrowed by explicitly enumerating selected levels of the design hierarchy. For example, the compact expression "FXU1.[A].sig1" refers only to signal sig1 instantiations 514b0 and 514b1 within FXU1 entity instantiation 304b, but does not encompass signal sig1 instantiations 514a0 and 514a1 within FXU0 entity instantiation 304a.

Of course, when only a single instance of a signal or Dial is instantiated at higher levels of the design hierarchy, the compact expression and the full expression will require approximately the same amount of input (e.g., "FPU0.sig3" versus "[FPU].sig3" to identify signal sig3 536). However, it should be noted that if another FPU entity 314 were later added to simulation model 300", the compact expression of the identification would advantageously apply to any later added FPU entities within the scope of top-level entity 302.

Utilizing compact expression, the configuration specification statement for LDial 524 can now be rewritten more compactly as follows:

```
LDial bus ratio ([A].SIG1, [C].SIG2(0..5),
        FPU0.SIG3, SIG4(0..3)
        ) =
        {2:1 =>0b0, 0x00, 0b0, 0x0;
         3:1 =>0b1, 0x01, 0b0, 0x1;
         4:1 =>0b1, 0x3F, 0b1, 0xF
        };
```

If the concatenation syntax described above is applied to the mapping table, the mapping table can be further reduced to:

```
        {2:1 =>0;
         3:1 =>0x821;
         4:1 =>0xFFF
        };
```

In the concatenation syntax, the signal values are specified in the mapping table with a single respective bit field for each entity identifier, irrespective of the number of actual entity instances. For example, all instances encompassed by "[A].sig1" are represented by 1 bit of the specified configuration value, all instances encompassed by "[C].sig2" are represented by 6 bits of the specified configuration value, the single instance identified by "FPU0.sig3" is represented by 1 bit of the specified configuration value, and the single instance of "sig4(0 . . . 3)" is represented by 4 bits of the specified configuration value. Thus, utilizing concatenation syntax, the 21 bits collectively specified by LDial 524 can be specified by an equivalent 12-bit pattern.

Compact Dial expressions are constructed and parsed by the compiler in the same manner as compact signal expressions. For example, the configuration specification statement for CDial 710 of FIG. 7B can be rewritten utilizing compact Dial expression as follows:

```
CDial BusRatio ([FXU].BUSRATIO, [FPU].BUSRATIO, BUSRATIO)=
        {2:1 => 2:1, 2:1, 2:1;
         3:1 => 3:1, 3:1, 3:1;
         4:1 => 4:1, 4:1, 4:1
        };
```

Again, this configuration specification statement advantageously permits CDial 710 to automatically control any additional LDials named "Bus ratio" that are latter added to simulation model 300''' through the instantiation of additional FXU entities 304 or FPU entities 314 without any code modification.

Figure 10:
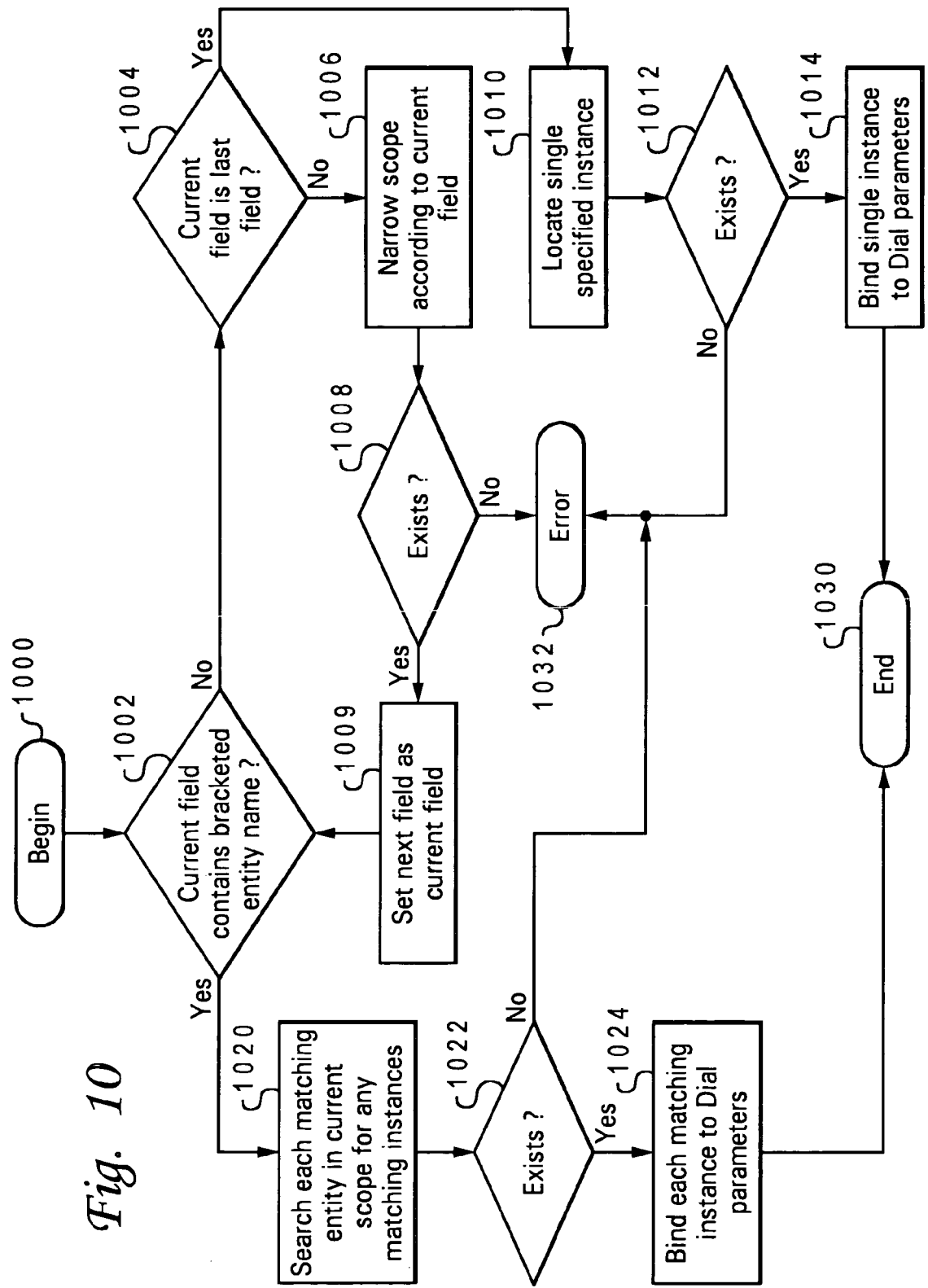
FIG. 10 is a high level logical flowchart of an exemplary method by which a configuration compiler parses each signal or Dial identification within a configuration specification statement in accordance with a preferred embodiment of the present invention.

Referring now to FIG. 10, there is depicted a high level logical flowchart of an exemplary method by which configuration compiler 808 parses each signal or Dial identification within a configuration specification statement in accordance with the present invention. As described above, each signal or Dial identification is constructed hierarchically from one or more fields separated by periods ("."). The last field specifies an instance name of a signal (e.g., "sig1") or Dial (e.g., "Bus_Ratio"), and the preceding fields narrow the scope from the default scope, which by convention is the scope of the design entity with which the Dial is associated.

As shown, the process begins at block 1000 and then proceeds to block 1002, which illustrates configuration compiler 808 determining whether the first or current field of the signal or Dial identification contains an entity identifier enclosed in brackets (e.g., "[A]"), that is, whether the identification is a compact expression. If so, the process passes to block 1020, which is described below. If not, configuration compiler 808 determines at block 1004 whether the identification is a full expression, by determining whether the first or current field of the identification is the last field of the identification. If so, the signal or Dial identification is a full expression, and the process passes to block 1010. If, on the other hand, the current field of the identification is not the last field, configuration compiler 808 narrows a current scope to the design entity instantiation identified in the current field of the identification, as depicted at block 1006. For example, if configuration compiler 808 were processing the identification "FPU0.SIG3" within the configuration specification statement of CDial 710 of FIG. 7B, configuration compiler 808 would narrow the scope from the default scope of top entity 302 to FPU entity instantiation 314. If the entity instantiation indicated by the current field of the identification exists, as shown at block 1008, the process returns to block 1002 after updating the current field to be the next field, as shown at block 1009. If, however, the entity instantiation specified by the current field does not exist within the current scope, configuration compiler 808 flags an error at block 1032 and terminates processing of the signal or Dial identification.

Referring again to block 1004, when configuration compiler 808 detects that it has reached the last field of a full expression, the process shown in FIG. 10 passes from block 1004 to block 1010. Block 1010 illustrates configuration compiler 1010 attempting to locate within the current scope the single signal or Dial instance having a name matching that specified in the last field of the signal or Dial identification. If configuration compiler 808 determines at block 1012 that no matching instance is found within the current scope, the process passes to block 1032, and configuration compiler 808 flags an error. However, if configuration compiler 808 locates the matching signal or Dial instance, then configuration compiler 808 makes an entry in configuration database 814 binding the signal or Dial instance to the parameters specified in the mapping table of the configuration specification statement of the Dial being processed, as shown at block 1014. Thereafter, processing of the signal or Dial identification terminates at block 1030.

With reference now to block 1020 and following blocks, the processing of a signal or Dial identification employing compact expression will now be described. Block 1020 depicts configuration compiler 808 attempting to locate, within each of one or more instances in the current scope of the entity indicated by the bracketed field, each Dial or signal instance matching that specified in the signal or Dial identification. For example, when processing the compact expression "FXU1.[A].sig1" for simulation model 300''' of FIG. 7B, configuration compiler 808, upon reaching the field "[A]", searches FXU1 for instantiations of entity A 306, and upon finding entity instantiations 306$a$0 and 306$a$1, searches within each of these two entity instantiations to locate signals instantiations sig1 514$a$0 and 514$a$1. If configuration compiler 808 determines at block 1022 that no matching signal or Dial instance is found within the current scope, the process passes to block 1032, which depicts configuration compiler 808 terminating processing of the signal or Dial identification after flagging an error. However, if configuration compiler 808 locates one or more matching signal or Dial instances, then the process passes from block 1022 to block 1024. Block 1024 illustrates configuration compiler 808 making one or more entries in configuration database 814 binding each matching signal or Dial instance to the parameters specified in the mapping table of the configuration specification statement of the Dial being processed. Thereafter, processing of the signal or Dial identification terminates at block 1030.

Utilizing the compact expressions supported by the present invention, the amount of code a designer must enter in a configuration specification statement can be advantageously reduced. The use of compact expressions not only reduces input requirements and the likelihood of input errors, but also simplifies code maintenance through the automatic application of specified configuration parameters to later entered instances of signals and Dials falling within a selected scope.

As described above, every Dial has a one-to-one mapping between each of its input values and a unique output value of the Dial. In other words, each input value has a unique output value different than the output value for any other input value. For CDials and LDials, the mapping table must explicitly enumerate each legal input value and its associated mapping.

The requirement that the input values must be explicitly enumerated in the mapping table limits the overall complexity of any given LDial or CDial. For example, consider the case of an integrated circuit (e.g., a memory controller) containing 10 to 20 configuration registers each having between 5 and 20 legal values. In many cases, these registers have mutual dependencies—the value loaded in one register can affect the legal possibilities of one or more of the other registers. Ideally, it would be convenient to specify values for all of the registers utilizing a Dial tree controlled by a single CDial. In this manner, the configuration of all of the 10 to 20 registers could be controlled as a group.

Unfortunately, given the assumptions set forth above, the 10 to 20 registers collectively may have over 300,000 legal combinations of values. The specification of a CDial in such a case, although theoretically possible, is undesirable and practically infeasible. Moreover, even if a looping construct could be employed to automate construction of the configuration specification statement of the CDial, the configuration specification statement, although informing simulation software which input values are legal, would not inform users how to set a CDial of this size.

In recognition of the foregoing, the configuration specification language of the present invention provides a "Dial group" construct. A Dial group is a collection of Dials among which the designer desires to create an association. The runtime APIs utilized to provide Dial input values observe this association by preventing the individual Dials within a Dial group from being set individually. In other words, all Dials in a Dial group must be set at the same time so that individual Dials are not set independently without concern for the interactions between Dials. Because software enforces an observance of the grouping of the Dials forming a Dial group, use of Dial groups also provides a mechanism by which a designer can warn the "downstream" user community that an unstated set of interdependencies exists between the Dials comprising the Dial group.

Figure 11A:
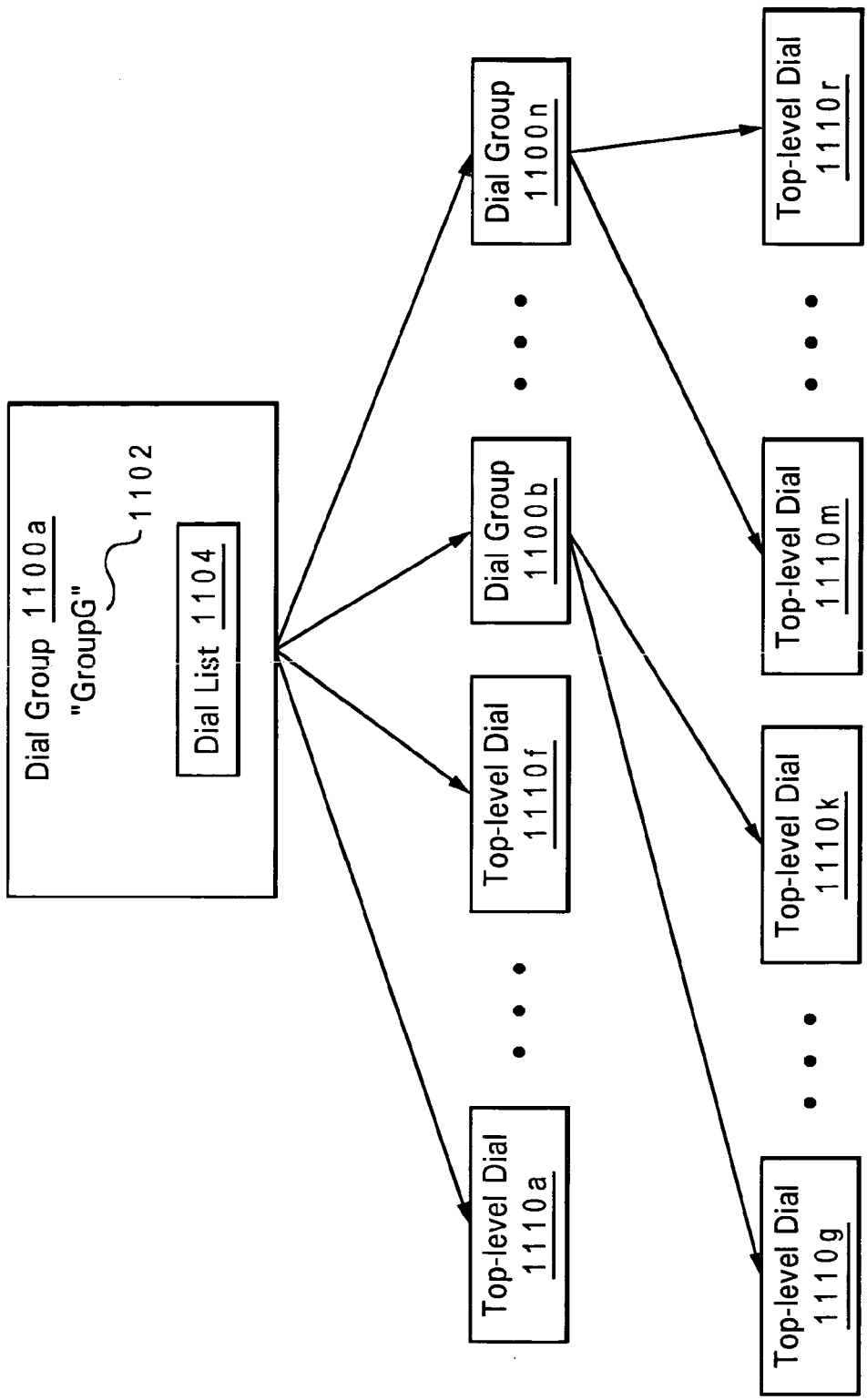
FIG. 11A depicts a diagrammatic representation of a Dial group.

With reference now to FIG. 11A, there is illustrated a diagrammatic representation of a Dial group 1100$a$. A Dial group 1100$a$ is defined by a group name 1102 (e.g., "GroupG") and a Dial list 1104 listing one or more Dials or other Dial groups. Dial groups do not have any inputs or outputs. The Dials listed within Dial list 1104, which are all top-level Dials 1110$a$-1110$f$, may be LDials, CDials and/or IDials.

FIG. 11A illustrates that a Dial group 1100$a$ may be implemented as a hierarchical Dial group that refers to one or more other Dial groups 1100$b$-1100$n$ in its Dial list 1104. These lower-level Dial groups in turn refer to one or more top-level Dials 1110$g$-1110$k$ and 1110$m$-1110$r$ (or other Dial groups) in their respective Dial lists.

One motivation for implementing Dial groups hierarchically is to coordinate configuration of groups of Dials spanning organizational boundaries. For example, consider a digital system in which 30 Dials logically belong in a Dial group and 10 of the Dials are contained within a first design entity that is the responsibility of a first designer and 20 of the Dials are contained within a second design entity that is the responsibility of a second designer. Without a hierarchical Dial group, a single Dial group explicitly listing all 30 Dials in its Dial list 1104 would have to be specified at a higher level of the design hierarchy encompassing both of the first and second design entities. This implementation would be inconvenient in that the designer (or design team) responsible for the higher-level design entity would have to know all of the related Dials in the lower-level design entities and specifically identify each of the 30 Dials in the Dial list 1104 of the Dial group.

An alternative hierarchical approach would entail creating a first Dial group containing the 10 Dials within the first design entity, a second Dial group containing the 20 Dials within the second design entity, and a third higher-level Dial group that refers to the first and second Dial groups. Importantly, the Dial list 1104 of the higher-level Dial group must only refer to the two lower-level Dial groups, thus shielding designers responsible for higher levels of the design hierarchy from low-level details. In addition, code maintenance is reduced since changing which Dials belong to the two lower-level Dial groups would not affect the Dial list 1104 of the upper-level Dial group.

Dial groups are subject to a number of rules. First, no Dial or Dial group may be listed in the Dial list 1104 of more than one Dial group. Second, a Dial group must refer to at least one Dial or other Dial group in its Dial list 1104. Third, in its Dial list 1104, a Dial group can only refer to Dials or Dial groups within its scope, which by convention (and like the concept of scope as applied to Dials) is that of its associated design entity (i.e., the design entity itself and any lower level design entity within the design entity). Fourth, each Dial referred to in a Dial list 1104 of a Dial group must be a top-level Dial.

Figure 11B:
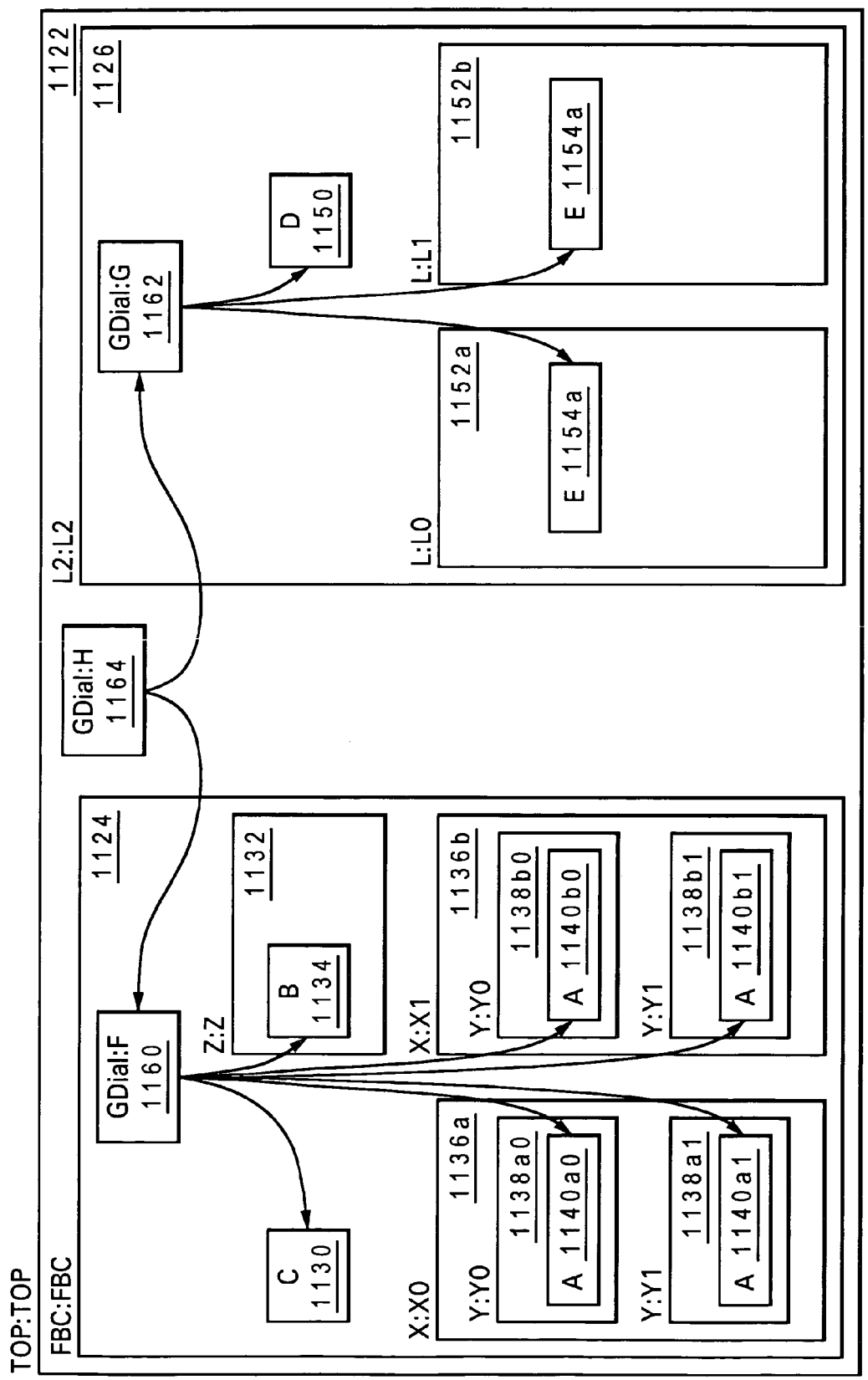
FIG. 11B illustrates an exemplary simulation model including Dials grouped in multiple hierarchically arranged Dial groups.

Referring now to FIG. 11B, there is depicted an exemplary simulation model 1120 illustrating the use of Dial groups. Exemplary simulation model 1120 includes a top-level design entity 1122 having instantiation identifier "TOP:TOP". Within top-level design entity 1122, two design entities 1124 and 1126 are instantiated, which have entity names FBC and L2, respectively. FBC entity instantiation 1124 in turn instantiates a Dial instance 1130 having Dial name "C", a Z entity instantiation 1132 containing a Dial instance 1134 having Dial name "B", and two instantiations of entity X 1136, which are respectively named "X0" and "X1". Each entity X instantiation 1136 contains two entity Y instantiations 1138, each further instantiating a Dial instance 1140 having Dial name "A". L2 entity instantiation 1126 contains a Dial instance 1150 having Dial name "D" and two entity L instantiations 1152, each containing a Dial instance 1154 having Dial name "E".

As shown, FBC entity instantiation 1124 has an associated Dial group instance 1160 having a group name "F". As indicated by arrows, Dial group instance 1160 includes each of Dials instances 1130, 1134 and 1140 within FBC entity instantiation 1124. L2 entity instantiation 1126 similarly has an associated Dial group instance 1162 that includes each of Dial instances 1150 and 1154 within L2 entity instantiation 1126. Both of these Dial group instances in turn belong to a higher-level Dial group instance 1164 having group name "H", which is associated with top-level design entity 1122.

Each Dial group instance is created by including within the HDL file of the associated design entity an appropriate configuration statement. For example, exemplary syntax for configuration statements creating Dial groups "F", "G" and "H" are respectively given as follows:

GDial F(C, [Z].B, [Y].A);
GDial G(D, [L].E);
GDial H(FBC.F, L2.G);

In each configuration statement, a Dial group is declared by the keyword "GDial", which is followed by string (e.g., "F") representing the group name. Within the parenthesis following the group name, the Dial list for the Dial group is specified. As indicated in the configuration statement for Dial group "H", the Dial list for a hierarchical Dial group specifies other Dial groups in the same manner as Dials. It should also be noted that the compact dial expression syntax discussed above can be employed in specifying Dials or Dial groups in the Dial list, as indicated in the configuration statements for Dial groups "F" and "G". In addition, default values may be applied to a Dial group by specifying a default value for each top-level Dial included in the Dial group.

Now that basic types of Dials, syntax for their specification, and the application and Dial groups have been described, a description of an exemplary implementation of configuration database 814 and its use will be provided. To promote understanding of the manner in which particular Dial instantiations (or multiple instantiations of a Dial) can be accessed in configuration database 814, a nomenclature for Dials within configuration database 814 will be described.

The nomenclature employed in a preferred embodiment of the present invention first requires a designer to uniquely name each Dial specified within any given design entity, i.e., the designer cannot declare any two Dials within the same design entity with the same Dial name. Observing this requirement prevents name collisions between Dials instantiated in the same design entity and promotes the arbitrary re-use of design entities in models of arbitrary size. This constraint is not too onerous in that a given design entity is usually created by a specific designer at a specific point in time, and maintaining unique Dial names within such a limited circumstance presents only a moderate burden.

Because it is desirable to be able to individually access particular instantiations of a Dial entity that may have multiple instantiations in a given simulation model (e.g., due to replication), use of a Dial name alone is not guaranteed to uniquely identify a particular Dial entity instantiation in a simulation model. Accordingly, in a preferred embodiment, the nomenclature for Dials leverages the unique instantiation identifier of the associated design entity required by the native HDL to disambiguate multiple instances of the same Dial entity with an "extended Dial identifier" for each Dial within the simulation model.

As an aside, it is recognized that some HDLs do not strictly enforce a requirement for unique entity names. For example, conventional VHDL entity naming constructs permit two design entities to share the same entity name, entity_name. However, VHDL requires that such identically named entities must be encapsulated within different VHDL libraries from which a valid VHDL model may be constructed. In such a circumstance, the entity_name is equivalent to the VHDL library name concatenated by a period (".") to the entity name as declared in the entity declaration. Thus, pre-pending a distinct VHDL library name to the entity name disambiguates entities sharing the same entity name. Most HDLs include a mechanism such as this for uniquely naming each design entity.

In a preferred embodiment, an extended Dial identifier that uniquely identifies a particular instantiation of a Dial entity includes three fields: an instantiation identifier field, a design entity name, and a Dial name. The extended Dial identifier may be expressed as a string in which adjacent fields are separated by a period (".") as follows:

<instantiation identifier>.<design entity name>.<Dial name>

In the extended Dial identifier, the design entity field contains the entity name of the design entity in which the Dial is instantiated, and the Dial name field contains the name declared for the Dial in the Dial configuration specification statement. As described above, the instantiation identifier specified in the instantiation identifier field is a sequence of instantiation identifiers, proceeding from the top-level entity of the simulation model to the direct ancestor design entity of the given Dial instance, with adjacent instance identifiers separated by periods ("."). Because no design entity can include two Dials of the same name, the instantiation identifier is unique for each and every instance of a Dial within the model.

The uniqueness of the names in the design entity name field is a primary distinguishing factor between Dials. By including the design entity name in the extended Dial identifier, each design entity is, in effect, given a unique namespace for the Dials associated with that design entity, i.e., Dials within a given design entity cannot have name collisions with Dials associated with other design entities. It should also be noted that it is possible to uniquely name each Dial by using the instantiation identifier field alone. That is, due to the uniqueness of instantiation identifiers, Dial identifiers formed by only the instantiation identifier field and the Dial name field will be necessarily unique. However, such a naming scheme does not associate Dials with a given design entity. In practice, it is desirable to associate Dials with the design entity in which they occur through the inclusion of the design entity field because all the Dials instantiations can then be centrally referenced without the need to ascertain the names of all the design entity instantiations containing the Dial.

As noted above, use of extended Dial identifiers permits the unique identification of a particular instantiation of a Dial and permits the re-use of design entities within any arbitrary model without risk of Dial name collisions. For example, referring again to FIG. 11B, Dial A entity instantiations 1140$a$0, 1140$a$1, 1140$b$0 and 1140$b$1 can be respectively uniquely identified by the following extended Dial identifiers:

FBC.X0.Y0.Y.A
FBC.X0.Y1.Y.A
FBC.X1.Y0.Y.A
FBC.X1.Y1.Y.A

Figure 12:
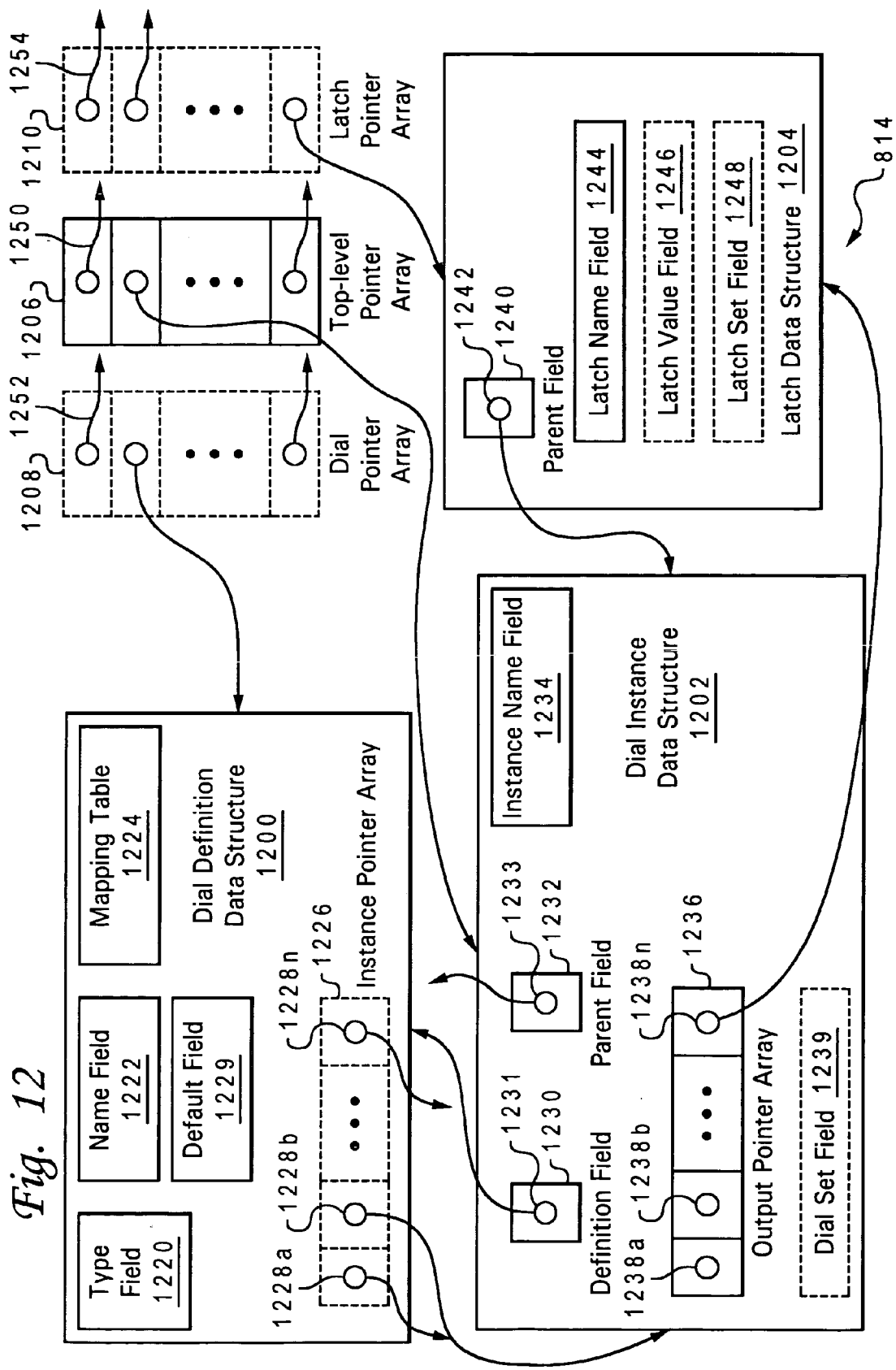
FIG. 12 depicts an exemplary embodiment of a simulation configuration database in accordance with the present invention.

With an understanding of a preferred nomenclature of Dials, reference is now made to FIG. 12, which is a diagrammatic representation of an exemplary format for a configuration database 814 created by configuration compiler 808. In this exemplary embodiment, configuration database 814 includes at least four different types of data structures: Dial definition data structures (DDDS) 1200, Dial instance data structures (DIDS) 1202, latch data structures 1204 and top-level pointer array 1206. Configuration database 814 may optionally include additional data structures, such as Dial pointer array 1208, latch pointer array 1210, instance pointer array 1226 and other data structures depicted in dashed-line illustration, which may alternatively be constructed in volatile memory when configuration database 814 is loaded, as described further below. Generating these additional data structures only after configuration database 814 is loaded into volatile memory advantageously promotes a more compact configuration database 814.

A respective Dial definition data structure (DDDS) 1200 is created within configuration database 814 for each Dial or Dial group in the digital system. Preferably, only one DDDS 1200 is created in configuration database 814 regardless of the number of instantiations of the Dial (or Dial group) in the digital system. As discussed below, information regarding particular instantiations of a Dial described in a DDDS 1200 is specified in separate DIDSs 1202.

As shown, each DDDS 1200 includes a type field 1220 denoting whether DDDS 1200 describes a Dial or Dial group, and if a Dial, the type of Dial. In one embodiment, the value set for type field 1220 includes "G" for Dial group, "I" for integer Dial (IDial), "L" for latch Dial (LDial), and "C" for control Dial (CDial). DDDS 1200 further includes a name field 1222, which specifies the name of the Dial or Dial group described by DDDS 1200. This field preferably contains the design entity name of the Dial (or Dial group), followed by a period ("."), followed by the name of Dial (or Dial group) given in the configuration specification statement of the Dial (or Dial group). The contents of name field 1222 correspond to the design entity name and Dial name fields of the extended dial identifier for the Dial.

DDDS 1200 also includes a mapping table 1224 that contains the mapping from the input of the given Dial to its output(s), if required. For LDials and CDials, mapping table 1224 specifies relationships between input values and output values much like the configuration specification statements for these Dials. For Dial groups and IDials not having a split output, mapping table 1220 is an empty data structure and is not used. In the case of an IDial with a split output, mapping table 1220 specifies the width of the replicated integer field and the number of copies of that field. This information is utilized to map the integer input value to the various copies of the integer output fields. If the configuration specification statement for the Dial has a default specified, DDDS 1200 indicates the default value in default field 1229; if no default is specified, default field 1229 is NULL or is omitted.

Finally, DDDS 1200 may include an instance pointer array 1226 containing one or more instance pointers 1228$a$-1228$n$ pointing to each instance of the Dial or Dial group defined by the DDDS 1200. Instance pointer array 1226 facilitates access to multiple instances of a particular Dial or Dial group.

As further illustrated in FIG. 12, configuration database 814 contains a DIDS 1202 corresponding to each Dial instantiation or Dial group instantiation within a digital design. Each DIDS 1202 contains a definition field 1230 containing a definition pointer 1231 pointing to the DDDS 1200 of the Dial for which the DIDS 1202 describes a particular instance. Definition pointer 1231 permits the Dial name, Dial type and mapping table of an instance to be easily accessed once a particular Dial instance is identified.

DIDS 1202 further includes a parent field 1232 that, in the case of an IDial, CDial or LDial, contains a parent pointer 1233 pointing to the DIDS 1202 of the higher-level Dial instance, if any, having an output logically connected to the input of the corresponding Dial instance. In the case of a Dial group, parent pointer 1233 points to the DIDS 1202 of the higher-level Dial group, if any, that hierarchically includes the present Dial group. If the Dial instance corresponding to a DIDS 1202 is a top-level Dial and does not belong to any Dial group, parent pointer 1233 in parent field 1232 is a NULL pointer. It should be noted that a Dial can be a top-level Dial, but still belong to a Dial group. In that case, parent pointer 1233 is not NULL, but rather points to the DIDS 1202 of the Dial group containing the top-level Dial.

Thus, parent fields 1232 of the DIDSs 1202 in configuration database 814 collectively describe the hierarchical arrangement of Dial entities and Dial groups that are instantiated in a digital design. As described below, the hierarchical information provided by parent fields 1232 advantageously enables a determination of the input value of any top-level Dial given the configuration values of the configuration latches ultimately controlled by that top-level Dial.

Instance name field 1234 of DIDS 1202 gives the fully qualified instance name of the Dial instance described by DIDS 1202 from the top-level design entity of the digital design. For Dial instances associated with the top-level entity, instance name field 1234 preferably contains a NULL string.

Finally, DIDS 1202 includes an output pointer array 1236 containing pointers 1238$a$-1238$n$ pointing to data structures describing the lower-level instantiations associated with the corresponding Dial instance or Dial group instance. Specifically, in the case of IDials and LDials, output pointers 1238 refer to latch data structures 1204 corresponding to the configuration latches coupled to the Dial instance. For non-split IDials, the configuration latch entity referred to by output pointer 1238$a$ receives the high order bit of the integer input value, and the configuration latch entity referred to by output pointer 1238$n$ receives the low order bit of the integer input value. In the case of a CDial, output pointers 1238 refer to other DIDSs 1202 corresponding to the Dial instances controlled by the CDial. For Dial groups, output pointers 1238 refers to the top-level Dial instances or Dial group instances hierarchically included within the Dial group instance corresponding to DIDS 1202.

Configuration database 814 further includes a respective latch data structure 1204 for each configuration latch in simulation executable model 816 to which an output of an LDial or IDial is logically coupled. Each latch data structure 1204 includes a parent field 1240 containing a parent pointer 1242 to the DIDS 1200 of the LDial or IDial directly controlling the corresponding configuration latch. In addition, latch data structure 1204 includes a latch name field 1244 specifying the hierarchical latch name, relative to the entity containing the Dial instantiation identified by parent pointer 1242. For example, if an LDial X having an instantiation identifier a.b.c refers to a configuration latch having the hierarchical name "a.b.c.d.latch1", latch name field 1244 will contain the string "d.latch1". Prepending contents of an instance name field 1234 of the DIDS 1202 identified by parent pointer 1242 to the contents of a latch name field 1244 thus provides the fully qualified name of any instance of a given configuration latch configurable utilizing configuration database 814.

Still referring to FIG. 12, as noted above, configuration database 814 includes top-level pointer array 1206, and optionally, Dial pointer array 1208 and latch pointer array 1210. Top-level pointer array 1206 contains top-level pointers 1250 that, for each top-level Dial and each top-level Dial group, points to an associated DIDS 1202 for the top-level entity instance. Dial pointer array 1208 includes Dial pointers 1252 pointing to each DDDS 1200 in configuration database 814 to permit indirect access to particular Dial instances through Dial and/or entity names. Finally, latch pointer array 1210 includes latch pointers 1254 pointing to each latch data structure 1204 within configuration database 814 to permit easy access to all configuration latches.

Once a configuration database 814 is constructed, the contents of configuration database 814 can be loaded into volatile memory, such as system memory 18 of data processing system 8 of FIG. 1, in order to appropriately configure a simulation model for simulation. In general, data structures 1200, 1202, 1204 and 1206 can be loaded directly into system memory 18, and may optionally be augmented with additional fields, as described below. However, as noted above, if it is desirable for the non-volatile image of configuration database 814 to be compact, it is helpful to generate additional data structures, such as Dial pointer array 1208, latch pointer array 1210 and instance pointer arrays 1226, in the volatile configuration database image in system memory 18.

Figure 13:
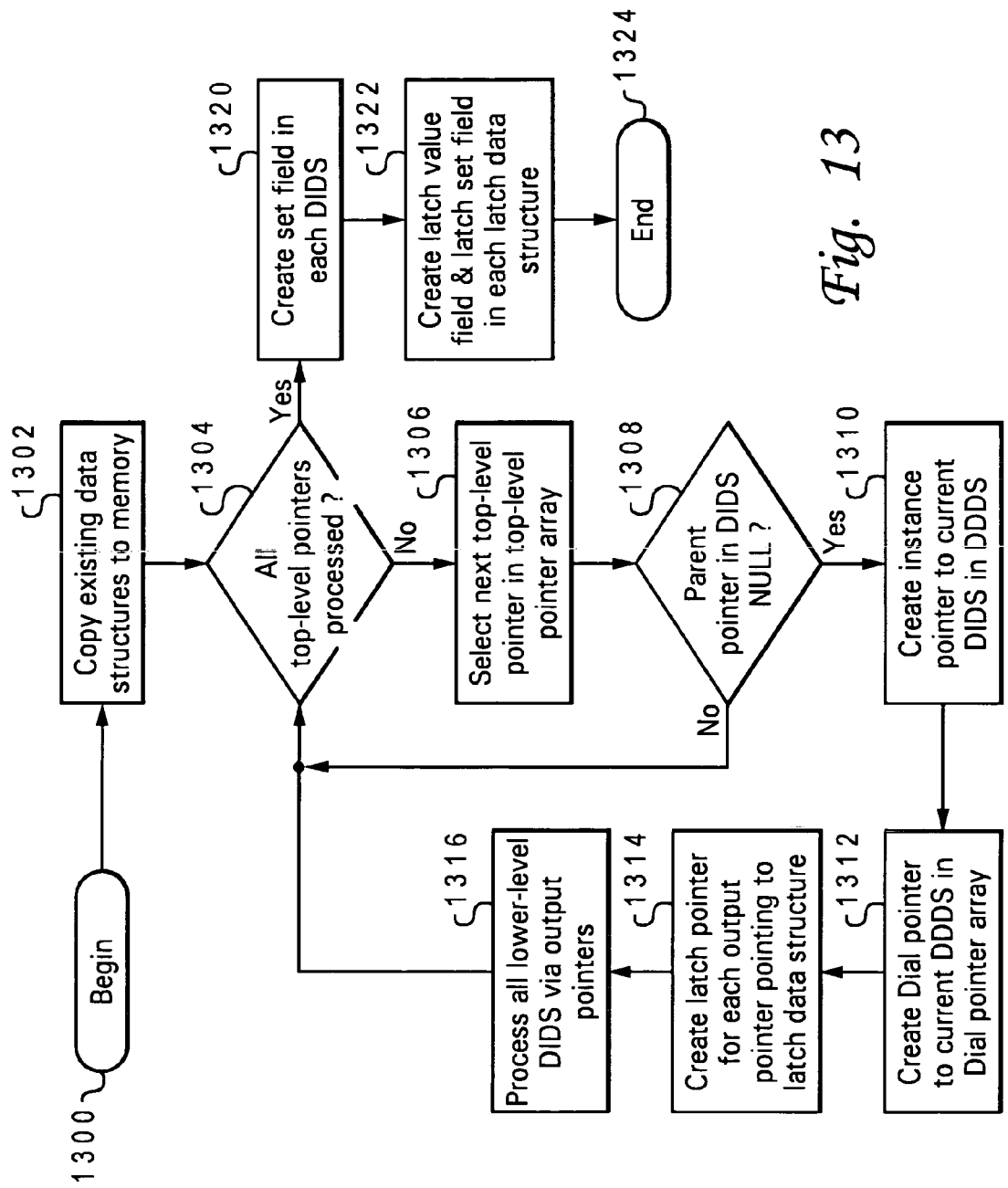
FIG. 13 is a high level logical flowchart of a illustrative method by which a configuration database is expanded within volatile memory of a data processing system in accordance with the present invention.

Referring now to FIG. 13, there is depicted a high level logical flowchart of a method by which configuration database 814 is expanded within volatile memory of a data processing system, such as system memory 18 of data processing system 8. Because FIG. 13 depicts logical steps rather than operational steps, it should be understood that many of the steps illustrated in FIG. 13 may be performed concurrently or in a different order than that shown.

As illustrated, the process begins at block 1300 and then proceeds to block 1302, which illustrates data processing system 6 copying the existing data structures within configuration database 814 from non-volatile storage (e.g., disk storage or flash memory) into volatile system memory 18. Next, at block 1304, a determination is made whether all top-level pointers 1250 within top-level pointer array 1206 of configuration database 814 have been processed. If so, the process passes to block 1320, which is discussed below. If not, the process proceeds to block 1306, which illustrates selection from top-level array 1206 of the next top-level pointer 1250 to be processed.

A determination is then made at block 1308 of whether or not parent pointer 1233 within the DIDS 1202 identified by the selected top-level pointer 1250 is a NULL pointer. If not, which indicates that the DIDS 1202 describes a top-level Dial belonging to a Dial group, the process returns to block 1304, indicating that the top-level Dial and its associated lower-level Dials will be processed when the Dial group to which it belongs is processed.

In response to a determination at block 1308 that the parent pointer 1233 is a NULL pointer, data processing system 8 creates an instance pointer 1228 to the DIDS 1202 in the instance array 1226 of the DDDS 1200 to which definition pointer 1231 in definition field 1230 of DIDS 1202 points, as depicted at block 1310. Next, at block 1312, data processing system 8 creates a Dial pointer 1252 to the DDDS 1200 of the top-level Dial within Dial pointer array 1208, if the Dial pointer 1252 is not redundant. In addition, as shown at block 1314, data processing system 8 creates a latch pointer 1254 within latch pointer array 1210 pointing to each latch data structure 1204, if any, referenced by an output pointer 1238 of the DIDS 1202 of the top-level Dial. As shown at block 1316, each branch at each lower level of the Dial tree, if any, headed by the top-level Dial referenced by the selected top-level pointer 1250 is then processed similarly by performing the functions illustrated at block 1310-1316 until a latch data structure 1204 terminating that branch is found and processed. The process then returns to block 1304, representing the processing of each top-level pointer 1250 within top-level pointer array 1206.

In response to a determination at block 1304 that all top-level pointers 1250 have been processed, the process illustrated in FIG. 13 proceeds to block 1320. Block 1320 illustrates the creation of a Set field 1239 in each DIDS 1320 in the configuration database. Set field 1239 is a Boolean-valued field that in initialized to FALSE and is updated to TRUE when the associated Dial instance is explicitly set. In addition, as depicted at block 1322, data processing system 8 creates a latch value field 1246 and latch set field 1248 in each latch data structure 1204 to respectively indicate the current set value of the associated configuration latch and to indicate whether the configuration latch has been explicitly set. Although the creation of the three fields indicated at block 1320-1322 is illustrated separately from the processing depicted at blocks 1304-1316 for purposes of clarity, it will be appreciated that it is more efficient to create Dial set field 1239 as each DIDS 1202 is processed and to create latch value and latch set fields 1246, 1248 as the latch data structures 1204 at the bottom of each Dial tree are reached. The process of loading the configuration database into volatile memory thereafter terminates at block 1324.

With the configuration database loaded into volatile memory, a simulation model can be configured and utilized to simulate a digital design through the execution of simulation software. With reference to FIG. 14, there is illustrated a block diagram depicting the contents of system memory 18 (FIG. 1) during a simulation run of a simulation model. As shown, system memory 18 includes a simulation model 1400, which is a logical representation of the digital design to be simulated, as well as software including configuration APIs 1406, a simulator 1410 and an RTX (Run Time eXecutive) 1420.

Simulator 1410 loads simulation models, such as simulation model 1400, into system memory 18. During a simulation run, simulator 1410 resets, clocks and evaluates simulation model 1400 via various APIs 1416. In addition, simulator 1410 reads values in simulation model 1400 utilizing GETFAC API 1412 and writes values to simulation model 1400 utilizing PUTFAC API 1414. Although simulator 1410 is implemented in FIG. 14 entirely in software, it will be appreciated in what follows that the simulator can alternatively be implemented at least partially in hardware.

Configuration APIs 1406 comprise software, typically written in a high level language such as C or C++, that support the configuration of simulation model 1400. These APIs, which are dynamically loaded by simulator 1410 as needed, include a first API that loads configuration model 814 from non-volatile storage and expands it in the manner described above with reference to FIG. 13 to provide a memory image of configuration database 1404. Configuration APIs 1406 further include additional APIs to access and manipulate configuration database 1404, as described in detail below.

RTX 1420 controls simulation of simulation models, such as simulation model 1400. For example, RTX 1420 loads test cases to apply to simulation model 1400. In addition, RTX 1420 delivers a set of API calls to configuration APIs 1406 and the APIs provided by simulator 1410 to initialize, configure, and simulate operation of simulation model 1400. During and after simulation, RTX 1420 also calls configuration APIs 1406 and the APIs provided by simulator 1410 to check for the correctness of simulation model 1400 by accessing various Dials, configuration latches, counters and other entities within simulation model 1400.

RTX 1420 has two modes by which it accesses Dials instantiated within simulation model 1400: interactive mode and batch mode. In interactive mode, RTX 1420 calls a first set of APIs to read from or write to one or more instances of a particular Dial within configuration database 1404. The latch value(s) obtained by reference to configuration database 1404 take immediate effect in simulation model 1400. In batch mode, RTX 1420 calls a different second set of APIs to read or write instantiations of multiple Dials in configuration database 1404 and then make any changes to simulation model 1400 at the same time.

In either interactive or batch mode, RTX 1420 must employ some syntax in its API calls to specify which Dial or Dial group instances within simulation model 1400 are to be accessed. Although a number of different syntaxes can be employed, including conventional regular expressions employing wildcarding, in an illustrative embodiment the syntax utilized to specify Dial or Dial group instances in API calls is similar to the compact expression hereinbefore described. A key difference between the compact expressions discussed above and the syntax utilized to specify Dial or Dial group instances in the RTX API calls is that, in the illustrative embodiment, Dial and Dial group instances are specified in the RTX API calls by reference to the top-level design entity of simulation model 1400 rather than relative to the design entity in which the Dial or Dial group is specified.

In the illustrative embodiment, each RTX API call targeting one or more Dial or Dial group instances in simulation model 1400 specifies the Dial or Dial group instances utilizing two parameters: an instance qualifier and a dialname qualifier. To refer to only a single Dial or Dial group instantiation, the instance qualifier takes the form "a.b.c.d", which is the hierarchical instantiation identifier of the design entity in which the single Dial or Dial group instantiation occurs. To refer to multiple Dial or Dial group instances, the instance qualifier takes the form "a.b.c.[X]", which identifies all instantiations of entity X within the scope of entity instance a.b.c. In the degenerate form, the instance qualifier may simply be "[X]", which identifies all instantiations of entity X anywhere within simulation model 1400.

The dialname qualifier preferably takes the form "Entity.dialname", where "Entity" is the design entity in which the Dial or Dial group is instantiated and "dialname" is the name assigned to the Dial or Dial group in its configuration specification statement. If bracketed syntax is employed to specify the instance qualifier, the "Entity" field can be dropped from the dialname qualifier since it will match the bracketed entity name.

Referring now to FIG. 15 there is depicted a high level logical flowchart of an exemplary process by which configuration APIs 1406 locate particular Dial or Dial group instances in configuration database 1404 based upon an instance qualifier and dialname qualifier pair in accordance with the present invention. As shown, the process begins at block 1500 in response to receipt by a configuration API 1406 of an API call from RTX 1420 containing an instance qualifier and a dialname qualifier as discussed above. In response to the API call, the configuration API 1406 enters configuration database 1404 at Dial pointer array 1208, as depicted at block 1502, and utilizes Dial pointers 1252 to locate a DDDS 1200 having a name field 1222 that exactly matches the specified dialname qualifier, as illustrated at block 1504.

Next, at block 1506, the configuration API 1406 determines whether the instance qualifier employs bracketed syntax, as described above. If so, the process passes to block 1520, which is described below. However, if the instance qualifier does not employ bracketed syntax, the configuration API 1406 follows the instance pointers 1228 of the matching DDDS 1200 to locate the single DIDS 1202 having an instance name field 1234 that exactly matches the specified instance qualifier. As indicated at blocks 1510-1512, if no match is found, the process terminates with an error. However, if a matching DIDS 1202 is located, a temporary "result" pointer identifying the single matching DIDS 1202 is created at block 1524. The process thereafter terminates at block 1526.

Returning to block 1520, if bracketed syntax is employed, the configuration API 1406 utilizes instance pointers 1228 of the matching DDDS 1200 to locate one or more DIDSs 1202 of Dial or Dial group instances within the scope specified by the prefix portion of the instance identifier preceding the bracketing. That is, a DIDS 1202 is said to "match" if the instance name field 1234 of the DIDS 1202 contains the prefix portion of the instance qualifier. Again, if no match is found, the process passes through block 1522 and terminates with an error at block 1512. However, if one or more DIDSs 1202 "match" the instance qualifier, temporary result pointers identifying the matching DIDSs 1202 are constructed at block 1524. The process shown in FIG. 15 thereafter terminates at block 1526.

Figure 16A:
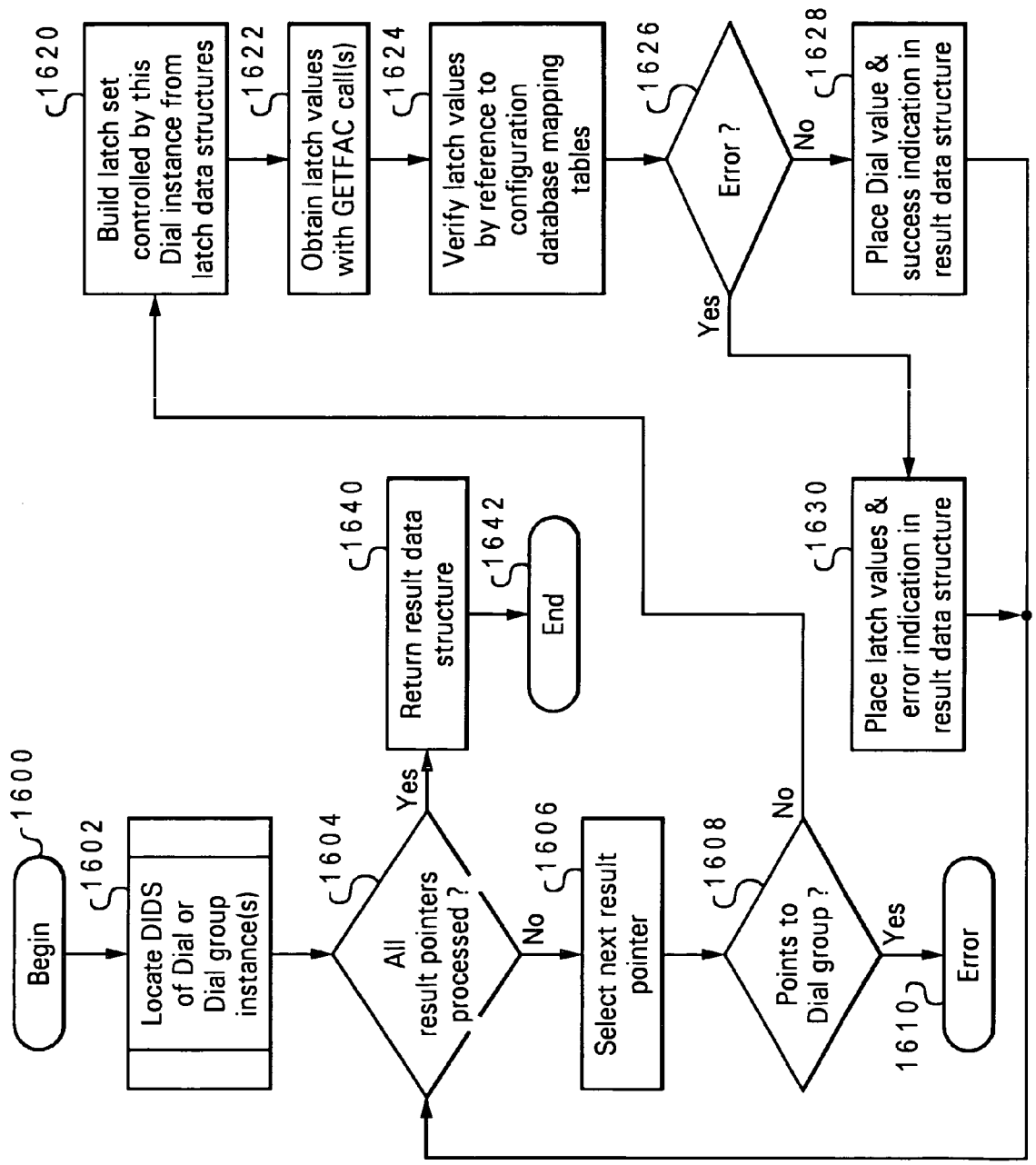
FIG. 16A is a high level logical flowchart of an illustrative method of reading a Dial instance in an interactive mode during simulation of a digital design in accordance with the present invention.

With reference now to FIG. 16A, there is illustrated a high level logical flowchart of an exemplary process by which RTX 1420 reads a value of one or more Dial instances in interactive mode, in accordance with the present invention. As shown, the process begins at block 1600 in response to receipt by a configuration API 1406 of a read_Dial() API call by RTX 1420. As indicated at block 1602, a configuration API 1406 responds to the read_Dial() API call by locating within configuration database 1404 one or more DIDSs 1202 of Dial instances responsive to the API call utilizing the process described above with reference to FIG. 15.

The process then enters a loop at block 1604 in which each of the temporary result pointers generated by the process of FIG. 15 is processed. If all of the result pointers returned by the process of FIG. 15 have been processed, the process passes to block 1640, which is described below. If not, the process proceeds from block 1606 to block 1608, which illustrates the configuration API 1406 selecting a next result pointer to be processed. Next, at block 1608, the configuration API 1406 determines by reference to type field 1220 of the DDDS 1200 associated with the DIDS 1202 identified by the current result pointer whether the DIDS 1202 corresponds to a Dial group. If so, the process illustrated in FIG. 16A terminates with an error condition at block 1610 indicating that RTX 1420 has utilized the wrong API call to read a Dial instance.

In response to a determination at block 1608 that the DIDS 1202 identified by the current result pointer does not correspond to a Dial group instance, the process proceeds to block 1620. Block 1620 depicts configuration API 1406 utilizing output pointers 1238 of the DIDS 1202 (and those of any lower-level DIDS 1202 in the Dial tree) to build a data set containing the latch names from the latch name fields 1244 of latch data structures 1204 corresponding to all configuration latches ultimately controlled by the Dial instance specified in the API call. Next, as depicted at block 1622, the configuration API 1406 makes one or more API calls to GETFAC() API 1412 of simulator 1410 to obtain from simulation model 1400 the latch values of all of the configuration latches listed in the data set constructed at block 1620.

Configuration API 1406 then verifies the latch values obtained from simulation model 1400 by reference to configuration database 1404, as shown at block 1624. In order to verify the latch values, configuration API 1406 utilizes mapping tables 1224 to propagate the latch values up the Dial tree from the corresponding latch data structures through intermediate DIDSs 1202, if any, until an input value for the requested Dial instance is determined. If at any point in this verification process, a Dial instance's output value generated by the verification process does not correspond to one of the legal values enumerated in its mapping table 1224, an error is detected at block 1626. Accordingly, the latch values read from simulation model 1400 and an error indication are placed in a result data structure, as illustrated at block 1630. If no error is detected, the Dial input value generated by the verification process and a success indication are placed in the result data structure, as shown at block 1628.

As indicated by the process returning to block 1604, the above-described process is repeated for each temporary result pointer returned by the process of FIG. 15. Once all result pointers have been processed, the process passes from block 1604 to blocks 1640-1642, which illustrate the configuration API 1406 returning the result data structure to RTX 1420 and then terminating.

RTX 1420 reads Dial instances in interactive mode utilizing the method of FIG. 16A, for example, to initialize checkers that monitor portions of simulation model 1400 during simulation runs. The Dial settings of interest include not only those of top-level Dial instances, but also those of lower-level Dial instances affiliated with the portions of the simulation model 1400 monitored by the checkers.

Figure 16B:
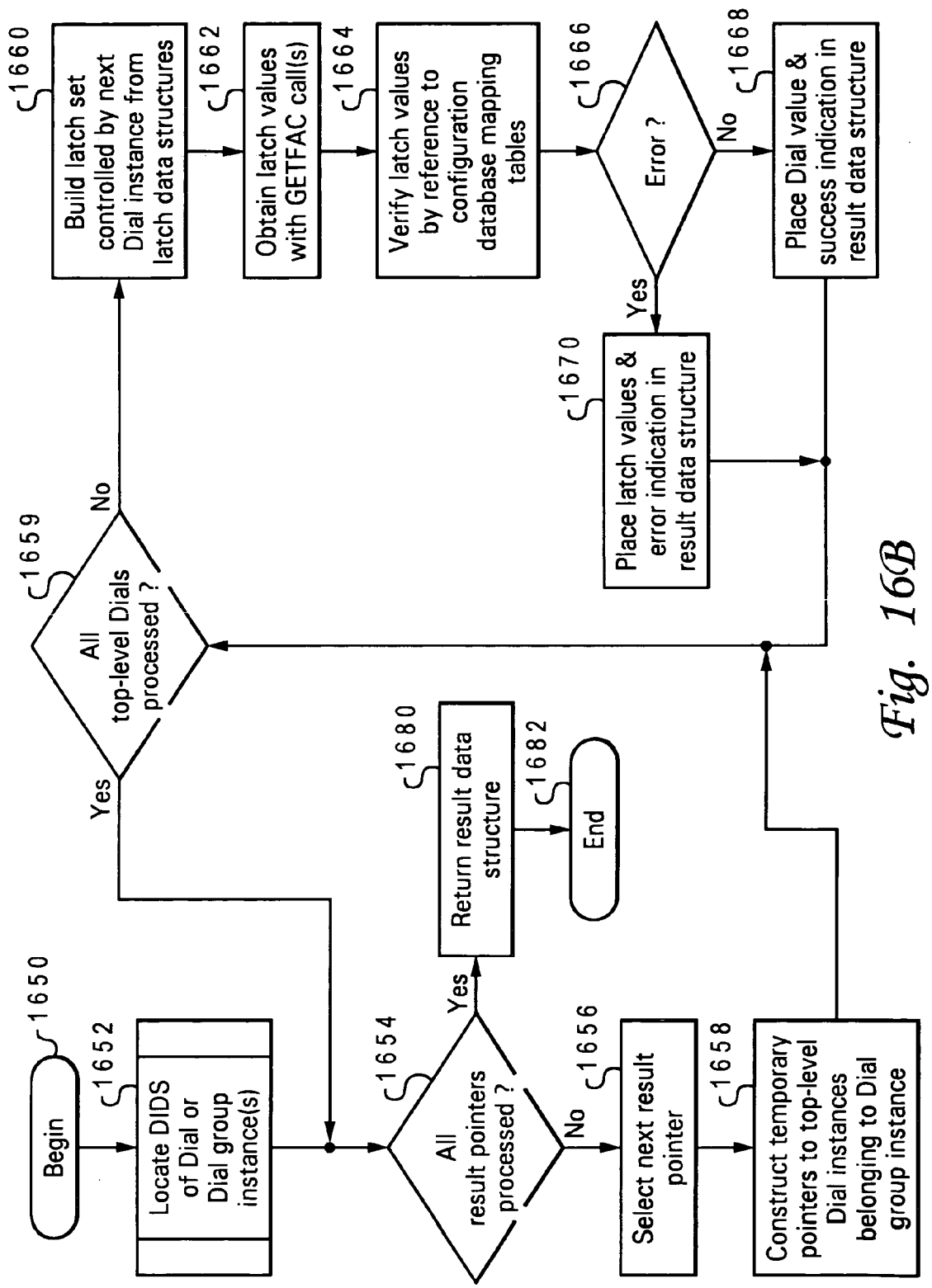
FIG. 16B is a high level logical flowchart of an exemplary method of reading a Dial group instance in an interactive mode during simulation of a digital design in accordance with the present invention.

Referring now to FIG. 16B, there is illustrated a high level logical flowchart of an exemplary process by which RTX 1420 reads a value of one or more Dial group instances in interactive mode, in accordance with the present invention. As can be seen by comparison of FIGS. 16A and 16B, the process of reading a Dial group instance is similar to the process of reading a Dial instance, but returns the value of one or more top-level Dial instances of possibly different Dial entities rather than one or more instances of the same Dial entity.

As shown, the process shown in FIG. 16B begins at block 1650 in response to receipt by a configuration API 1406 of a read_Dial_group() API call by RTX 1420. As indicated at block 1652, a configuration API 1406 responds to the read_Dial_group() API call by locating within configuration database 1404 one or more DIDSs 1202 of Dial group instances responsive to the API call utilizing the process described above with reference to FIG. 15.

The process then enters a loop at block 1654 in which each of the temporary result pointers generated by the process of FIG. 15 is processed. If all of the result pointers returned by the process of FIG. 15 have been processed, the process passes to block 1680, which is described below. If not, the process proceeds from block 1654 to block 1656, which illustrates the configuration API 1406 selecting a next result pointer to be processed. Next, at block 1658, the configuration API 1406 identifies and creates temporary pointers to all of the top-level Dial instances belonging to the Dial group instance corresponding to the DIDS 1202 referenced by the current result pointer. The top-level Dial instances are identified by locating the highest-level DIDS 1202 for each output pointer 1238 for which the type field 1220 in the associated DDDS 1220 specifies a type other than Dial group. In other words, the configuration API 1406 may have to search down through one or more hierarchical Dial groups to locate the relevant top-level Dial instances.

The process illustrated in FIG. 16B then enters a loop beginning at block 1659 in which each of the top-level Dial instances belonging to the Dial group corresponding to the Dial group DIDS 1202 referenced by the current result pointer is individually processed to obtain the value(s) of the top-level Dial instance(s). The process next proceeds to block 1660, which depicts configuration API 1406 utilizing output pointers 1238 of the DIDS 1202 of the first (or next) top-level Dial instance (and those of any lower-level DIDS 1202 in the Dial tree) to build a data set containing the latch names from the latch name fields 1244 of latch data structures 1204 corresponding to all configuration latches ultimately controlled by the top-level Dial instance. Next, as depicted at block 1662, the configuration API 1406 makes one or more API calls to GETFAC() API 1412 of simulator 1410 to obtain from simulation model 1400 the latch values of all of the configuration latches listed in the data set constructed at block 1660.

At block 1664, configuration API 1406 then verifies the latch values obtained from simulation model 1400 by reference to configuration database 1404, utilizing the same technique described above with reference to block 1624 of FIG. 16A. If at any point in this verification process, a Dial instance's output value generated by the verification process does not correspond to one of the legal values enumerated in its mapping table 1224, an error is detected at block 1666. Accordingly, the latch values read from simulation model 1400 and an error indication are placed in a result data structure, as illustrated at block 1670. If no error is detected, the Dial input value generated by the verification process and a success indication are placed in the result data structure, as shown at block 1668.

Following either block 1668 or block 1670, the process returns to block 1659, which represents a determination of whether or not all top-level Dials belonging to the Dial group corresponding to the DIDS 1202 referenced by the current result pointer have been processed. If not, the process returns to block 1660, which has been described.

However, if all top-level Dials have been processed, the process returns to block 1654, which illustrates a determination of whether or not all result pointers have been processed. If not, the next result pointer is processed at block 1656 and following blocks, which have been described. If, however, all result pointers have been processed, the process passes to block 1680-1682, which illustrates the configuration API 1406 returning the result data structure to RTX 1420 and then terminating.

Reading Dial and Dial group instances in a batch mode of RTX 1420 is preferably handled by configuration APIs 1406 in the same manner as interactive mode, with one exception. Whereas in interactive mode latch values are always read from simulation model 1440 via calls to GETFAC() API 1412 at blocks 1622 and 1662, in batch mode a latch value is preferably obtained from latch value field 1246 of a latch data structure 1204 in configuration database 1404 if latch set field 1248 indicates that the corresponding configuration latch has been set. If the configuration latch has not been set, the latch value is obtained from simulation model 1440 by a call to GETFAC() API 1412. This difference ensures that Dial settings made in batch mode, which may not yet have been reflected in simulation model 1400, are correctly reported.

Figure 17A:
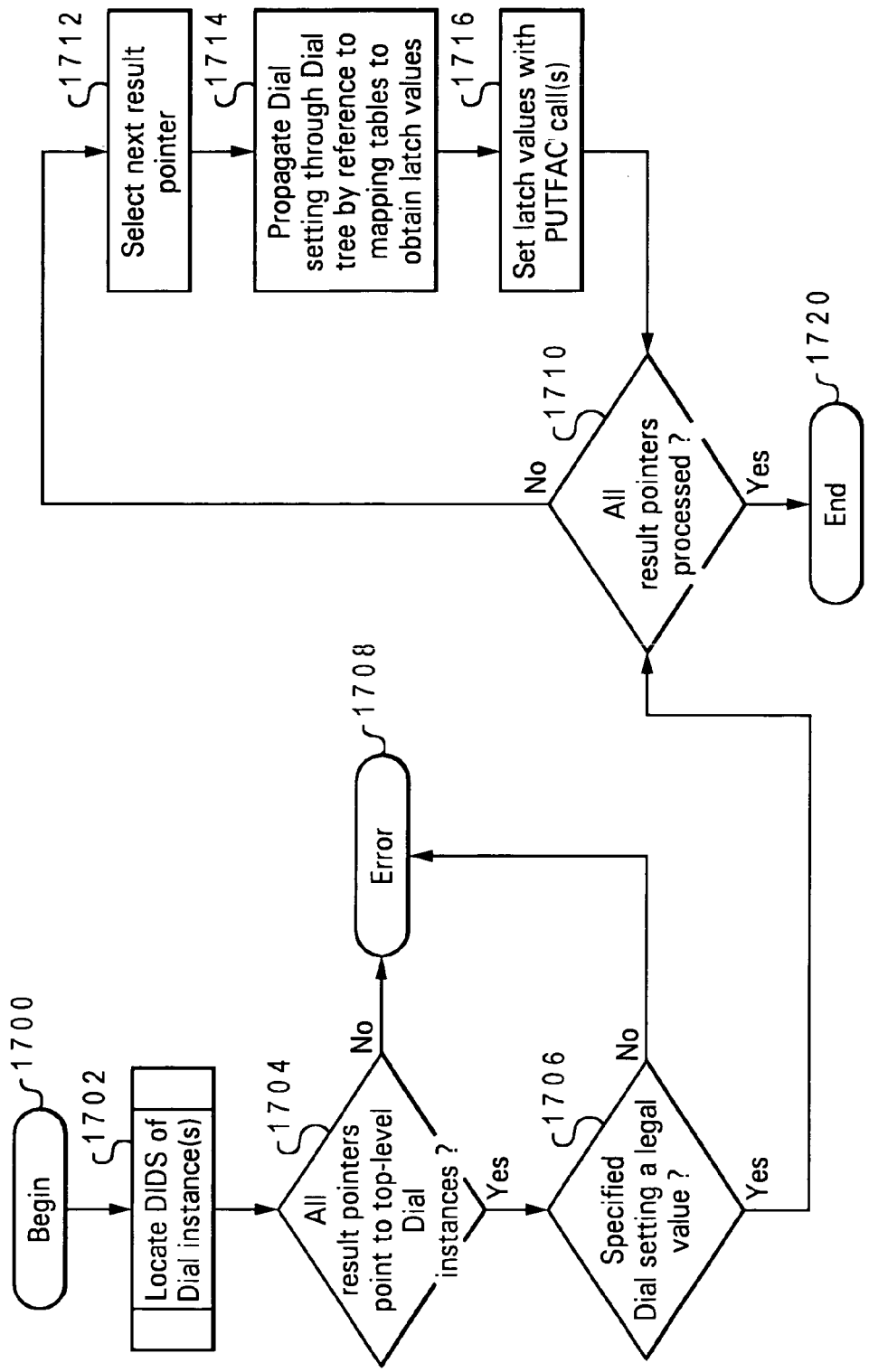
FIG. 17A is a high level logical flowchart of an illustrative method of setting a Dial instance in an interactive mode during simulation of a digital design in accordance with the present invention.

With reference now to FIG. 17A, there is illustrated a high level logical flowchart of an exemplary process by which an RTX sets a Dial instance in an interactive mode in accordance with the present invention. The process begins at block 1700 in response to receipt by a configuration API 1406 of a set_Dial() API call from RTX 1420. In response to the set_Dial() API call, the configuration API 1406 first locates and generates temporary result pointers pointing to the DIDS 1202 of the Dial instance(s) specified in the set_Dial() API call utilizing the technique described above with reference to FIG. 15, as illustrated at block 1702. Next, the configuration API 1406 determines at block 1704 whether or not all of the temporary result pointers point to DIDSs 1202 of top-level Dial instances. This determination can be made, for example, by examining the parent pointer 1233 of each such DIDS 1202 (and that of any higher level DIDS 1202 linked by a parent pointer 1233) and the type fields 1220 of the associated DDDSs 1200. The DIDS 1202 of a top-level Dial instance will have either a NULL parent pointer 1233 or a non-NULL parent pointer 1233 pointing to another DIDS 1202 that the type field 1220 of the associated DDDS 1200 indicates represents a Dial group. If any of the DIDSs 1202 referenced by the result pointers does not correspond to a top-level Dial instance, the process terminates at block 1708 with an error condition.

In response to a determination at block 1704 that all of the DIDSs 1202 referenced by the result pointers correspond to top-level Dial instances, a further determination is made at block 1706 whether or not the specified value to which the Dial instance(s) are to be set is one of the values specified in the mapping table 1224 of the associated DDDS 1200. If not, the process terminates with an error at block 1708. However, in response to a determination at block 1706 that the specified value to which the Dial instance(s) are to be set is one of the legal values, the process enters a loop including blocks 1710-1716 in which each result pointer is processed to set a respective Dial instance.

At block 1710, configuration API 1406 determines whether or not all result pointers have been processed. If so, the process terminates at block 1720. If, however, additional result pointers remain to be processed, the next result pointer to be processed is selected at block 1712. Next, at block 1714, configuration API 1406 propagates the Dial setting specified in the set_Dial() API call down the Dial tree headed by the top-level Dial instance associated with the DIDS 1202 referenced by the current result pointer. In order to propagate the desired Dial setting, mapping table 1224 in the DDDS 1200 associated with the DIDS 1202 referenced by the current result pointer is first referenced, if necessary, (i.e., for CDials and LDials) to determine the output values for each of output pointers 1238 in the output pointer array 1236 of the DIDS 1202 referenced by the current result pointer. These output values are propagated down the Dial tree as the input values of the next lower-level Dial instances, if any, corresponding to the DIDSs 1202 referenced by output pointers 1238. This propagation continues until a latch value is determined for each configuration latch terminating the Dial tree (which are represented in configuration database 1404 by latch data structures 1204). As shown at block 1716, as each latch value for a configuration latch is determined, the configuration API 1406 makes a call to PUTFAC() API 1414 to set the configuration latch in simulation model 1400 to the determined value utilizing the latch name specified within the latch name field 1244 of the corresponding latch data structure 1204.

Thereafter, the process returns to block 1710, which represents the processing of the top-level Dial corresponding to the next result pointer. After all result pointers are processed, the process terminates at block 1720.

Figure 17B:
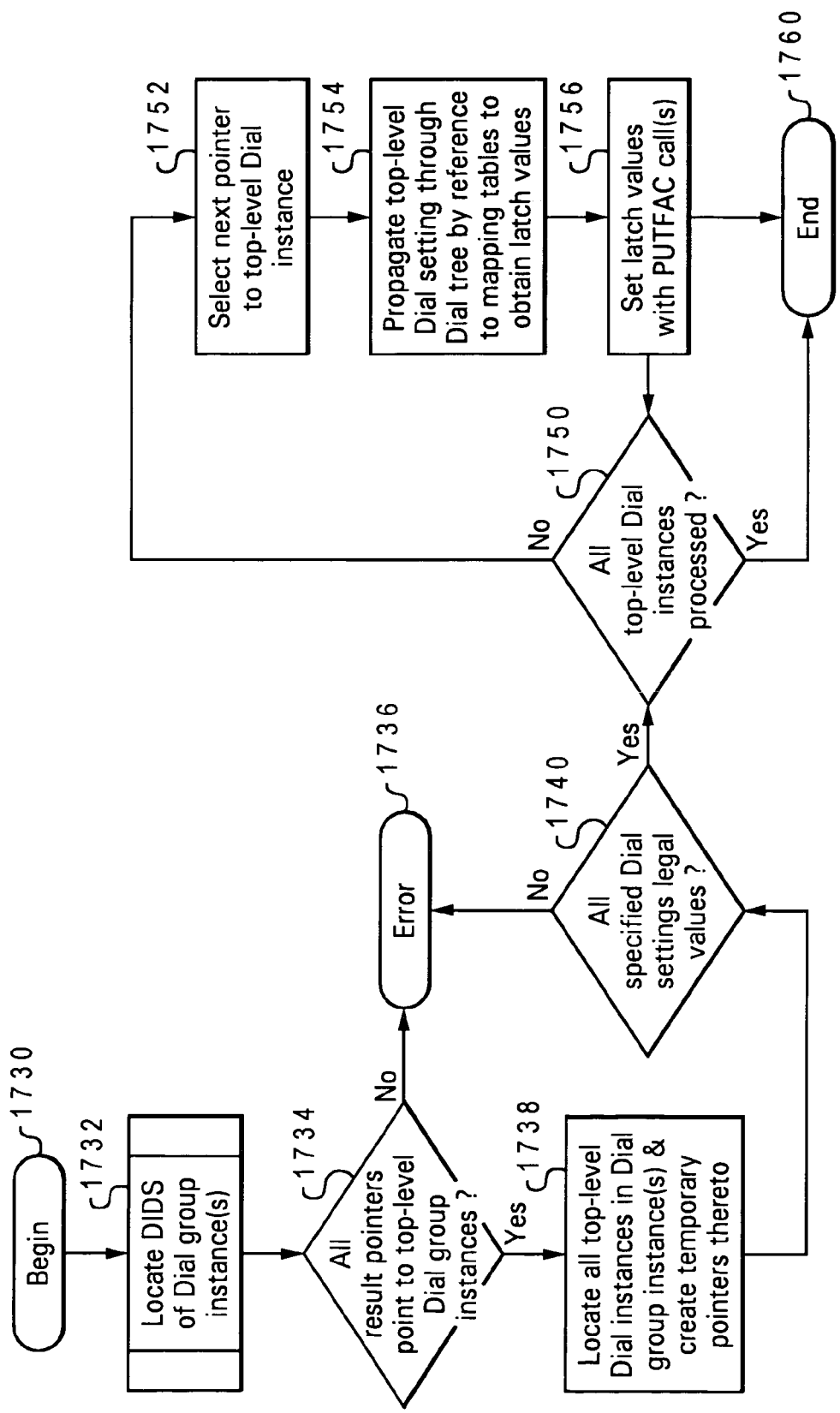
FIG. 17B is a high level logical flowchart of an exemplary method of setting a Dial group instance in an interactive mode during simulation of a digital design in accordance with the present invention.

Referring now to FIG. 17B, there is depicted a high level logical flowchart of an illustrative process by which an RTX sets a Dial group in an interactive mode in accordance with the present invention. The process begins at block 1730 in response to receipt by a configuration API 1406 of a set_Dial_group() API call from an RTX 1420. In response to the set_Dial_group() API call, the configuration API 1406 first locates and generates temporary result pointers pointing to the DIDS 1202 of the Dial group instance(s) specified in the set_Dial_group() API call utilizing the technique described above with reference to FIG. 15, as depicted at block 1732. Next, the configuration API 1406 determines at block 1734 whether or not all of the temporary result pointers point to DIDSs 1202 of top-level Dial group instances. This determination can be made, for example, by examining the parent pointer 1233 of each such DIDS 1202 to ascertain whether the parent pointer 1233 is NULL. If any of the DIDSs 1202 referenced by the result pointers does not correspond to a top-level Dial group (i.e., has a non-NULL parent pointer 1233), the process terminates at block 1736 with an error condition.

In response to a determination at block 1734 that each of the DIDSs 1202 referenced by the result pointers corresponds to a top-level Dial group, the process passes to blocks 1738-1740. Block 1738 illustrates configuration API 1406 locating all of the top-level Dial instances within each Dial group for which the corresponding DIDS 1202 is referenced by a result pointer. Then, as depicted at block 1740, the configuration API 1406 determines whether or not the specified value to which each top-level Dial instance is to be set is one of the values specified in the mapping table 1224 of the corresponding DDDS 1200. If not, the process terminates with an error at block 1736.

In the illustrated embodiment, the prevalidation steps illustrated at blocks 1734, 1738 and 1740 are performed prior to setting any Dial instances because it is deemed preferable to implement setting a Dial group instance as an atomic operation that either successfully sets all relevant top-level Dial instances or completely fails. In this manner, a complex condition in which some top-level Dial instances within the Dial group instance are set and others are not can be avoided.

In response to a determination at block 1740 that the specified value to which each top-level Dial instance is to be set is one of the legal values, the process enters a loop including blocks 1750-1756 in which each result pointer is processed to set the top-level Dial instance(s) belonging to each Dial group instance.

At block 1750, the configuration API 1406 determines whether or not all result pointers have been processed. If so, the process terminates at block 1760. If, however, additional result pointers remain to be processed, the next result pointer to be processed is selected at block 1752. Next, at block 1754, configuration API 1406 propagates the Dial setting specified for each top-level Dial in the set_Dial_group() API call down the Dial trees of the top-level Dial instances belonging to the Dial group instance corresponding to the DIDS 1202 referenced by the current result pointer. The propagation of Dial settings down the Dial trees is performed in the same manner discussed above with reference to block 1714 of FIG. 17A. As shown at block 1756, as each latch value for a configuration latch is determined, the configuration API 1406 makes a call to PUTFAC() API 1414 to set the configuration latch in simulation model 1400 to the determined value utilizing the latch name specified within the latch name field 1244 of the corresponding latch data structure 1204. Thereafter, the process returns to block 1750, which represents the processing of the top-level Dial corresponding to the next result pointer, if any.

Figure 18:
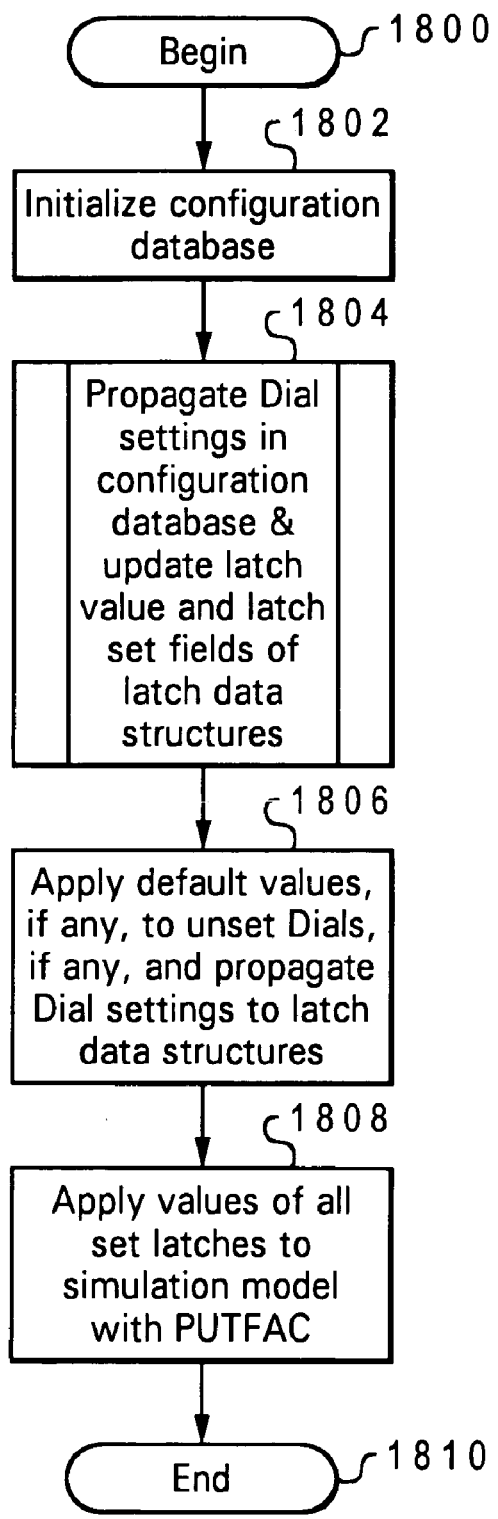
FIG. 18 is a high level logical flowchart of an illustrative method of setting a Dial instance or Dial group instance in a batch mode during simulation of a digital design in accordance with the present invention.

With reference now to FIG. 18, there is illustrated a high level logical flowchart of an exemplary method of setting Dial and Dial group instances in batch mode in accordance with the present invention. As illustrated, the process begins at block 1800 and thereafter proceeds to block 1802, which illustrates RTX 1420 initializing configuration database 1404 by calling a configuration API 1406 (e.g., start_batch ()) in order to initialize configuration database 1404. The start_batch() API routine initializes configuration database 1404, for example, by setting each Dial set field 1239 and latch set field 1248 in configuration database 1404 to FALSE. By resetting all of the "set" fields in configuration database 1404, the Dials and configuration latches that are not set by the current batch mode call sequence can be easily detected, as discussed below.

Following initialization of configuration database 1404, RTX 1420 issues a batch mode set_Dial() or set_Dial_group() API call to enter settings for Dial instances and their underlying configuration latches into configuration database 1404. A configuration API 1406 responds to the API call in the same manner described above with respect to FIG. 17A (for setting Dial instances) or FIG. 17B (for setting Dial group instances), with two exceptions. First, when any top-level or lower-level Dial instances are set, whether as a result of a set_Dial() or set_Dial_group() API call, the Dial set field 1239 of the corresponding DIDS 1202 is set to TRUE. Second, no latch values are written to simulation model 1400 by the "set" API routines, as illustrated at blocks 1716 and 1756 of FIGS. 17A-17B. Instead, the latch values are written into latch value fields 1246 of the latch data structure 1204 corresponding to each affected configuration latch, and the latch set field 1248 is updated to TRUE. In this manner, the Dial instances and configuration latches that are explicitly set by the API call can be readily identified during subsequent processing.

Following block 1804, the process passes to blocks 1806-1808, which illustrate RTX 1420 calling an end_batch() API routine among configuration APIs 1406 to complete the batch mode access. As illustrated at block 1806, the end_batch() API routine first applies default values, if any, to any Dial instances not explicitly set at block 1804, if a default mode is enabled (e.g., through a parameter of the end_batch() API call or an operational parameter of RTX 1420). To apply default values, the end_batch() API routine locates all unset top-level Dial instances (i.e., those for which Dial set field 1239 is FALSE) in configuration database 1404 and applies the default value, if any, specified in the default field 1229 of the associated DDDS 1200. These default values are propagated down the Dial tree of each affected top-level Dial and utilized to set latch value fields 1246, Dial set field 1239 and latch set field 1248 in the manner described above with reference to block 1804. The end_batch() API routine then traverses the Dial tree of each top-level CDial that remains unset following the application of default values to top-level Dials and applies the default value of the next highest-level Dial instance in each branch of the Dial tree that has a specified default value. Again, these default values are propagated down the Dial tree of each affected lower-level Dial and utilized to set latch value fields 1246, Dial set field 1239 and latch set field 1248 in the manner described above with reference to block 1804. This methodology of applying default values allows default values higher in a Dial tree to have precedence over default values lower in the Dial tree.

After default values have been optionally applied as illustrated at block 1806, the end_batch() API routine utilizes latch pointer array 1210 to examine each latch data structure 1204 in configuration database 1404. For each latch data structure 1204 in which latch set field 1248 has the value TRUE, the end_batch() API routine issues a call to PUTFAC() API 1414 of simulator 1410 to update simulation model 1400 with the latch value contained in latch value field 1246. Thereafter, the batch process terminates at block 1810.

Configuration APIs 1406 preferably further include a find_unset_latch() API that, following a batch mode setting of Dial or Dial group instances in configuration database 1404, audits all of the latch data structures 1204 in configuration database 1204 by reference to latch pointer array 1210 in order to detect configuration latches that have not been configured by an explicit or default setting (i.e., those having latch set field 1248 set to FALSE). For each such unset configuration latch, the find_unset_latch() API preferably returns the fully qualified instance name of the configuration latch from latch name field 1244 in the corresponding latch data structure 1204 and the fully qualified instantiation identifier of the top-level Dial instance that controls the unset latch. The find_unset_latch() API thus provides an automated mechanism for a user to verify that all Dial and latch instances requiring an explicit or default setting are properly configured for a simulation run.

Configuration APIs 1406 preferably further include a check_model() API that, when called, utilizes top-level pointer array 1206 to verify by reference to the appropriate mapping tables 1224 that each top-level CDial and. LDial instance in simulation model 1400 is set to one of its legal values. Any top-level LDial or CDial set to an illegal value is returned by the check_model() API.

The Dial and Dial group primitives introduced by the present invention can be employed not only to configure a simulation model of a digital design as described above, but also to configure hardware realizations of the digital design for laboratory testing and customer use. In accordance with an important aspect of the present invention, hardware realizations of the digital design are configured by reference to a hardware configuration database, which like configuration databases 814 and 1404 discussed above, is derived from configuration specification statements coded by the designers. In this manner, continuity in configuration methodology exists from design, through simulation and laboratory testing, to commercial deployment of a digital design.

Figure 19:
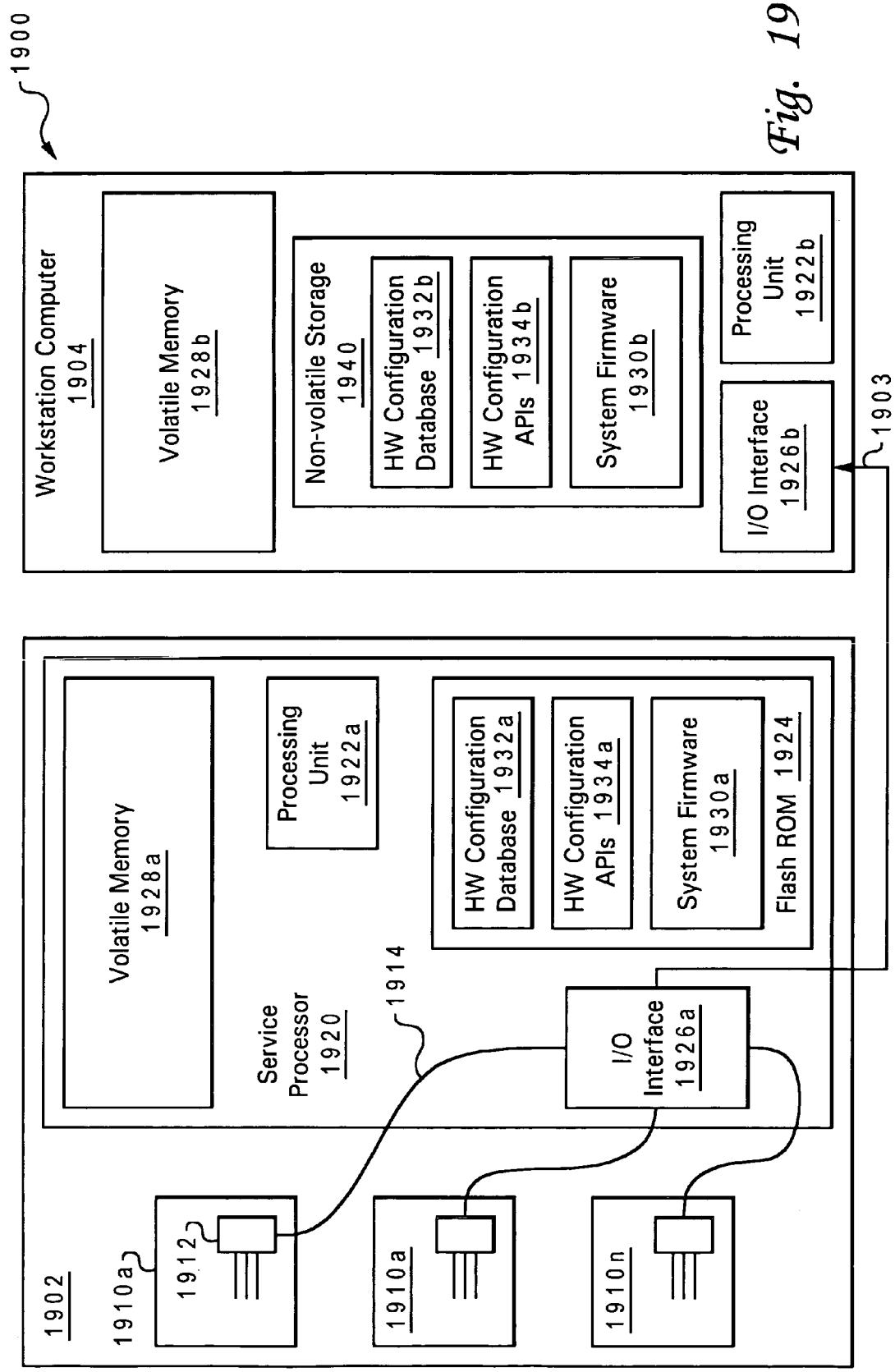
FIG. 19 is a block diagram depicting an exemplary laboratory testing system in accordance with the present invention.

Referring now to FIG. 19, there is illustrated a high-level block diagram of a laboratory testing system for testing and debugging hardware realizations of one or more digital designs in accordance with an embodiment of the present invention. As illustrated, the laboratory testing system 1900 includes a data processing system 1902, which is intended for commercial sale and deployment. For laboratory testing and debugging, data processing system 1902 is coupled by a test interface 1903 to a workstation computer 1904 that communicates with data processing system 1902 via test interface 1903 to configure the various components of data processing system 1902 for proper operation. When commercially deployed, data processing system 1902 includes the illustrated components, but is not typically coupled to workstation computer 1904 by test interface 1903.

Data processing system 1902 may be, for example, a multiprocessor computer system, such as data processing system 6 of FIG. 1. As such, data processing system 1902 includes multiple integrated circuit chips 1910 representing the various processing units, controllers, bridges and other components of a data processing system. As is typical of commercial data processing systems, data processing system 1902 may contain multiple instances of some integrated circuit chips, such as integrated circuit chips 1910a, and single instances of other integrated circuit chips, such as integrated circuit chip 1910n.

In addition to their respective functional logic, integrated circuit chips 1910 each have a respective test port controller 1912 that supports external configuration of the integrated circuit chip utilizing multiple scan chains, as discussed in detail below with reference to FIG. 20. To permit such external configuration, each test port controller 1912 is coupled by a test access port (TAP) 1914 to a service processor 1920 within data processing system 1902.

Service processor 1920 is a general-purpose or special-purpose computer system utilized to initialize and configure data processing system 1902, for example, at power-on or in response to a reboot. Service processor 1920 includes at least one processing unit 1922a for executing software instructions, a flash read-only memory (ROM) 1924 providing non-volatile storage for software and data, an I/O interface 1926a interfacing service processor 1920 with test port controllers 1912 and workstation computer 1904, and a volatile memory 1928a that buffers instructions and data for access by processing unit 1922a.

Among the software and data stored in flash ROM 1924 is system firmware 1930a. System firmware 1930a is executed by processing unit 1922a of service processor 1920 at power-on to sequence power to integrated circuit chips 1910, perform various initialization procedures and tests, synchronize communication between integrated circuit chips 1910, and initiate operation of the functional clocks. System firmware 1930a controls the startup behavior of integrated circuit chips 1910 by communication via test access ports 1914.

In addition to system firmware 1930a, flash ROM 1924 stores hardware (HW) configuration APIs 1934a and a HW configuration database 1932a describing integrated circuit chips 1910. As described below, during commercial deployment, processing unit 1922a calls various HW configuration APIs 1934a to access HW configuration database 1932a in order to appropriately configure integrated circuits 1910 via I/O interface 1926a and TAPs 1914.

Workstation computer 1904, which may be implemented, for example, as a multiprocessor computer system like data processing system 6 of FIG. 1, includes many components that are functionally similar to those of service processor 1920. Accordingly, like reference numerals designate processing unit 1922b, volatile memory 1928b, I/O interface 1926b, and the system firmware 1930b, HW configuration database 1932b, and HW configuration APIs 1934b residing in non-volatile storage 1940 (e.g., disk storage). It will be appreciated by those skilled in the art that, because the system firmware 1930b, HW configuration database 1932b and HW configuration APIs 1934b residing in non-volatile storage 1940 are specifically designed to initialize and configure data processing system 1902 in the context of laboratory testing and debugging, they may have smaller, larger or simply different feature sets and capabilities than the corresponding software and data within flash ROM 1924.

During laboratory testing and debugging, workstation computer 1904 assumes most of the functions of service processor 1920. For example, workstation computer 1904 initializes and configures data processing system 1902 by executing system firmware 1930b and various HW configuration APIs 1934b in order to generate various I/O commands. These I/O commands are then communicated to data processing system 1902 via test interface 1903 and I/O interfaces 1926a and 1926b. System firmware 1930a, which executes within service processor 1920 in a "bypass mode" in which most of its native functionality is disabled, responds to these external I/O commands by issuing them to integrated circuit chips 1910 via test access ports 1914 in order to initialize and configure integrated circuit chips 1910.

Figure 20:
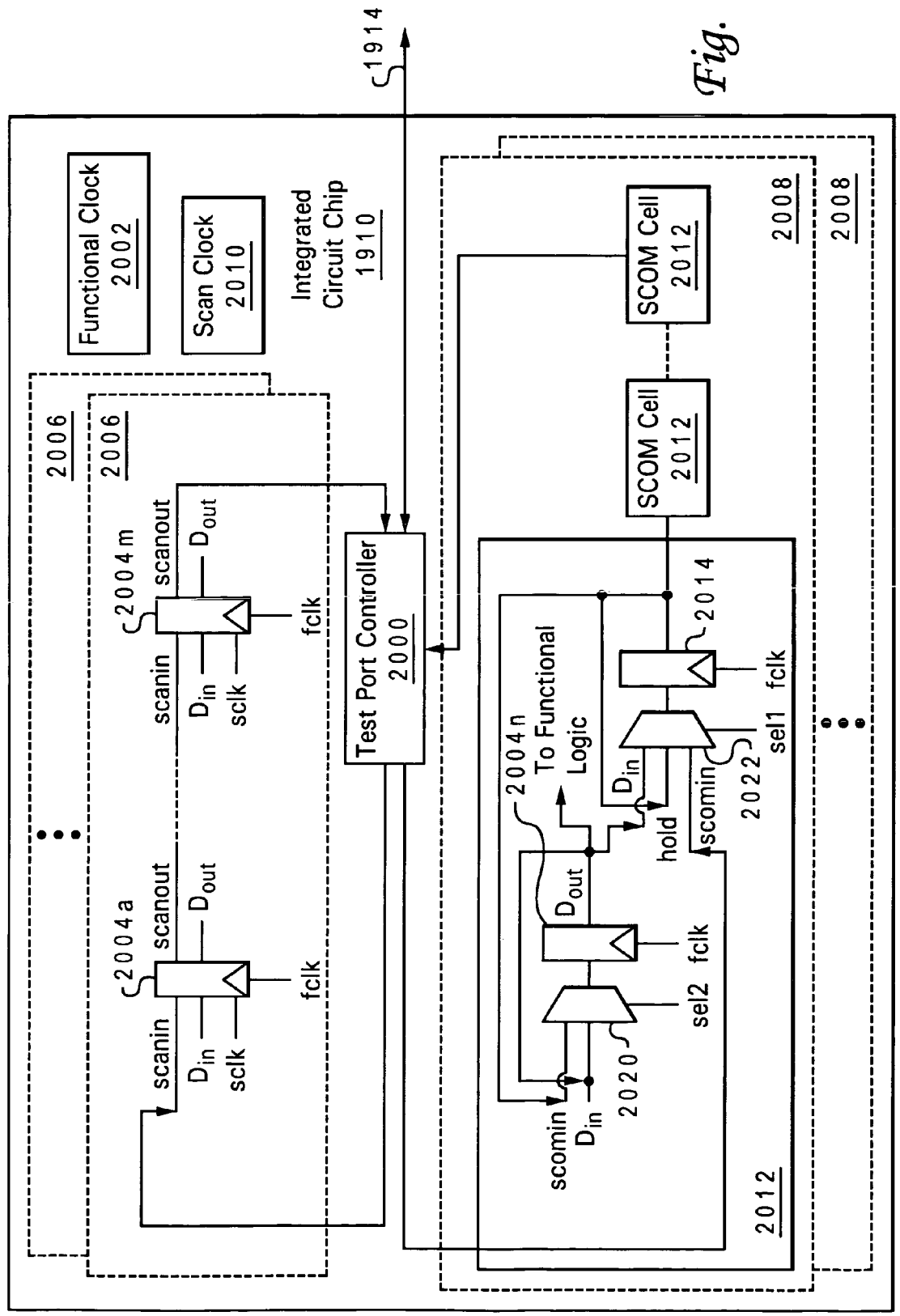
FIG. 20 is a more detailed block diagram of an integrated circuit chip within a data processing system forming a portion of the laboratory testing system of FIG. 19.

With reference now to FIG. 20, there is illustrated a more detailed block diagram of an exemplary integrated circuit chip 1910 in accordance with the present invention. As noted above, integrated circuit chip 1910 includes a test port controller 2000 supporting external communication with I/O interface 1926 of service processor 1920 of FIG. 19 and control of various internal functions of integrated circuit chip 1910, including the operation of functional clock 2002 and scan clock 2010. Integrated circuit chip 1910 further includes functional logic (not explicitly illustrated) comprising the digital integrated circuitry that performs the "work" the integrated circuit is designed to do, for example, processing software instructions, in response to the clock pulses of functional clock 2002. Throughout the functional logic is distributed a plurality of functional latches 2004 that, during normal functional operation of the functional logic (i.e., when functional clock 2002 clocks the functional logic), hold bits representing the dynamic state of the functional logic and data and/or instructions. These functional latches 2004 include those that hold mode and configuration bits utilized to configure the functional logic in a desired configuration.

As shown, groups of functional latches 2004 are interconnected to form multiple test scan chains 2006 and multiple SCOM (scan communication) chains 2008. Although not illustrated for the sake of clarity, some functional latches 2004 are, in practice, members of both a test scan chain 2006 and an SCOM chain 2008. The test scan chains 2006 are utilized to scan bits into functional latches 2004 in response to pulses of scan clock 2010, and the SCOM chains 2008 are utilized to scan bits into functional latches 2004 in response to pulses of functional clock 2002.

Functional clock 2002 and scan clock 2010 do not both output pulses at the same time to prevent a conflict between values loaded into functional latches 2004.

As depicted, each functional latch 2004 in a test scan chain 2006 includes at least two data inputs, a scan input (scanin) and a functional input ($D_{in}$), and two clock inputs, a scan clock input (sclk) and a functional clock input (fclk). Each functional latch 2004 further includes at least two data outputs, namely, a scan output (scanout) and a functional output ($D_{out}$). To form a test scan chain 2006, the scan input of a first functional latch 2004 and the scan output of a last functional latch 2004 are coupled to test port controller 2000, and the scan output of each functional latch 2004 in the test scan chain 2006 (other than the last) is connected to the scan input of a next functional latch 2004.

Each functional latch 2004 latches in the data bit present at its scanin and latches out its former value at scanout in response to a pulse of scan clock 2010 on sclk, and latches in the data bit present at Din and latches out its former value in response to receipt of a pulse of functional clock 2002 on fclk. Thus, by repeated pulsing of scan clock 2010, the functional latches 2004 forming a test scan chain 2006 transfer data bits in from and out to test port controller 2000 in a "bit-bucket brigade" fashion, thereby allowing test port controller 2000 to read or write one or more functional latches 2004 in a test scan chain 2006.

SCOM chains 2008 are utilized to read and write functional latches 2004 when functional clock 2002 is active and scan clock 2010 is inactive. Each SCOM chain 2008 includes multiple sequentially connected SCOM cells 2012, the first and last of which are connected to test port controller 2000 to permit test port controller 2000 to scan data bits into and out of SCOM cells 2012. As depicted, in the exemplary embodiment, each SCOM cell 2008 contains a functional latch 2004 forming a portion of an "SCOM register," as well as a shadow latch 2014 forming a portion of a "shadow register". It is preferred if all shadow latches 2014, like functional latches 2004, also belong to a test scan chain 2006.

As shown, each functional latch 2004 in each SCOM cell 2012 is connected to an associated multiplexer 2020 having a scan input (scomin) coupled to the output of the corresponding shadow latch 2014 and a data input ($D_{in}$) coupled by a hold path to the data output ($D_{out}$) of the associated functional latch 2004. Multiplexer 2020 selects the data bit present at one of data input ($D_{in}$) and scomin as an input of functional latch 2004 in response to select signal sel2. Functional latch 2004 latches the selected data bit in response to functional clock fclk.

Shadow latch 2014 in each SCOM cell 2012 is similarly connected to an associated multiplexer 2022 having a data input ($D_{in}$) coupled to the data output ($D_{out}$) of functional latch 2004, a hold input coupled by a hold path to the output of shadow latch 2014, and scan input (scomin). In the first SCOM cell 2012, the scan input is connected to test port controller 2000, and in the remaining SCOM cells 2012, the scan input is connected to the output of the shadow latch 2014 in the preceding SCOM cell 2012. The output of the shadow register 2014 of the last SCOM cell 2012 in each SCOM chain is connected to test port controller 2000. Multiplexer 2022 selects among the data bits present at its inputs as the input of the associated shadow latch 2014 in response to select signal sell. Shadow latch 2014 latches the selected data bit in response to functional clock fclk.

The chain of shadow registers is used to read values from and write values to the associated SCOM registers. For example, to set an SCOM register, test port controller 2000 scans a new value into shadow latches 2014 via the scomin inputs of multiplexers 2022 by asserting appropriate values of selects sel1. Once all shadow latches 2014 have been loaded, test port controller 2000 controls select inputs sel2 to cause functional registers 2004 to load the values from shadow latches 2014. To read a value from the SCOM registers, test port controller 2000 drives sel1 to read the values out of the functional latches 2004 into the shadow latches 2014 and then scans the values out of the shadow latches 2014 by asserting appropriate values of selects sel1.

In the exemplary embodiment, SCOM chains 2008 employ shadow latches 2014 to read and write functional latches 2004 to avoid disrupting the proper functional operation of integrated circuit chip 1910, or even data processing system 1902. By loading all shadow latches 2014 prior to updating any functional latches 2004, all functional latches 2004 within a SCOM chain 2008 can be updated at once without disrupting their values for multiple cycles of functional clock 2002. It should be understood that the particular implementation of SCOM chains 2008 illustrated in FIG. 20 is not required to practice the present invention, and that other alternative designs may be employed, including some that do not include shadow latches 2014.

Thus, by loading the appropriate values into functional latches 2004 and by appropriate control of functional clock 2002 and scan clock 2010, each test port controller 2000 can initialize and configure its integrated circuit chip 1910 in a desired manner based upon inputs from service processor 1920 and/or workstation computer 1904.

In order to configure hardware functional latches 2004 in the manner described above, a HW configuration database 1932 that accounts for the differences between simulation and hardware environments must be generated. In general, the structure and contents of HW configuration database 1932 reflect at least two central differences from the configuration database 814 for simulation described above.

The first difference is in the manner in which latches are addressed in hardware. In particular, instead of utilizing a fully qualified instantiation identifier for the configuration latch as in simulation, each hardware functional latch 2004 within a particular integrated circuit 1910 is addressed and accessed for test scanning by an ordered pair consisting of a scan chain (or ring) identifier specifying a particular test scan chain 2006 and an offset indicating the latch's bit position in the test scan chain 2006. Functional latches 2004 within SCOM rings 2008 are similarly addressed and accessed for SCOM scanning using a similar ordered pair of (ring identifier, offset), specifying a particular SCOM chain 2008 and the offset of the corresponding shadow latch 2014. Importantly, the SCOM ring identifier and offset for a particular functional latch 2004 do not have the same values as the corresponding test scan ring identifier and offset. In fact, in alternate SCOM implementations, different SCOM hardware may be used, and the offset can be expressed as a tuple: (ring ID, register, offset). It will therefore be appreciated that functional registers 2004 may be addressed and accessed utilizing multiple access methods, each of which may have its own addressing scheme, all of which will likely differ from that employed in simulation.

A second important difference between HW configuration database 1932 and the configuration database 814 employed in simulation is the overall database structure. As described above, configuration database 814 is a monolithic database that may be utilized to represent an arbitrarily selected digital design of any size or complexity by nesting design entities hierarchically. A new configuration database 814 is generated by configuration compiler 808 for each different digital design that is simulated. Although this approach is satisfactory in a simulation environment, the monolithic database structure employed in simulation does not correspond to the actual physical mechanisms utilized to access and set hardware latches in a hardware digital design. Moreover, it is desirable in a laboratory environment to avoid developing an entirely new system firmware 1930 and HW configuration database 1932 for each different hardware permutation. For example, it is desirable to minimize development time and cost by reusing some or all of a particular HW configuration database 1932 and system firmware 1930 to initialize and configure each server computer in a server product line supporting between 8 and 32 processing units and 1 to 4 different memory controllers.

Consequently, as described in detail below, HW configuration database 1932 is preferably structured as a federation of smaller databases that each corresponds to a particular type (not instance) of integrated circuit chip present within the hardware digital design. This database structure supports construction of a HW configuration database 1932 for a hardware system of any desired size and complexity from the same "building block" per-chip-type databases. Moreover, this database structure reflects the fact that hardware latches are accessed by system firmware 1930 on a per-chip basis.

Figure 21:
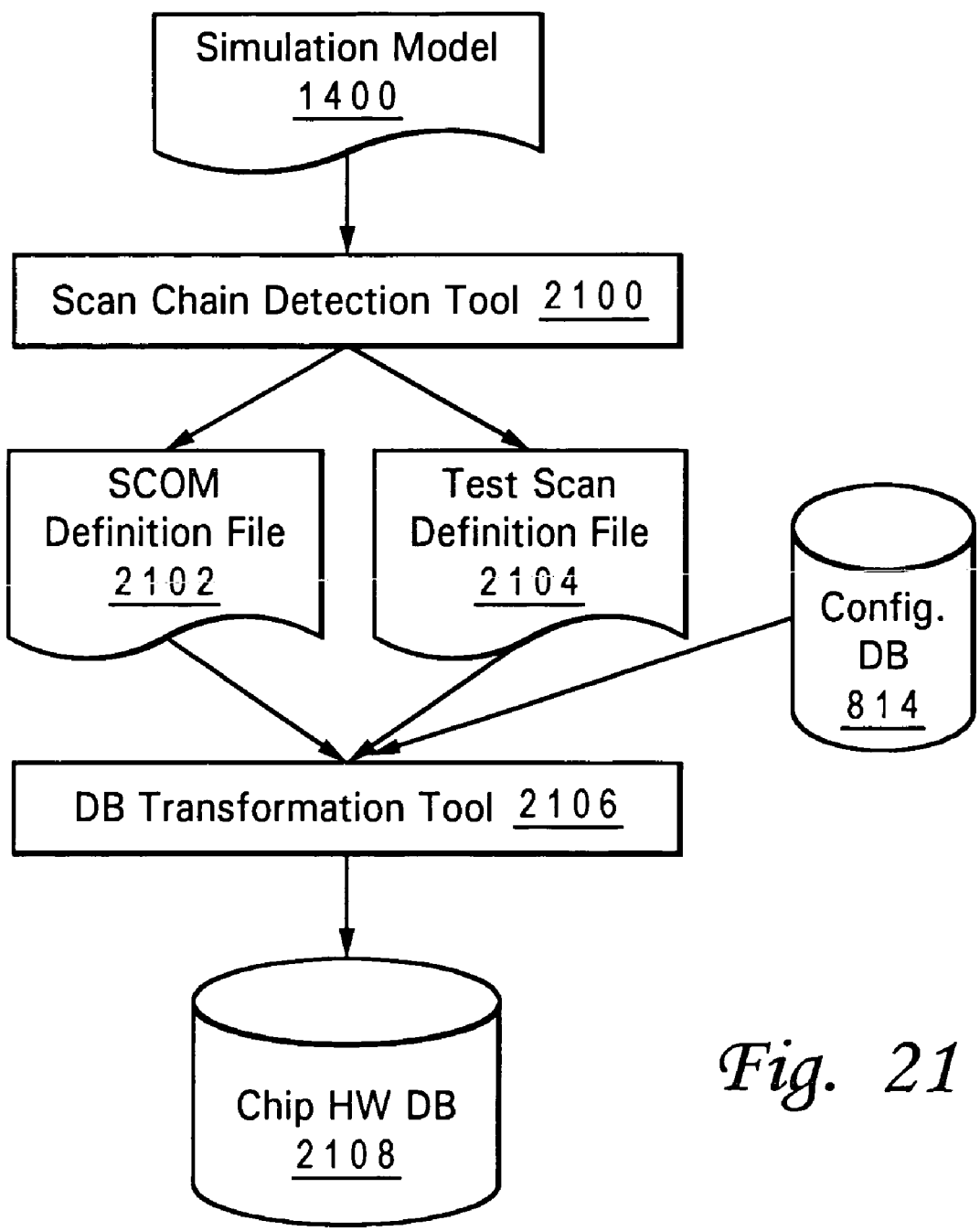
FIG. 21 is a high level flow diagram of an illustrative process for transforming a simulation configuration database to obtain a chip hardware database suitable for use in configuring a hardware realization of a digital design.

Referring now to FIG. 21, there is depicted a high level flow diagram of an exemplary process by which the simulation configuration database 814 of each integrated circuit chip is transformed to obtain a chip HW database utilized to construct a HW configuration database 1932 suitable for laboratory testing and debugging and commercial deployment. The illustrated process may be implemented through the execution of software on data processing system 6 of FIG. 1.

The process begins with the execution of a scan chain detection tool 2100. Scan chain detection tool 2100 processes the simulation model 1400 of each integrated circuit chip 1910 within a target hardware system, such as data processing system 1902, to produce a respective output file corresponding to each functional latch access path/method for latches within the integrated circuit chip 1910. For example, in the exemplary embodiment, scan chain detection tool 2100 generates a test scan definition file 2104 corresponding to test scanning and a SCOM definition file 2102 corresponding to SCOM scanning. Each of these files 2102, 2104 provides, for latches within simulation model 1400, a correspondence between the latch's scan ring identifier and offset (or other hardware address for the associated access method) and its fully qualified latch instance name for simulation purposes.

The test scan definition file 2104 and SCOM definition file 2102 and the simulation configuration database 814 for the integrated circuit chip are then processed by a database transformation tool 2106 to generate a chip HW database 2108 that can be utilized as a building block to obtain a HW configuration database 1932 for a hardware system of any arbitrary system size and component list.

Figure 22A:
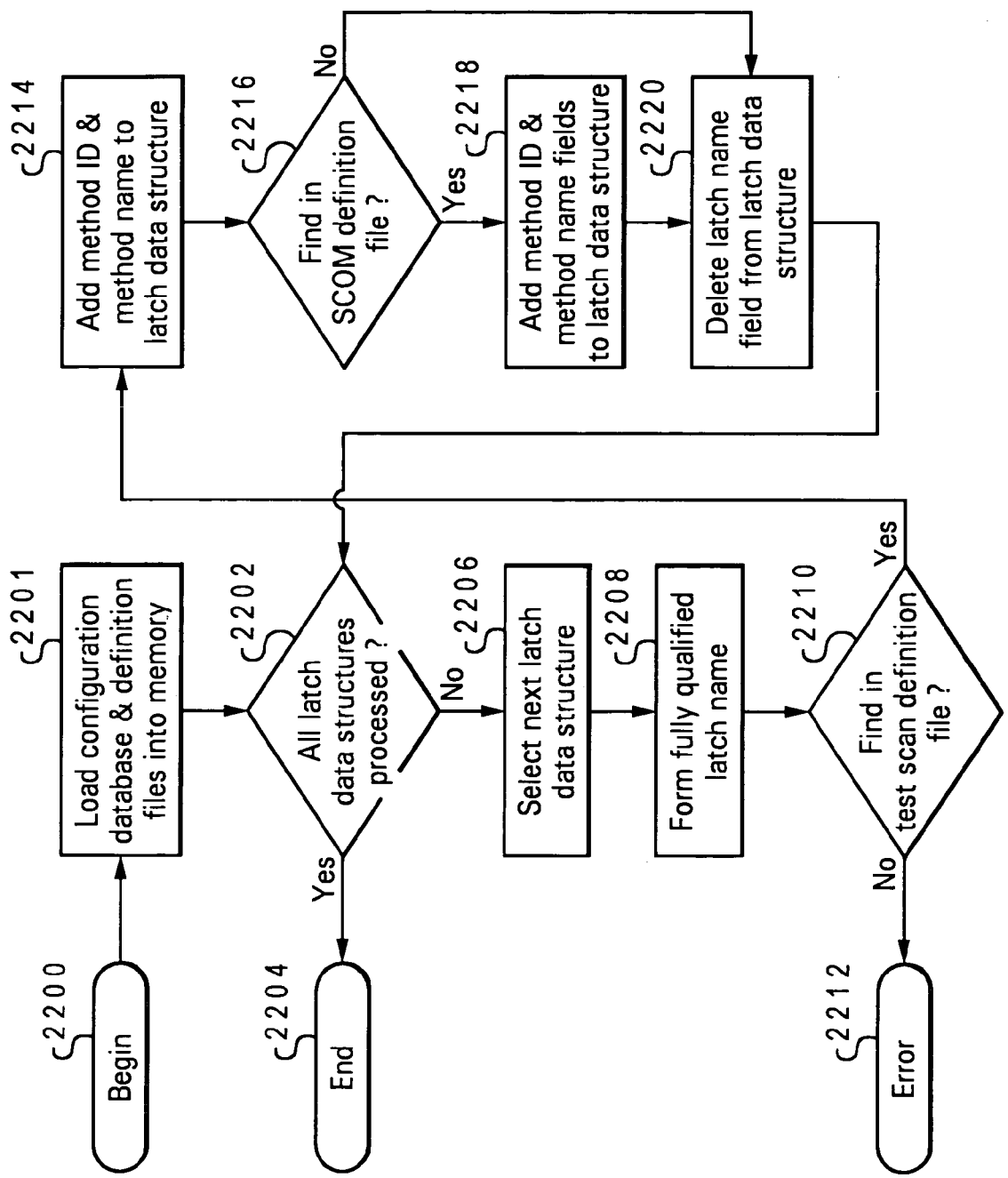
FIG. 22A is a high level logical flowchart of an exemplary method of transforming a configuration database to obtain a chip hardware database in accordance with the present invention.

With reference now to FIG. 22A, there is illustrated a high level logical flowchart of an exemplary process by which database transformation tool 2106 generates a chip HW database 2108 from the corresponding simulation configuration database 814 for the integrated circuit chip by reference to test scan definition file 2104 and SCOM definition file 2102. As illustrated, the process begins at block 2200 and then proceeds to block 2201, which illustrates loading the simulation configuration database 814 from non-volatile data storage into volatile memory and augmenting its fields in the manner discussed above with respect to FIG. 13 to obtain an expanded configuration database 1404. Test scan definition file 2104 and SCOM definition file 2102 are also loaded into volatile memory.

Next, at block 2202, a determination is made whether or not all latch data structures 1204 referenced by latch pointer array 1210 have been processed. If so, the process terminates at block 2204. However, if all latch data structures 1204 have not yet been processed, the process passes from block 2202 to block 2206, which illustrates the selection for processing of the latch data structure 1204 pointed to by the next latch pointer 1254 in latch pointer array 1210. Next, at block 2208, the fully qualified latch name of the latch corresponding to the latch data structure 1204 under consideration is formed by using the parent pointer 1242 to access the contents of instance name field 1234 of the Dial instance controlling the latch and appending those contents to the contents of latch name field 1244.

Figure 22B:
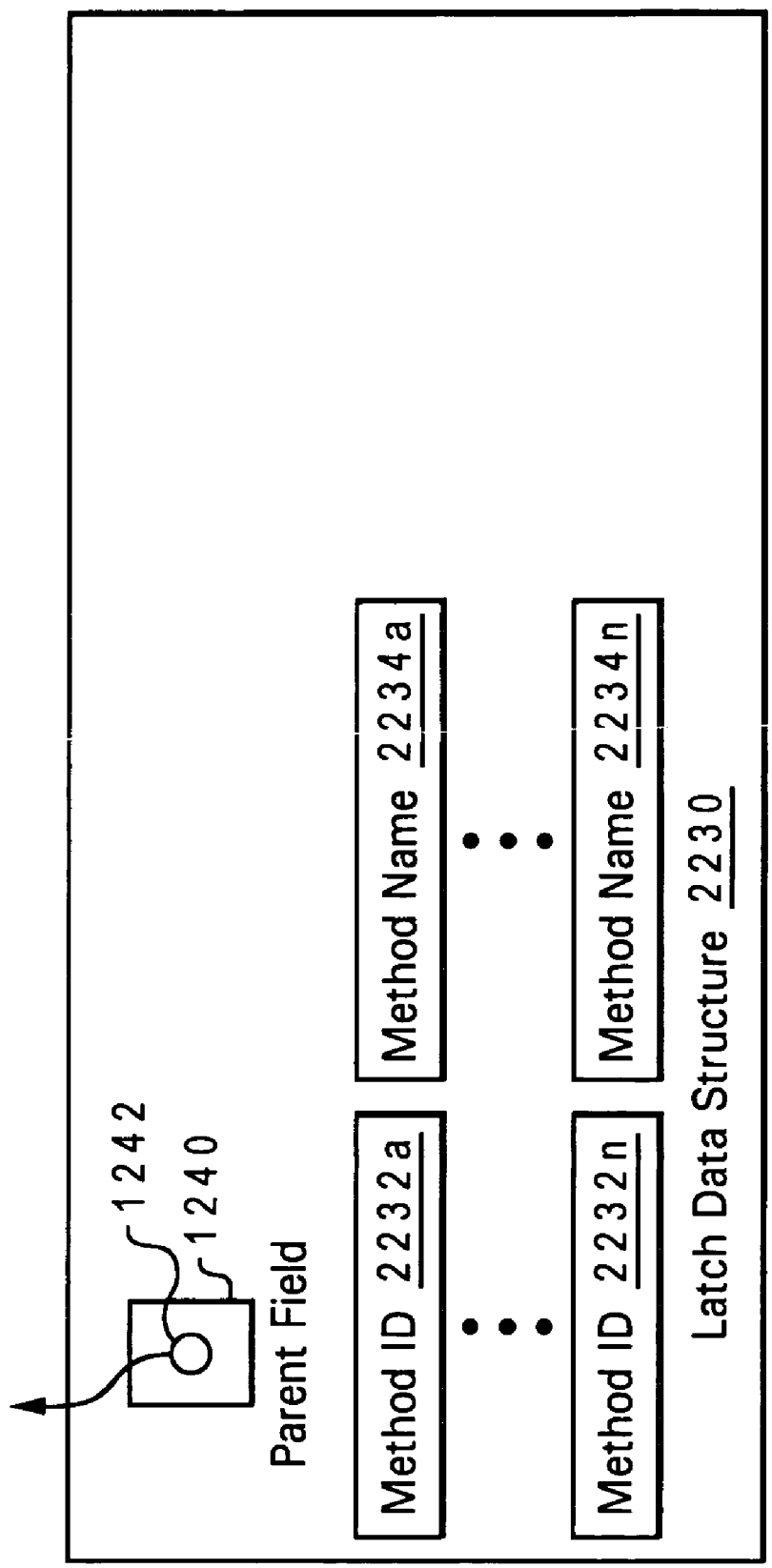
FIG. 22B depicts an illustrative embodiment of a latch data structure within a chip hardware database following the transformation process illustrated in FIG. 22A.

Test scan definition file 2104 is then searched for this fully qualified latch name, as depicted at block 2210. If the fully qualified latch name is not found within test scan definition file 2104, an error is flagged at block 2212 because, in the exemplary embodiment, all configurable latches must be scannable. Otherwise, database transformation tool 2106 calls the API routine add_access_method(method_id, method_name) at block 2214 to augment latch data structure 1204 to form a new latch data structure 2230. The method_id parameter of the API calls identifies a particular access method (e.g., with a string or integer), and the method_name parameter specifies a "name" utilized by the associated access method to access, in hardware, the latch corresponding to the new latch data structure 2230. As illustrated in FIG. 22B, the new latch data structure 2230 is created at block 2214 by adding to latch data structure 1204 a method ID field 2232a specifying a method identifier of this access method (which is "0" by convention) and a method name field 2234a specifying a test scan ring identifier and offset value for the latch.

The process proceeds from block 2214 to block 2216, which represents repeating the search for the fully qualified latch instance name performed at block 2210 using the definition file for the next access method, in this case, SCOM definition file 2102. If no match for the fully qualified latch instance name is found within SCOM definition file 2102, no error is logged because not all latches belong to SCOM chains, and the process simply passes to block 2220, which is described below. If, on the other hand, a match is found, the add_access_method() API routine is again called at block 2218 to augment latch data structure 2230 with a method ID field 2232n specifying the method identifier of this access method and a method name field 2234n specifying a SCOM scan ring identifier and offset value for the latch.

Finally, at block 2220, the API routine delete_latch_name() is called to delete latch name field 1244 from latch data structure 2230. Latch name field 1244 is no longer needed because a ring identifier and offset pair uniquely identifies any latch within the integrated circuit chip 1910. The process then returns to block 2202, which has been described.

The method of FIG. 22A thus alters the simulation configuration database of each integrated circuit chip to include information indicating the access methods available for each hardware functional latch and the "method name" (i.e., identifier) of the latch for each available access method. Although the illustrated process depicts the modification of a simulation configuration database to support two particular access methods, the illustrated method can be employed to handle any number or types of access methods.

Once all of the simulation configuration databases for each integrated circuit in a system have been processed in the manner illustrated in FIGS. 21 and 22A, the resulting chip hardware databases 2108 can then be combined to form HW configuration database 1932 illustrated in FIG. 19. In a preferred embodiment, HW configuration database 1932 is constructed from chip HW databases 2108 by creating a chip pointer data structure 2320 (FIG. 23B) that contains a respective chip database pointer 2322 referencing the chip HW database 2108 of each type of chip in data processing system 1902. For example, if data processing system 1902 includes 32 identical integrated circuit processor chips, chip pointer data structure 2320 will contain (in addition to other chip database pointers 2322 corresponding to other types of integrated circuit chips) only one chip database pointer 2322 to a single chip HW database 2108 describing the digital design embodied by the 32 integrated circuit processor chips. This HW configuration database 1932 is then stored in non-volatile storage, such as non-volatile storage 1940 or flash ROM 1924, as shown in FIG. 19.

Figure 23A:
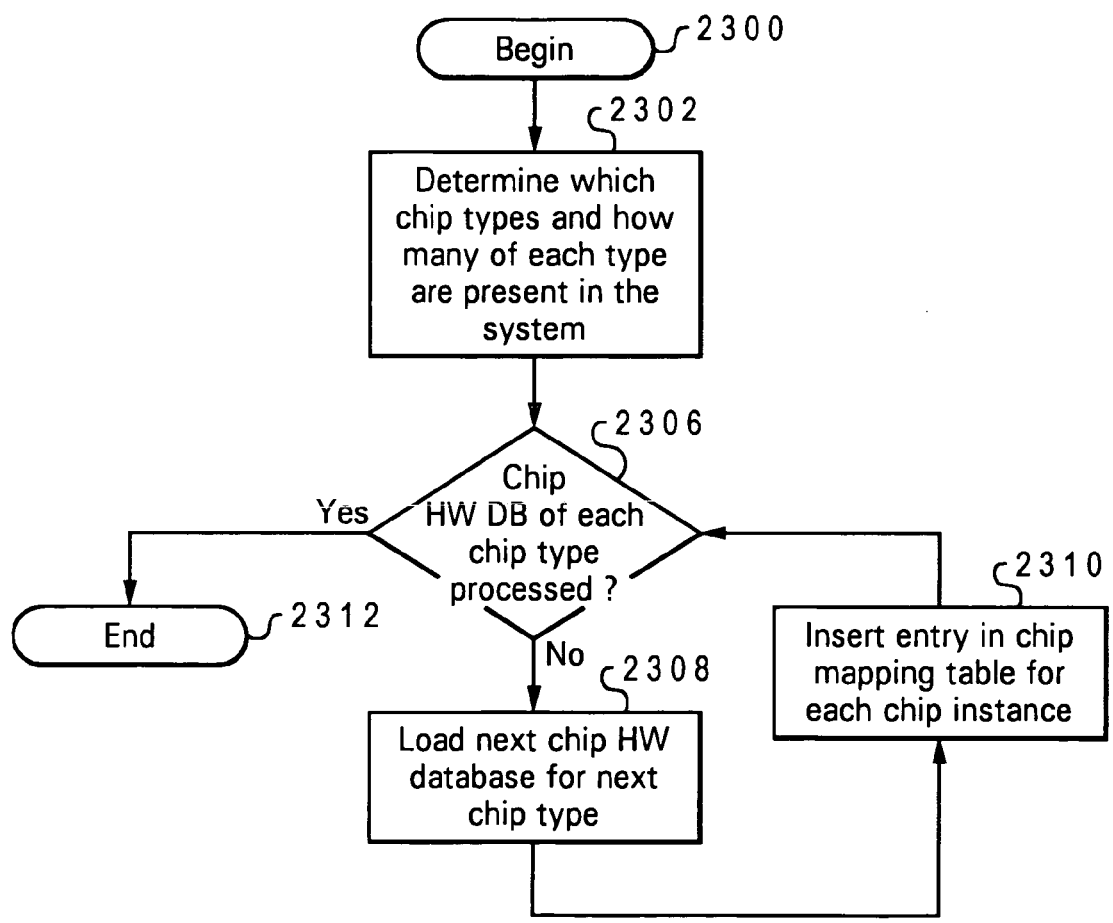
FIG. 23A is a high level logical flowchart of an exemplary method of loading a hardware configuration database from non-volatile storage into volatile memory that supports use of the hardware configuration database with digital systems of any arbitrary size or configuration.

In order to configure a hardware digital design utilizing a HW configuration database 1932, the HW configuration database 1932 is first loaded from non-volatile storage into volatile memory in accordance with the exemplary process depicted in FIG. 23A. The process shown in FIG. 23A may be performed, for example, in a laboratory environment by workstation computer 1904 through the execution of system firmware 1930b by processing unit 1922b. Similarly, when data processing system 1902 is deployed commercially, service processor 1920 executes system firmware 1930a according to the process of FIG. 23A to load HW configuration database 1932a from flash ROM 1924 to volatile memory 1928a.

As illustrated, the process of FIG. 23A begins at block 2300 and then proceeds to block 2302, which illustrates a determination of the types of integrated circuit chips and number of each type present within a target data processing system, such as data processing system 1902. In an exemplary embodiment, the determination illustrated at block 2302 is made by system firmware 1930, which consults a set of so-called Vital Product Data (VPD) to determine which of the thousands of possible machine configuration is represented by data processing system 1902.

The process then proceeds to blocks 2306-2310, which collectively form a loop in which chip pointer data structure 2320 is walked to process the chip HW databases 2108 of the integrated circuit chips comprising data processing system 1902. First, at block 2306 a determination is made whether the chip HW database 2108 of each type of integrated circuit chip within data processing system 1902 has been processed. If so, loading of HW configuration database 1932 into volatile memory is complete, and the process terminates at block 2312. If, however, the chip HW database 2108 corresponding to each type of integrated circuit chip identified by the VPD has not been processed, a next chip HW database 2108 is loaded into volatile memory 1928 of workstation 1904 for processing at block 2308.

Figure 23B:
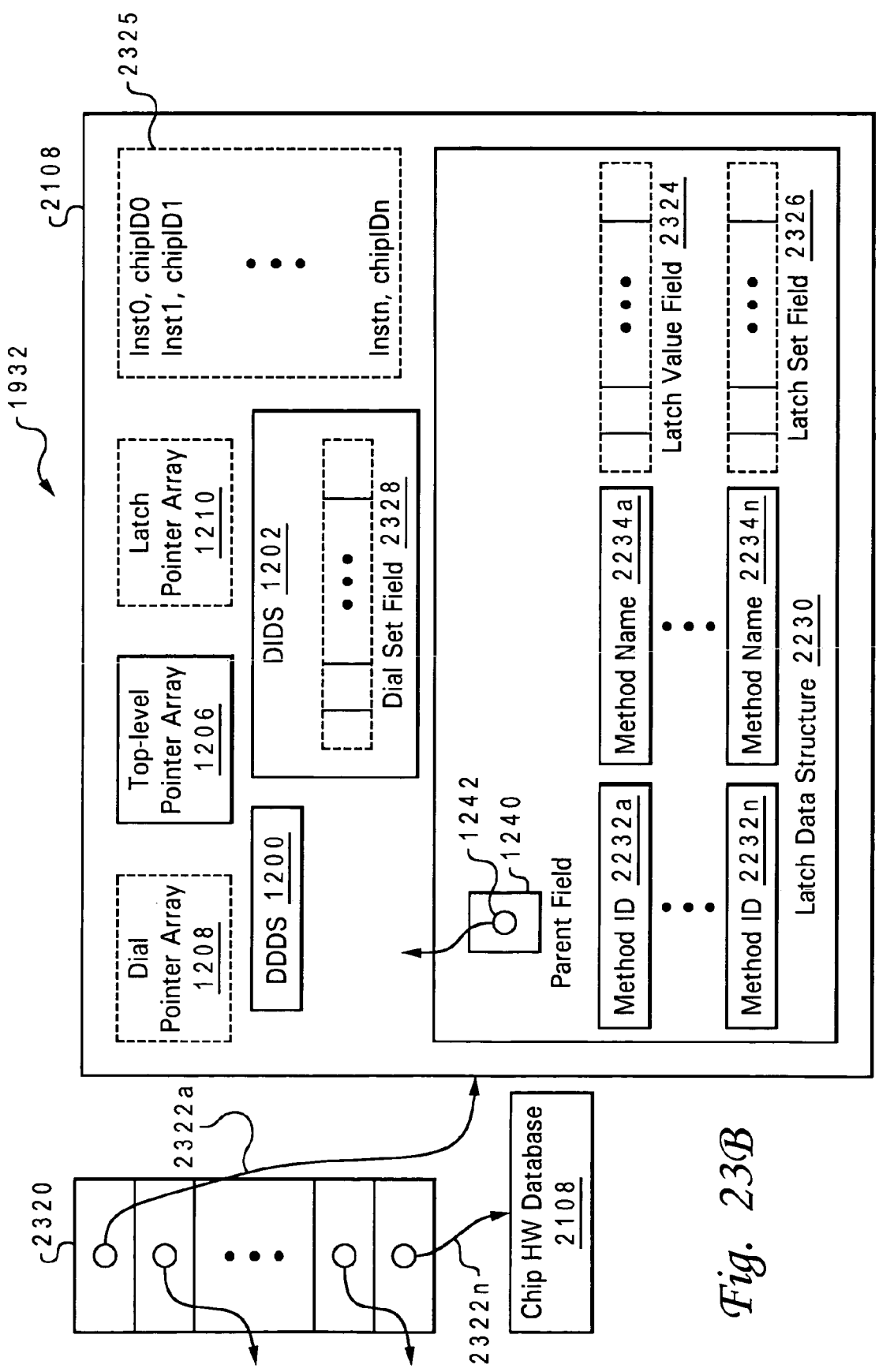
FIG. 23B illustrates an exemplary embodiment of a hardware configuration database of a digital system in accordance with one embodiment of the present invention.

As shown in FIG. 23B, which depicts an in-memory view of HW configuration database 1932, loading of the chip HW database 2108 creates in-memory data structures as described above, such as a Dial pointer array 1208, latch pointer array 1210, and an instance pointer array 1226 within each DDDS 1200 (see FIG. 12). In addition, a latch value field 2324 and a latch set field 2326 are created within each latch data structure 2230, and a Dial set field 2328 is created within each DIDS 1202. Each of these three fields is implemented as an array in which each entry corresponds to a particular instance of the integrated circuit chip 1910 corresponding to the current chip HW database 2108. Finally, an empty chip mapping table 2325 is created.

Next at block 2310, a respective entry is added to chip mapping table 2325 for each instance of the type of integrated circuit chip corresponding to the current chip HW database 2108. This step is preferably performed by system firmware 1930 via a call to a HW configuration API 1934 that accesses the VPD to determine how many instances of the type of integrated circuit chip corresponding to the current chip HW database 2108 are contained in the present hardware digital design. By convention, the order of the entries within chip mapping table 2325 corresponds to the order of array entries in Dial set field 2328, latch value field 2324 and latch set field 2326.

As shown in FIG. 23B, each entry within chip mapping table 2325 associates two firmware-supplied values: (1) a chip instance name, which is a string like that identifying the design entity representing the integrated circuit chip instance in the simulation model of data processing system 1902 (e.g., a.b.c.d) and (2) a chip ID specifying an identifier of the test access port 1914 by which service processor 1920 communicates with that integrated circuit chip instance. Thus, any latch in data processing system 1902 can now be readily addressed by the tuple (chip ID, scan ring, offset), which is associated by chip mapping table 2325 with the chip-identifying portion of the fully qualified latch name employed by HW configuration APIs 1934. Thereafter, the process returns to block 2306, which has been described.

The process depicted in FIG. 23A thus permits a single HW configuration database 1932 to be utilized to build an in-memory HW configuration database for a data processing system of any arbitrary size or configuration, eliminating the need to develop and store a separate monolithic configuration database for each possible system size and configuration.

With HW configuration database 1932 loaded into a volatile memory 1928, system firmware 1930 can then be executed by processing unit 1922a of service processor 1920 or processing unit 1922b of workstation computer 1904 to call HW configuration APIs 1934 to read or set a configuration of one or more integrated circuit chips 1910 of data processing system 1902. As in simulation, HW configuration APIs 1934 preferably include separate API routines to read Dials and Dial groups in interactive and batch modes. Also like simulation, the API calls by system firmware 1930 specify an instance qualifier (e.g., a.b.c.d or a.b.c.[X]) and a dialname qualifier (e.g., Entity.dialname) for each Dial or Dial group instance to be set or read.

Because multiple access methods can be utilized to set or read a Dial or Dial group, API calls to set or read a Dial or Dial group instance preferably include an additional parameter, access_method. In a preferred embodiment, the access_method parameter can take the values SCAN, which indicates test scanning, SCOM, which indicates SCOM scanning, and AUTO, which indicates that the HW configuration API 1934 is to select the access method. In response to an AUTO value for the access_method parameter, a HW configuration API 1934 selects an access method based upon the supported access method(s) indicated by the method ID(s) 2232 in the latch data structure(s) 2230 targeted by the API call and upon which of functional clock 2002 and scan clock 2010 is running. As described above, SCOM scanning is only available when functional clock 2002 is running, and test scanning is only available when scan clock 2010 is running.

Figure 24:
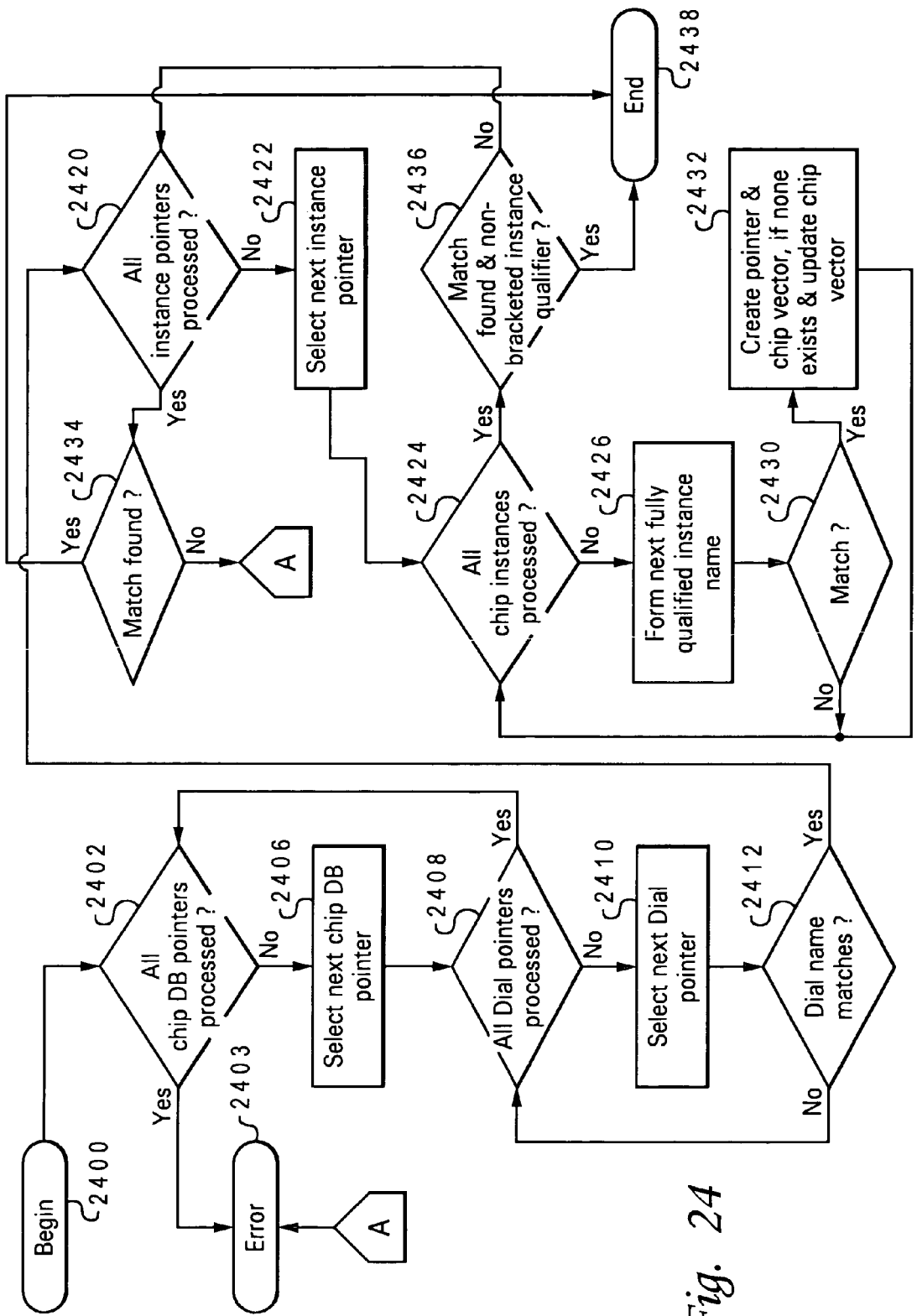
FIG. 24 is a high level logical flowchart of an exemplary method of identifying, by reference to a hardware configuration database, one or more Dial instances or Dial group instances in a digital system that are relevant to an API call.

Before any HW configuration API 1934 can set or read a Dial or Dial group instance, the HW configuration API 1934 must first determine which Dial or Dial group instances are identified by the instance qualifier and dialname qualifier specified in the API call. Referring now to FIG. 24 there is depicted a high level logical flowchart of an exemplary process by which a HW configuration API 1934 locates particular Dial or Dial group instances in HW configuration database 1932 in accordance with the present invention. The illustrated process is analogous to the process depicted in FIG. 15 and described above.

As shown, the process begins at block 2400 in response to receipt by a HW configuration API 1934 of an API call from firmware 1930 having as an argument an instance qualifier and a dialname qualifier of one or more Dial or Dial group instances, as discussed above. In response to the API call, the configuration API 1934 enters HW configuration database 1932 at chip pointer array 2320 and, as depicted at block 2402, enters a loop in which chip database pointers 2322 are processed until one or more matching Dial instances are located within a particular chip HW database 2108 or until all chip database pointers 2322 have been processed. In response to a determination at block 2402 that all chip database pointers 2322 have been processed without locating any matching Dial instances, the process terminates with an error at block 2403. However, if fewer than all of chip database pointers 2322 have been processed, the next chip database pointer 2322 is selected from chip pointer data structure 2320 for processing, as depicted at block 2406. The selected chip database pointer 2322 is utilized to locate the associated chip HW database 2108.

Following block 2406, the process proceeds to block 2408 and following blocks, which represent a processing loop in which each Dial pointer 1252 in the Dial pointer array 1208 of the current chip HW database 2108 is processed until a particular Dial matching the API call is located or until all Dial pointers 1252 (FIG. 12) have been processed without finding any matching Dial instances. In response to a determination at block 2408 that all Dial pointers 1252 have been processed without locating any matching Dial entity, the process returns from block 2408 to block 2402 in order to process the next chip database pointer 2322 in chip pointer array 2320 (i.e., to process the next chip HW database 2108). If, on the other hand, a determination is made at block 2408 that not all Dial pointers 1252 within Dial pointer array 1208 have been processed, the process proceeds to block 2410, which illustrates the selection from Dial pointer array 1208 of the next Dial pointer 1252 for processing.

Next, a determination is made at block 2412 of whether or not the DDDS 1200 referenced by the current Dial pointer 1252 has a name field 1222 that exactly matches the specified dialname qualifier. With respect to name fields 1222, two implementations are possible. First, reuse of Dial names can be prohibited so that every Dial name is unique throughout not only its own integrated circuit chip, but also throughout the entire system (e.g., data processing system 1902). A second, less restrictive approach is to require each Dial name to be unique only within its integrated circuit chip 1910 and to permit multiple uses of a Dial name in different integrated circuits. In order to support the second approach, name field 1222 takes the form "chiptype.Dial name", where "chiptype" is a unique string identifying the type of integrated circuit chip 1910, thus disambiguating identical Dial names applied to Dial entities instantiated in different integrated circuit chips 1910.

In response to a determination at block 2412 that name field 1222 does not match the specified dialname qualifier, the process returns to block 2408 for processing of the next Dial pointer 1252, if any, as described above. If, however, a match is found, the process then enters a processing loop comprising blocks 2420-2434 in which the Dial instances represented by individual DIDS 1202 are examined for a match with the API call's instance qualifier utilizing the instance pointers 1228 in the instance pointer array 1226 of the DDDS 1200 of the matching Dial entity. In this processing loop, a determination is first made at block 2420 of whether or not all instance pointers 1228 within the current DDDS 1200 have been processed. If so, a further determination is made at block 2434 of whether or not at least one matching instance of the Dial entity corresponding to the current DDDS 1200 was found. This determination is made because the construction of HW configuration database 1932 ensures that at most one matching Dial (not Dial instance) in only one chip HW database 2108 will match the instance qualifier and dialname qualifier specified in the API call. Consequently, if a matching instance is found for a particular Dial entity, no further Dial entities or chip HW databases 2108 need be searched. Accordingly, if a determination that at least one matching Dial instance has been found for the Dial entity corresponding to the current DDDS 1200, the process passes from block 2434 to block 2438 and terminates. If, however, a determination is made at block 2434 that no match was found, the process passes through page connector A and terminates with an error at block 2403.

Returning to block 2420, in response to a determination that all instance pointers 1228 of the current DDDS 1200 have not been processed, the process proceeds to block 2422, which illustrates the selection of the next instance pointer 1228 and its associated DIDS 1202 for processing. A determination is then made at block 2424 whether the DIDS 1202 has been processed with respect to the Dial instance in each of the integrated circuit chips 1910 corresponding to the current chip HW database 2108 by processing each entry in chip mapping table 2326. If so, the process passes to block 2436, which is described below. If processing of all entries in chip mapping table 2325 has not been completed, the process proceeds to block 2426. Block 2426 depicts forming the next fully qualified Dial instance name to be matched against the instance qualifier specified in the API call by prepending the chip instance name in the next entry of chip mapping table 2325 to the instance name field 1234 of the current DIDS 1202. This fully qualified Dial instance name is then compared to the instance qualifier at block 2430. If they do not match, the process returns to block 2424, which has been described. If they do match, a temporary result pointer and associated chip vector are created at block 2432, if they do not already exist. The temporary result pointer points to the current DIDS 1202 to identify the corresponding Dial instance as matching the instance qualifier specified in the access request. An entry is also placed in the associated chip vector to indicate the particular integrated circuit chip instance 1910 in which this matching Dial instance is located. In an exemplary embodiment, the chip vector may simply comprise a same number of bits as there are entries in chip mapping table 2325, with a bit value of "1" indicating that the corresponding integrated circuit chip instance 1910 contains a matching Dial instance. Following block 2432, the process returns to block 2424.

The processing loop represented by blocks 2424-2432 is repeated for each entry in chip mapping table 2325. After all entries have been processed, the process passes from block 2424 to block 2436, which depicts a determination of whether the dialname qualifier was specified utilizing non-bracketed syntax and, if so, whether or not a match was found for the specified dialname qualifier among the Dial instances represented by the current DIDS 1202. If the determination is negative, it is possible that additional matching Dial instances associated with another DIDS 1202 may exist. Accordingly, the process returns to block 2420 to process the next instance pointer 1228 of the current DDDS 1200. If, however, the determination at block 2436 is positive, it is known that all matching Dial instances have been located and identified with temporary result pointers and associated chip vectors. The process therefore terminates at block 2438.

After the Dial or Dial group instances specified by the instance qualifier and dialname qualifier have been determined by the process shown in FIG. 24, the Dial or Dial group instance(s) are set or read in much the same fashion as described above with respect to FIGS. 16A (reading a Dial instance in interactive mode), 16B (reading a Dial group instance in interactive mode), 17A (setting a Dial instance in interactive mode), 17B (setting a Dial group instance in interactive mode) and 18 (setting a Dial instance or Dial group instance in batch mode). A few differences are required, however, to account for the use of a single chip HW database 2108 to represent possibly multiple integrated circuit chips 1910 and for the availability of multiple different access methods to access integrated circuit chips 1910. These differences are detailed below.

When reading Dial instances or Dial group instances, latch values are verified by propagating the latch values "up" the Dial trees in the configuration database, as described with reference to block 1624 of FIG. 16A. Conversely, when setting Dial instances or Dial group instances, Dial values are propagated "down" the Dial trees in the configuration database to the latch data structures, as described above with reference to block 1714 of FIG. 17A. In simulation, only one latch value at a time is propagated "down" to or "up" from any one latch data structure 1204. However, because HW configuration database 1932 represents multiple integrated circuit chips 1910 of the same type with a single chip HW database 2108, reading or setting a Dial or Dial group instance by reference to a chip HW database 2108 representing multiple physical integrated circuit chips 1910 entails propagating multiple elements of a value set up or down the Dial tree in parallel, where each element of the value set is the value for a particular chip instance identified by the temporary result pointer and chip vector constructed in FIG. 24.

Similarly, in simulation, each of Dial set field 1239, latch value field 1246, and latch set field 1248 within configuration database 1404 contains only a single value. In contrast, the corresponding Dial set fields 2328, latch value fields 2324, and latch set fields 2326 within HW configuration database 1932 are implemented as arrays in which each element corresponds to an individual Dial or latch instance for a particular integrated circuit chip 1910. Accordingly, when Dial, Dial group and latch instances are set, the elements within Dial set fields 2328, latch value fields 2324, and latch set fields 2326 corresponding to the set instances are updated in accordance with the temporary result pointer and chip vector constructed in FIG. 24.

Because laboratory or commercial use of HW configuration database 1932 entails accessing physical hardware (i.e., integrated circuit chips 1910) utilizing multiple possible access methods, three additional differences from a simulation environment are noted in a preferred embodiment. First, a set or read operation requested in an API call preferably fails (i.e., is not performed) if a HW configuration API 1934 determines that the access method indicated by the access_method parameter contained within the API call is not available for any of the Dial instances identified by the temporary result pointer(s) and chip vector(s) obtained by the process of FIG. 24. As described above, the access method(s) by which each latch can be set or read is indicated by the method ID field(s) 2232 of each latch data structure 2230.

Second, a set or read operation requested in an API call preferably succeeds only if a HW configuration API 1934 determines that the. functional clock 2002 and scan clock 2010 within each integrated circuit chip 1910 targeted by the API call are in the appropriate states for the access_method parameter contained within the API call. That is, if the access_method parameter has the value SCAN, the functional clock 2002 must be disabled, and the scan clock 2010 must be enabled. Conversely, if the access_method parameter has the value SCOM, the functional clock 2002 must be enabled, and the scan clock 2010 must be disabled. If the access_method parameter has the value AUTO, the functional clock 2002 and scan clock 2010 of each integrated circuit chip 1910 containing a latch targeted by the API call must be in states that permit at least one access method of each such latch to be employed.

Third, the HW configuration APIs 1934 utilized to read and set hardware latches, read_latch() and write_latch(), preferably minimize scan accesses to integrated circuit chips 1910 by implementing shadow scan chain buffers in volatile memory 1928 and by accessing such scan chain buffers when possible in lieu of scanning a scan chain in an integrated circuit chip 1910. For example, the read_latch() HW configuration API 1934, which corresponds to the GETFAC() API 1412 employed in simulation, preferably obtains latch value(s) from the corresponding shadow scan chain buffers in volatile memory 1928 in cases in which the latch value(s) in volatile memory 1928 are known to be current. In addition, multiple updates to latch values via the write_latch() API, which corresponds to the PUTFAC() API 1414 utilized in simulation, are preferably buffered in the shadow scan chain buffers in volatile memory 1928. In this manner, multiple writes to latches in a particular scan chain of an integrated circuit chip 1910 can be made by scanning the particular scan chain only once.

HW configuration APIs 1934 preferably further include a check_chip() API similar to the check_model() API available in simulation. When called, the check_chip() API utilizes top-level pointer array 1206 within a specified chip HW database 2108 to verify that each top-level CDial and LDial instance within the chip HW database 2108 is set to one of its legal values. Specifically, the check_chip() API propagates the underlying hardware latch values up the Dial tree of each top-level CDial and LDial instance by reference to its mapping table 1224 and the mapping table(s) 1224 of any lower-level Dial instance(s) in its Dial tree. Any top-level LDial or CDial instance set to an illegal value is returned by the check_chip() API.

Referring again to FIG. 19, in many commercial embodiments of data processing system 1902, the storage capacity of non-volatile storage (e.g., flash ROM 1924) within service processor 1920 is significantly less than that of the non-volatile storage 1940 (e.g., hard disk storage) of the workstation computer 1904 utilized to store system firmware 1930b and HW configuration database 1932b. Accordingly, it is usually desirable or necessary to reduce the size of the system firmware 1930b and HW configuration database 1932b developed in a laboratory hardware testing environment to obtain the system firmware 1930a and HW configuration database 1932a commercially deployed within flash ROM 1924 (or other non-volatile storage) of data processing system 1902.

Figure 25:
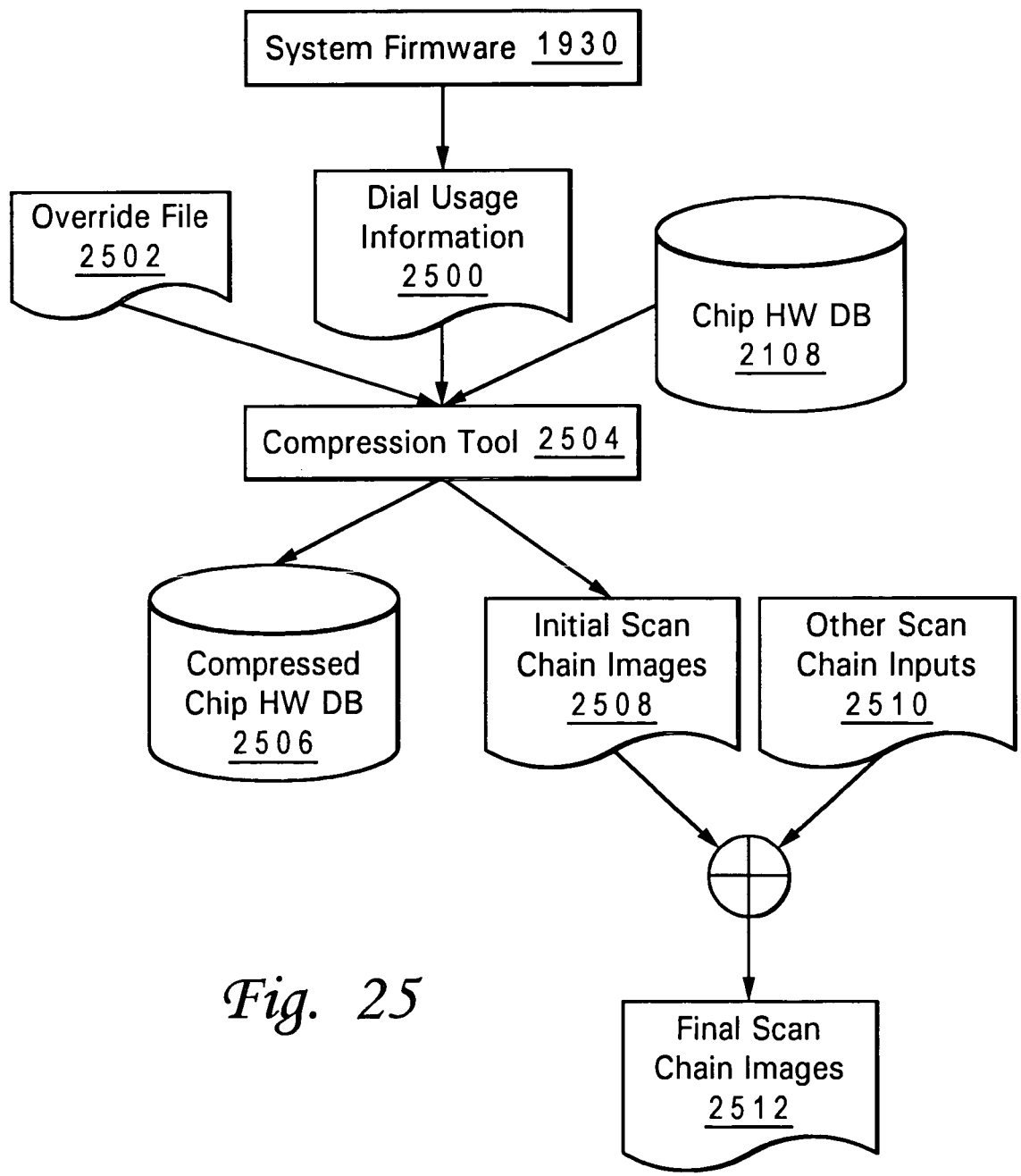
FIG. 25 is a high level logical flow diagram of an exemplary process by which a hardware configuration database developed during laboratory development and testing of system firmware can be compressed for commercial deployment.

Accordingly, with reference now to FIG. 25, there is illustrated a high level logical flow diagram of an exemplary process by which each chip HW database 2108 developed during laboratory development and testing of system firmware 1930 can be compressed through the elimination of unnecessary information in order to obtain a HW configuration database 1932a suitable for commercial deployment. The process begins by generating Dial usage information 2500 indicating which Dial instances within a particular type of integrated circuit chip 1910 have been set and/or read and the values to which Dial instances have been set.

The determination of which Dial instances are set or read and the values to which Dial instances have been set can be accomplished in a number of ways well known to those skilled in the art. For example, system firmware 1930 can be manually examined to generate Dial usage information 2500. Alternatively, system firmware 1930 can be executed in a number of possible machine configurations that cover all the settings to which Dial instances in the type of integrated circuit chip 1910 under consideration may be set. The Dial instances that are set and read and the values to which Dial instances are set can then be logged as Dial usage information 2500.

In a preferred embodiment, all that is recorded within Dial usage information 2500 for IDial instances is whether or not the IDial instance is set or read. No IDial instance values are recorded because it is assumed, for purposes of generating Dial usage information 2500, that if an IDial instance is set, all of its possible values may be utilized. There are, however, particular IDial instances that developers know will only be set to a single value. To permit the elimination of these IDials from HW configuration database 1932a, these IDials and their associated values can optionally be specified by a developer within an override file 2502. Override file 2502 may also contain a list of Dial instances, if any, that the developer desires to explicitly preserve within HW configuration database 1932a, regardless of whether or not the Dial instance is read or set.

Thus, for each chip HW database 2108, Dial usage information 2500 and override file 2502 are preferably obtained that collectively contain at least the following information:
1) a list of all the top-level non-IDial instances set within any of the instances of the integrated circuit chip in any configuration and a list of any top-level IDials set to any value within any of the instances of the integrated circuit chip in any configuration;
2) a list of all the values of each non-IDial instance that is set;
3) a separate list of IDials set to a single value; and
4) a list of all Dial instances that are read.

As further illustrated in FIG. 25, this information is then utilized by a software compression tool 2504 (e.g., executed by workstation computer 1904) to eliminate unnecessary information from the associated chip HW database 2108. Compression tool 2504 produces two outputs: (1) a compressed chip HW database 2506 forming a portion of HW configuration database 1932a and (2) initial scan chain images 2508 utilized to develop the scan chain images to which test scan chains 2006 in the integrated circuit chip 1910 are initialized during execution of system firmware 1930a. As indicated, these initial scan chain images 2508 may be non-destructively combined with additional scan chain inputs 2510 to obtain final scan chain images 2512.

Figure 26A:
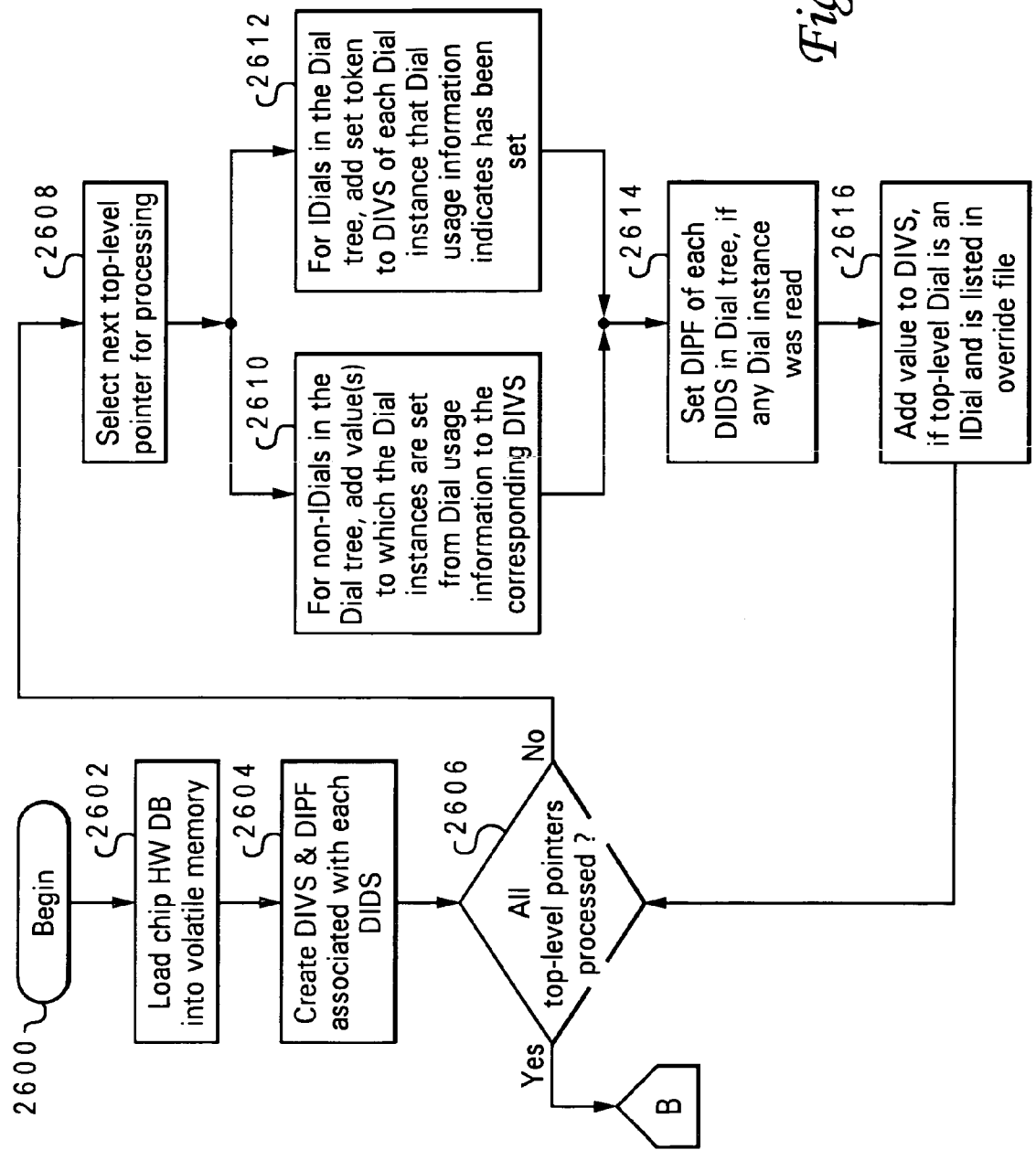
FIGS. 26A-26C together form a high level logical flowchart of an illustrative method of compressing a hardware configuration database utilizing a software compression tool in accordance with the present invention.
Figure 26B:
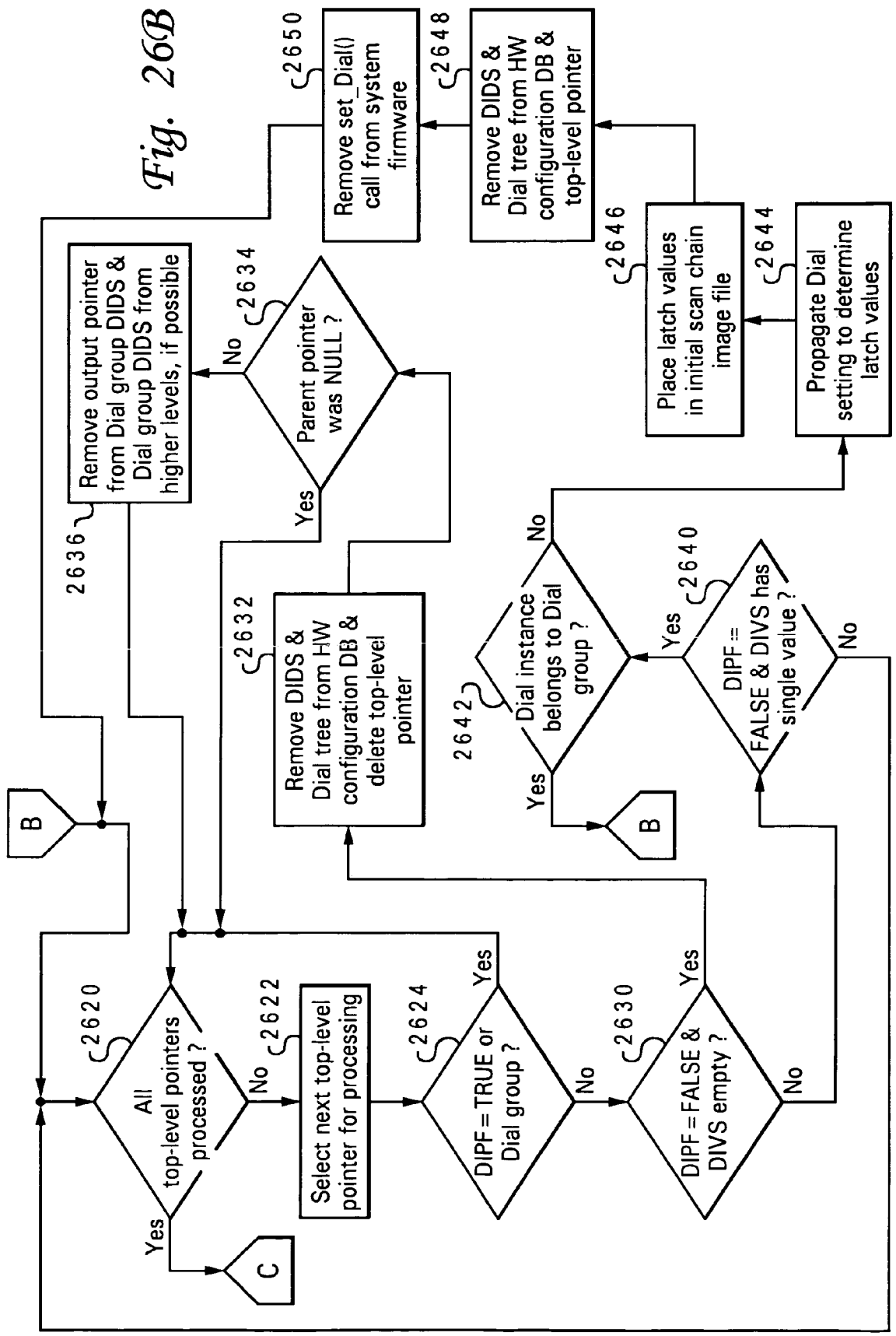
Figure 26C:
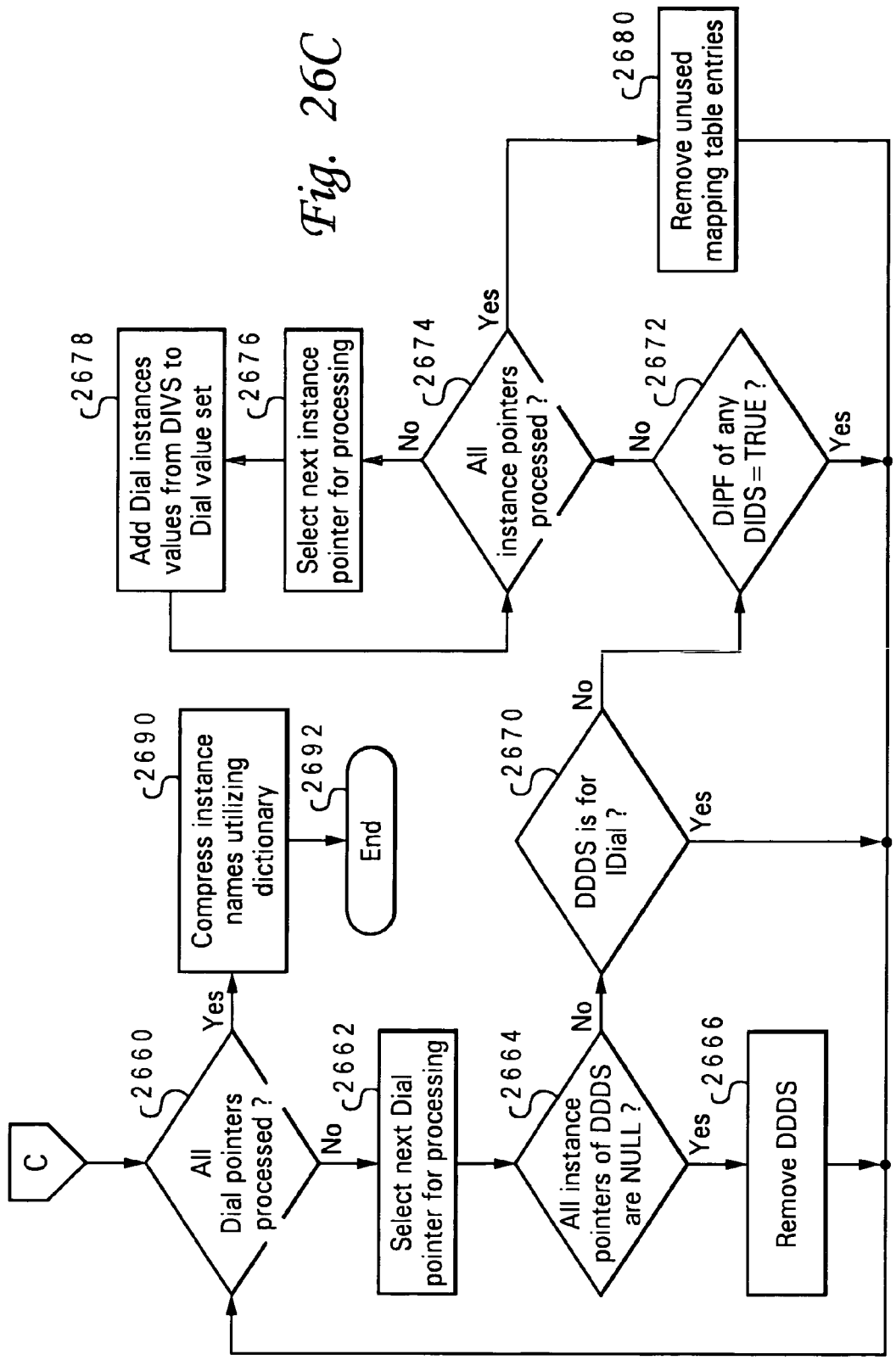

Referring now to FIGS. 26A-26C, there is depicted a high level logical flowchart of a method by which compression tool 2504 compresses a chip HW database 2108 in accordance with the present invention. As described in detail below, the illustrated method implements at least three size optimizations.

First, information related to a Dial instance may be eliminated from a chip HW database 2108 if the Dial instance will never be set or read by system firmware 1930a. Because such Dial instances will never be set or read by system firmware 1930a, the DIDS 1202 corresponding to such Dial instances will never be referenced within HW configuration database 1932a and may accordingly be removed. It is important to note that the fact that system firmware 1930a does not set or read a Dial instance does not necessarily mean that the Dial instance is not set or read during simulation or laboratory debugging. Many Dial instances (e.g. mode Switches) are never set by system firmware 1930a, but are tested during simulation to ensure that the mode Switches work properly if needed by a later firmware revision.

A second reason that information related to a Dial instance may be unnecessary is if the Dial instance is set to only one value in all configurations. In this case, the DIDS 1202 corresponding to the Dial instance can be removed from chip HW database 2108 because the effects of setting the Dial instance can instead be achieved by setting the final scan chain image 2512 scanned into an integrated circuit chip 1910 with the latch value(s) that would be obtained by setting the Dial instance. The code within system firmware 1930b that sets the Dial instance can likewise be eliminated to reduce the size of system firmware 1930a ultimately obtained from laboratory testing and debugging.

Third, mapping tables 1224 in DDDSs 1200 may be optimized by eliminating values to which Dials are never set by system firmware 1930a.

In making the foregoing optimizations, special consideration is given to Dial instances that are read. In general, when a Dial instance is read, it is assumed in the exemplary compression methodology described below that the entire Dial tree containing the Dial instance that is read must be preserved within its chip HW database. In addition, it is assumed that all entries within the mapping tables of Dials in Dial trees containing Dial instances that are read must be preserved because, in commercial deployment, the hardware may set the underlying latches to values other than those read by system firmware. Consequently, it cannot be determined a priori which mapping table entries will be required to read a Dial instance. Although these assumptions limit compression, they ensure that each Dial instance that is read can be easily accessed, regardless of whether or not the Dial instance is a top-level Dial instance or a lower-level Dial instance.

Referring first to FIG. 26A, the process begins at block 2600 and then proceeds to block 2602, which illustrates compression tool 2504 loading a chip HW database 2108 into volatile memory 1928b and creating in-memory data structures 1208, 1210 and 2325, as described above. In addition, as depicted at block 2604, compression tool 2504 creates, in association with each DIDS 1202, some additional temporary fields in memory used only by compression tool 2506. These temporary fields include a Dial Instance Value Structure (DIVS) for storing the values, if any, to which the associated Dial instance is set within Dial usage information 2500. For IDial instances, the DIVS is handled specially. In particular, the DIVS will either be empty, contain a token indicating the IDial instance is set, or, for top-level IDial instances only, contain the single value to which the IDial instance is set, if applicable. The temporary fields created for each DIDS 1202 at block 2604 also include a Dial Instance Preserve Field (DIPF), which is set to TRUE if the associated DIDS should be preserved (i.e., not deleted from the compressed chip HW database) and is set to FALSE otherwise. The DIPF of each DIDS 1202, if any, explicitly listed in override file 2502 as a DIDS to be preserved is initialized to TRUE, and all other DIPFs are initialized to FALSE.

The process then proceeds from block 2604 to block 2606, which illustrates compression tool 2504 entering a loop in which each top-level pointer 1250 in top-level pointer array 1206 is processed to enter relevant information from Dial usage information 2500 in the DIPF and DIVS of each DIDS 1202. If all top-level pointers 1250 have been processed, the processes passes through page connector B to FIG. 26B, which is described below. If, however, all top-level pointers 1250 have not yet been processed, the next top-level pointer 1250 within top-level pointer array 1206 is selected for processing at block 2608.

The process then passes from block 2608 to blocks 2610 and 2612. Block 2610 illustrates compression tool 2504 processing each non-IDial in the Dial tree headed by the Dial instance corresponding to the DIDS 1202 referenced by the current top-level pointer 1250. Compression tool 2504 adds to the DIVS of each such DIDS 1202 the values for the corresponding Dial instance contained within the Dial usage information 2500. In addition, as shown at block 2612, compression tool 2504 processes each IDial within the Dial tree headed by the Dial instance corresponding to the DIDS 1202 referenced by the current top-level pointer 1250. For each such IDial, compression tool 2504 adds a set token to the DIVS if Dial usage information 2500 indicates that the IDial has been set.

Next, at block 2614, compression tool 2504 sets the DIPF of every DIDS 1202 in the Dial tree headed by the Dial instance corresponding to the DIDS 1202 referenced by the current top-level pointer 1250 if Dial usage information 2500 indicates that any Dial in the Dial tree was read. In other words, each DIPF in the Dial tree is set to TRUE if any Dial instance in the Dial tree is read. The process then proceeds to block 2616, which illustrates compression tool 2504 examining each top-level IDial, if any, corresponding to the DIDS 1202 referenced by the current top-level pointer 1250 to determine whether override file 2502 indicates that the IDial is set to only a single value. If so, compression tool 2504 adds to the DIVS of those top-level IDials the value contained within override file 2502 and removes a set token, if present.

Thereafter, the process returns to block 2606, which illustrates the continuation of the processing loop until all top-level pointers 1250 within top-level pointer array 1206 have been processed. Once all top-level pointers 1250 have been processed, the process passes through page connector B to FIG. 26B.

With reference now to FIG. 26B, the process proceeds from page connector B to block 2620, which illustrates a second processing loop in which each top-level pointer 1250 within top-level pointer array 1206 is processed. If a determination is made at block 2620 that all top-level pointers 1250 within top-level pointer array 1206 have been processed in the current processing loop, the process passes through page connector C and continues in FIG. 26C. Otherwise, the process proceeds to block 2622, which depicts the selection of the next top-level pointer 1250 within top-level pointer array 1206 for processing.

Following block 2622, the DIVS and DIPF associated with the DIDS 1202 referenced by the current top-level pointer 1250 are examined for one of three conditions respectively represented by decision blocks 2624, 2630, and 2640. If a determination is made at block 2624 that the DIPF has a value of TRUE or if type field 1220 in the associated DDDS 1200 indicates that the DIDS 1202 corresponds to a Dial group, the process simply returns from block 2624 to block 2620 for processing of the next top-level pointer 1250, if any.

If, however, a determination is made at block 2630 that the DIPF associated with the DIDS 1202 referenced by the current top-level pointer 1250 has a value of FALSE and the associated DIVS is empty, then compression tool 2504 can remove the DIDS 1202 from chip HW database 2108 because none of the corresponding Dial instances is set or read. Accordingly, as illustrated at block 2632, compression tool 2504 deletes the DIDS 1202 from chip HW database 2108, as well as each lower-level DIDS 1202, if any, in the Dial treeheaded by the deleted top-level DIDS 1202. In addition, compression tool 2504 deletes the associated top-level pointer 1250 from top-level pointer array 1206, and sets the instance pointer 1228 pointing to each deleted DIDS 1202 to NULL. A determination is then made at block 2634 of whether or not the parent pointer 1233 of the deleted DIDS 1202 was set to NULL. If so, the process returns to block 2620, which has been described. If, on the other hand, the parent pointer was not NULL, then the top-level Dial instance(s) corresponding to the deleted DIDS 1202 belonged to Dial group instance(s). Because the top-level Dial instance(s) were never set or read, each such top-level Dial instance may be safely removed from its respective Dial group instance. Accordingly, as shown at block 2636, compression tool 2504 deletes from the DIDS 1202 corresponding to the Dial group instance(s) the output pointer 1238 to the deleted DIDS 1202 of the top-level Dial instance. If the deletion of the output pointer 1238 from the DIDS 1202 of the Dial group instances removes the last member of the Dial group, the DIDS 1202 corresponding to the Dial group instance(s) is also deleted from chip HW database 2108. This process continues, collapsing hierarchical levels of Dial groups, if possible. Following block 2636, the process returns to block 2620, which has been described.

Returning to block 2640, compression tool 2504 determines whether the DIPF associated with the DIDS 1202 referenced by the current top-level pointer 1250 has a value of FALSE and the associated DIVS contains a single value. If not, the process returns to block 2620, which has been described. If so, a further determination is made at block 2642 by reference to parent field 1232 of the DIDS 1202 of whether the Dial instance belongs to a Dial group. If so, the process preferably returns to block 2620 without further processing, signifying that the DIDS 1202 will be preserved. The DIDS 1202 is preferably preserved because operations setting a Dial group are atomic and will fail if a removed Dial instance is referenced in the set-Dial_group() API call. In response to a determination at block 2642 that the Dial instance corresponding to the DIDS 1202 referenced by the top-level pointer 1250 does not belong to a Dial group, the process proceeds to block 2644.

Block 2644 illustrates propagating the single Dial value contained in the DIVS down the Dial tree by reference to mapping tables 1224 (if necessary) in order to determine the latch values of the latches terminating the Dial tree. The latch values determined at block 2644 are then placed within initial scan chain images 2508 in scan chain locations determined by reference to chip mapping table 2325, as illustrated at block 2646. Therefore, as shown as block 2648, the DIDS 1202 referenced by the current top-level pointer 1250, its lower-level Dial tree, and top-level pointer 1250 itself are all removed from the chip HW database 2108, as described above with respect to block 2632. In addition, the set_Dial() API call utilized to set the top-level Dial instances corresponding to the deleted DIDS 1202 is removed (typically by a human programmer) from system firmware 1930*b*, as shown at block 2650. Thereafter, the process returns to block 2620, which has been described.

Referring now to FIG. 26C, processing begins at page connector C and proceeds to block 2660, which illustrates a processing loop in which all Dial pointers 1252 within Dial pointer array 1208 are processed to eliminate from chip HW database 2108 any unnecessary DDDSs 1200 and any unnecessary entries within mapping tables 1224. After all Dial pointers 1252 within Dial pointer array 1208 have been processed, the process passes to block 2690, which is described below. If, however, less than all Dial pointers 1252 have been processed, the process proceeds from block 2660 to block 2662, which illustrates selection of the next Dial pointer 1252 for processing.

Following selection of a next Dial pointer 1252, compression tool 2504 determines at block 2664 whether all instance pointers 1228 within instance pointer array 1226 of the DDDS 1200 referenced by the current Dial pointer 1252 are NULL. If so, the entire DDDS 1200 is unnecessary and is removed from the chip HW database 2108, as shown at block 2666. Following block 2666, the process returns to block 2660, which has been described.

In response to a determination at block 2664 that all instance pointers 1228 within the DDDS 1200 referenced by the Dial pointer 1252 are not NULL, a further determination is made at block 2670 of whether or not type field 1220 indicates that DDDS 1200 defines a IDial. If so, no optimization to mapping table 1224 is possible, and the process returns to block 2660. If compression tool 2504 determines that block 2670 that the DDDS referenced by the current Dial pointer 1252 does not define an IDial, the process proceeds to block 2672. Block 2672 depicts a determination of whether or not any DIPF associated with any DIDS 1202 referenced by an instance pointer 1228 has a value of TRUE. If so, this condition indicates that at least one Dial instance of the Dial defined by DDDS 1200 has been read and therefore requires a full mapping table 1224. Accordingly, the process returns to block 2660 without performing any optimization to mapping table 1224.

If, however, compression tool 2504 determines at block 2672 that all DIPFs associated with DIDSs 1202 referenced by instance pointers 1228 have a value of FALSE, the process proceeds from 2672 to the processing loop illustrated at blocks 2674, 2676, and 2678. This processing loop represents compression tool 2504 processing each instance pointer 1228 within the instance pointer array 1226 of the DDDS 1200 referenced by the current Dial pointer 1252 in order to build a Dial value set containing all values to which the Dial instances corresponding to the DIDSs 1202 were set by system firmware 1930. As indicated at block 2678, the Dial values are obtained from the DIVS associated with each DIDS 1202. After the Dial value set has been built through processing each instance pointer 1228, the process passes from block 2674 to block 2680. Block 2680 illustrates compression tool 2504 removing each entry in mapping table 1224 of the DDDS 1200 referenced by the current Dial pointer 1252 whose Dial input value is not found within the Dial value set. This process continues down the Dial tree, eliminating mapping table entries that are not utilized to generate the Dial value set. Thus, mapping tables 1224 of individual Dials are optimized by the removal of unneeded entries. Thereafter, the process returns to block 2660.

In response to a determination at block 2660 that all Dial pointers 1252 within Dial pointer array 1206 have been processed, compression tool 2504 performs a last compression at block 2690 by replacing common portions of instance names within instance name fields 1234 with pointers to a "dictionary" providing the full instance name portions. This compression technique, which is well known to those skilled in the art, replaces instance names (or portions thereof) with pointers, which are typically significantly shorter than the instance name or instance name portions they replace. These pointers can then be replaced within instance name fields 1234 as a step in the process in which HW configuration database 1932*a* is loaded into volatile memory 1928*a* of service processor 1920. Following block 2690, compression tool 2504 terminates processing at block 2692.

After all of the chip HW databases 2108 have been compressed by compression tool 2504 in accordance with the method depicted in FIG. 26A-26C, the compressed chip HW databases 2108 can then be utilized to construct hardware configuration database 1932*a* stored within flash ROM 1924 by simply constructing a chip pointer data structure 2320. It should be noted that the compression methodology implemented by compression tool 2504 is not exclusive. HW configuration APIs 1934*b* preferably include a suite of APIs that permit a developer to remove individual DIDSs 1202, remove an entry in a mapping table 1224, and perform other optimizations similar to those illustrated in FIG. 26A-26C.

In the embodiments of the present invention described above, it has been assumed that each Dial (i.e., LDial or IDial) that is logically coupled to a simulation configuration latch or hardware latch can set the value contained in the simulation configuration latch or hardware latch. In practice, however, it is often desirable to be able to read such latches without permitting system firmware or a simulator to set (or alter) the latch values.

In view of the foregoing, a preferred embodiment of the present invention supports an additional class of configuration entities referred to herein as read-only Dials or RDials. There is preferably a read-only configuration entity corresponding to each type of Dial and Dial group described above, that is, a read-only LDial, CDial, IDial and Dial group. For ease of understanding, each read-only configuration entity is referred to herein by the Dial or Dial group type name (e.g., LDial, CDial, IDial and Dial group) preceded by an "R" designating the configuration entity as read-only (e.g., RLDial, RCDial, RIDial and RDial group).

RDials and RDial groups are subject to a number of rule sets. First, RDials and RDial groups are read-only and, by definition, cannot be set by a simulator or system firmware. Consequently, RDials and RDial groups cannot be assigned default values.

Second, the syntax defining an RDial or RDial group within a configuration specification statement is preferably the same as that described above for the corresponding non-read-only configuration entity, except that the keyword defining the configuration entity is preceded by an "R". For example, an exemplary configuration specification statement for an RLDial can be given as follows:

```
RLDial state_machine (state_vector(0..1)
    ) =
        {idle =>0b00;
        start =>0b01;
        wait =>0b10;
        end =>0b11
        };
```

The exemplary configuration specification statement given above begins with the keyword "RLDial," which specifies that the type of RDial being declared is an RLDial, and the RDial name, which in this case is "state_machine." Next, the configuration specification statement enumerates the signal name(s) whose states are read by the RLDial. Following the enumeration of the signal identifiers, the configuration specification statement includes a mapping table listing the permitted enumerated "input" values (or settings) of the RLDial and the corresponding signal (i.e., "output") values for each enumerated input value. It should again be noted that the signal states specified for all enumerated values are unique, and collectively represent the only legal patterns for the signal states.

Third, RDials have a different set of rules regarding interconnection with Dials and RDials and grouping of Dials and/or RDials to form RDial groups. These rules are set forth in detail below with reference to FIG. 27, which is a graphical representation of a portion of an exemplary configuration database 2700 including Dials and RDials having specified logical connections to latches 2760-2778 of a simulation model or hardware system.

As an initial matter, RDials are subject to similar restrictions on interconnection to other RDials and latches as set forth above with respect to the corresponding Dials. That is, in a preferred embodiment, an RIDial or an RLDial, but not an RCDial, can have its output directly coupled to a latch, and an RCDial, but not an RIDial or RLDial, can have its output connected to the input of a lower level RDial. Thus, for example, RCDial 2740 has an output connected to the input of RCDial 2742, which in turn has two outputs respectively connected to the inputs of RLDial 2744 and RIDial 2746. RLDial 2744 and RIDial 2746 have outputs connected to latches 2770 and 2772, respectively.

In addition, an RCDial can have its output connected to the input of any type of Dial, but no Dial is permitted to have its output connected to the input of any RDial. For example, RCDial 2740 has an output coupled to the input of CDial 2724. Although not explicitly illustrated in FIG. 27, it should be noted that an RDial may have outputs connected to the inputs of RDials and/or Dials at multiple different levels of the same subtree.

To prevent conflicting settings, the Dials and Dial groups defined hereinabove permit each latch, Dial, and Dial group to have at most one Dial or Dial group as a parent hierarchically "above" it in an n-way Dial tree. For example, each of CDial 2722 and CDial 2724 has only one Dial parent (i.e., CDial 2720), each of LDial 2726 and IDial 2728 has only one Dial parent (i.e., CDial 2722), and each of LDial 2730 and IDial 2732 has only one Dial parent (i.e., CDial 2724). However, because RDials and RDial groups are, by definition, read-only, any Dial or RDial may have one or more RDial or RDial group parents without any possibility of conflict between Dial settings. That is, an RDial may have its output connected to a latch, Dial or RDial to which the output of another RDial or Dial is also connected, subject to the other rules and provided that no closed loop is formed. Stated another way, each latch and Dial is permitted to have at most one Dial parent, but each latch, Dial and RDial can have one or more RDial parents, regardless of whether the latch or Dial also has a Dial parent. For example, in configuration database 2700 of FIG. 27, an output of each of RCDial 2740 and RCDial 2750 is connected to the input of RCDial 2742. Similarly, CDial 2720 and RCDial 2740 each have an output connected to the input of CDial 2724. Also, RLDial 2752 and LDial 2754 each have an output connected to latch 2776.

The final rule regards the construction of RDial groups. As described above in detail with reference to FIG. 11A, in a preferred embodiment, a Dial group may only contain top-level Dial(s) and/or other hierarchically nested Dial group(s). In contrast, an RDial group may contain an RDial or Dial at any level of hierarchy and/or a Dial group or RDial group. This additional flexibility is permitted because RDial groups, like RDials, are never set by a simulator or system firmware.

The implementation of RDials and RDial groups within a configuration database in combination with the Dials and Dial groups previously described in accordance with the rules set forth above permits construction of three classes of trees. First, as exemplified by Dial trees 2702 and 2708, a tree may comprise Dial(s) and latch(es), but no RDials. Second, a RDial tree, for example, RDial tree 2706, may comprise RDial(s) and latch(es), but no Dials. Third, a hybrid tree may be constructed that contains one or more RDials, one or more Dials, and one or more latches, as illustrated by hybrid tree 2704.

In order to support RDials and RDial groups, some modifications are made to a simulation configuration database and a HW configuration database. First, the value set of the type field 1220 within each DDDS 1200 is augmented to include additional values identifying RDial groups and the additional types of RDials. For example, the value set may be augmented with values RL, RC, RI and RG to respectively identify DDDSs 1200 corresponding to RLDials, RCDials, RIDials and RDial groups. The addition of these new values ensures that a set_Dial() or set_Dial_group() API call, which preferably test the type field 1220 of the associated DDDS 1200 prior to attempting to set any instance, will not attempt to set an RDial or RDial group.

Figure 28A:
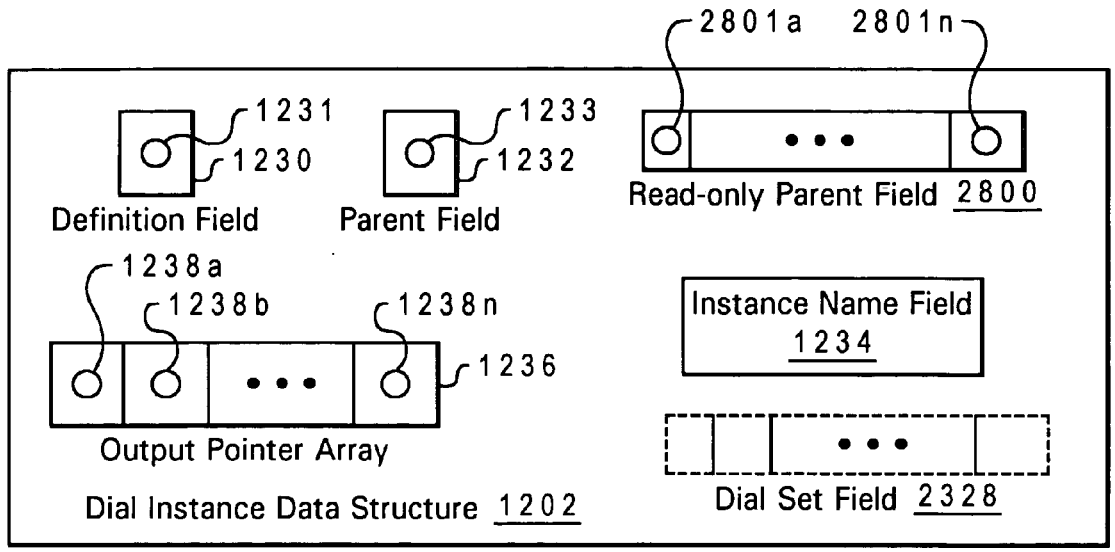
FIGS. 28A-28B respectively illustrate the inclusion of read-only parent fields within Dial instance data structures and latch data structures of a configuration database in order to support read-only Dials and read-only Dial groups in accordance with one embodiment of the present invention.

In addition, as illustrated in FIG. 28A, each DIDS 1202 is expanded to include a read-only parent field 2800 including zero or more read-only parent pointers 2801. Each non-NULL read-only parent pointer 2801 defines either a connection between the input of the instance represented by the DIDS 1202 and the output of a higher-level RDial or the inclusion of the instance represented by the DIDS 1202 within an RDial group. As noted above, in addition to a Dial or Dial group parent, if any, an instance represented by a DIDS 1202 can have multiple RDial parents and/or belong to multiple RDial groups.

Figure 28B:
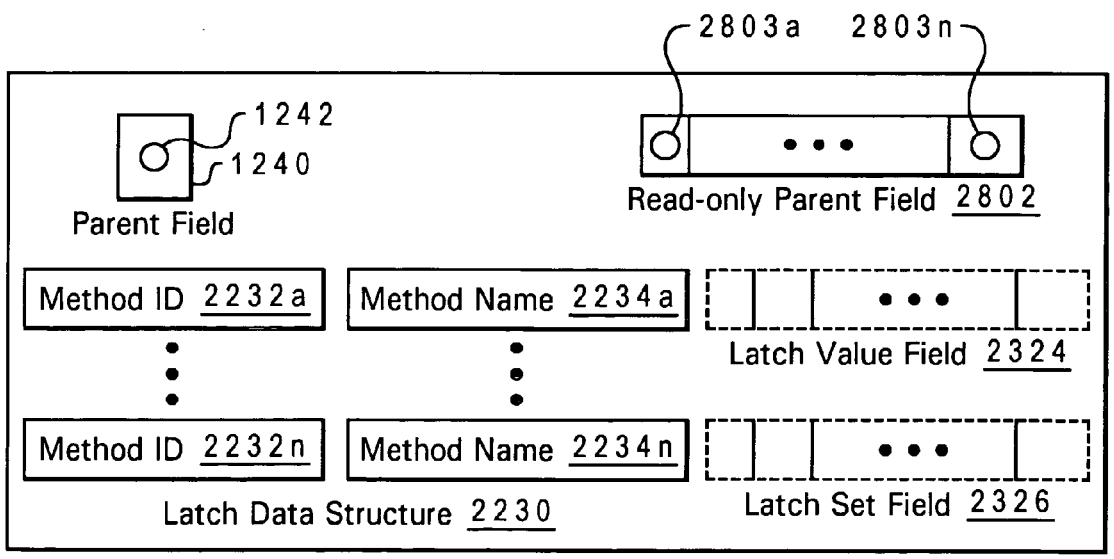

As depicted in FIG. 28B, latch data structures within a configuration database (e.g., latch data structure 2230 of a HW configuration database or latch data structure 1204 of a simulation configuration database) are similarly augmented to include a read-only parent field 2802 including one or more read-only parent pointers 2803. Each non-NULL read-only parent pointer 2803 defines a connection between the input of the latch instance represented by the latch data structure and the output of a RIDial or RLDial. As noted above, in simulation, latch names within latch name field 1244 (FIG. 12) are preferably specified with reference to the scope of the LDial or IDial indicated by parent pointer 1242. If parent pointer 1242 is NULL, indicating that the configuration latch corresponding to the latch data structure 1204 has no Dial parent, the latch name contained within latch name field 1244 is preferably specified with reference to the scope of the RLDial or RIDial corresponding to the DIDS 1202 identified by the first read-only parent pointer 2803 within read-only parent field 2802.

Finally, top-level pointer array 1206 (FIG. 12), although structurally unchanged, is increased in length to support RDials and RDial groups. Specifically, top-level pointer array 1206 includes top-level pointers 1250 to the DIDS 1202 of each top-level RDial group, each top-level RDial included within an RDial group (i.e., having a non-NULL read-only parent field 2800), and each top-level RDial not included within an RDial group (i.e., having a NULL read-only parent field 2800).

The foregoing modifications to the data structures in a configuration database to support RDials and RDial groups necessitates concomitant modifications to the method of loading and expanding a configuration database from non-volatile storage into volatile storage that was described above with reference to FIG. 13. FIG. 29 is a high level logical flowchart of an exemplary method of loading a configuration database containing RDial and/or RDial groups from non-volatile storage into volatile memory in accordance with a preferred embodiment of the present invention. As indicated by the use of like reference numerals, the method illustrated in FIG. 29 is substantially similar to that described above with reference to FIG. 13, with some additions to ensure that each data structure is processed only once.

As indicated by prime notation ('), a first modification to the method previously described is made at block 1308'. In the method of FIG. 13, block 1308 represents a determination of whether or not the DIDS 1202 referenced by the current top-level pointer 1250 corresponds to a Dial or Dial group belonging to a Dial group. Block 1308' in FIG. 29 adds to this determination a further determination of whether or not the DIDS 1202 referenced by the current top-level pointer 1250 corresponds to a Dial, RDial, Dial group or RDial group belonging to a RDial group. If either determination obtains an affirmative response, processing of the current top-level pointer 1250 terminates as indicated by the process returning to block 1304 because the DIDS 1202 referenced by the current top-level pointer 1250 will be processed when the Dial group or RDial group is processed. This determination ensures that the DIDS 1202 of top-level Dials and RDials are processed only once.

To ensure that lower-level data structures are also processed only one time during the process of loading the configuration database into volatile memory, a further determination is made at block 2900 whether the DIDS 1202 referenced by the current top-level pointer 1250 corresponds to a RDial or RDial group. If not, that is, if the tree rooted at the DIDS 1202 corresponds to a Dial or Dial group, then none of the "children" in the tree can be RDials or RDial groups. Accordingly, the subtree below the current DIDS 1202 can be processed as before, as indicated by the process passing from block 2900 to block 1316.

However, in response to a determination at block 2900 that the DIDS 1202 referenced by the current top-level pointer 1250 corresponds to a RDial or RDial group, the process passes to block 2902 and following blocks, which represent processing the subtree of the RDial or RDial group to ensure that each data structure in the configuration database is processed only once. To track which data structures have been processed, the current DIDS 1202 is first marked as processed at block 2902. Then, as indicated at block 2904, the process enters a processing loop in which each output pointer 1238 within the output pointer array 1236 of the current top-level DIDS 1202 is processed. Once all output pointers 1238 have been processed, the process exits the processing loop and returns to block 1304, which represents a determination of whether or not any additional top-level pointers remain to be processed.

If a determination is made at block 2904 that not all output pointers 1238 have been processed, the next output pointer 1238 within output pointer array 1236 is selected for processing at block 2906. The process then proceeds to blocks 2910 and 2912, which respectively illustrate a determination of whether or not the selected output pointer 1238 points to a DIDS 1202 corresponding to a Dial or Dial group, or whether the DIDS 1202 referenced by the output pointer is a RDial or RDial group that has been marked as previously processed. If a positive result is obtained at block 2910, an interface between an RDial or RDial group and a Dial or Dial group has been located. Because the subtree headed by the Dial or Dial group will be processed when another top-level pointer 1250 is selected for processing, processing of this subtree terminates, and the process returns to block 2904. Processing of the subtree similarly terminates in response to a determination at block 2912 that the DIDS 1202 referenced by the current output pointer 1238 (which corresponds to a RDial or RDial group) is marked as previously processed.

If, on the other hand, the determinations illustrated at blocks 2910 and 2912 yield negative results, the DIDS 1202 or latch data structure 1204 referenced by the current output pointer 1238 is marked and processed at block 2914. The processing performed at block 2914 is the same as that illustrated at block 1310, 1312, 1314 and 1316 and described above. As further indicated at block 2914, each lower level data structure in the subtree up to and including the latch(es) terminating the subtree is similarly marked and processed, subject to the two conditions depicted at block 2912 and 2914. That is, processing of any subtree is discontinued if an interface with a Dial or Dial group is detected or if a data structure (e.g., a latch data structure 1204 or DIDS 1202 corresponding to a RDial or RDial group) that has been marked is detected. Following block 2914, the process returns to block 2904, which has been described.

The implementation of RDials and RDial groups also entails some adjustments in the manner in which Dials, Dial groups, RDials, and RDial groups are read for both simulation and hardware implementations of the digital design. In particular, as the trees are traversed to create the latch set of interest ultimately targeted by a read_Dial() or read_Dial_group() API call, for example, at blocks 1620 (FIG. 16A) and 1660 (FIG. 16B), the "branches" (i.e., DIDS 1202 corresponding to Dials or RDials) traversed to create the latch set are preferably recorded or marked. In this manner, when the latch values of the latches in the latch set are propagated "up" the trees to obtain Dial and RDial settings, for example, as illustrated at block 1624 (FIG. 16A) and 1664 (FIG. 16B), the correct branches are upwardly traversed from the latch data structures 1204 to obtain the Dial or RDial settings of interest. In other words, because a Dial or RDial may have one or more RDial parents in addition to a single Dial parent, if any, the parent pointers of the branches traversed downwardly to obtain the latch values must be recorded or marked to ensure that the same branches are traversed upwardly to obtain the desired Dial or RDial setting.

Figure 27:
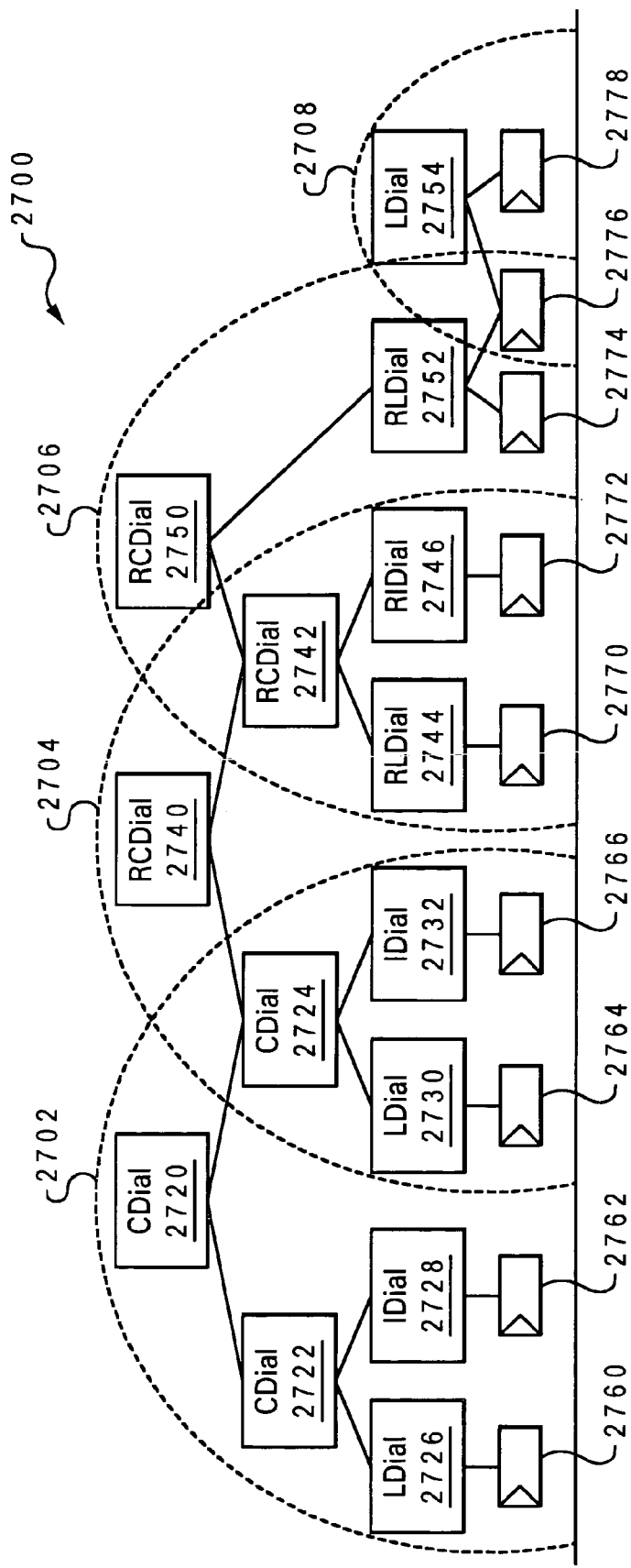
FIG. 27 is a graphical representation of the contents of an exemplary configuration database including both Dials and read-only Dials in accordance with the present invention.

Another adjustment is preferably made to the compression routine illustrated in FIGS. 26A-26C. In the described embodiment, block 2632 of FIG. 26B depicts removing the entire Dial tree of a top-level DIDS 1202 that Dial usage information 2500 (and therefore the DIPF) indicates was not set or read. With the implementation of RDials and RDial groups, which as shown in FIG. 27 permits the upward branching of trees, it is preferable if this step is modified to preserve any lower level DIDSs 1202 also belonging to the subtree of a RDial instance that was read. In this modification, after the top-level DIDS 1202 is removed, the DIPF of each lower level DIDS 1202 in the subtree of the deleted DIDS 1202 is tested to determine if it has the value TRUE, which indicates that the lower level DIDS 1202 also belongs to a tree that was read. If not, the lower level DIDS 1202 can also be removed, and the removal process continues down the subtree. However, if a lower level DIDS 1202 having a DIPF set to TRUE is located, that lower level DIDS 1202 and its subtree are not removed. However, its parent pointer 1233 is set to NULL to reflect the removal of the parent DIDS 1202 referenced by parent pointer 1233.

When debugging and testing a hardware digital design in a laboratory environment or responding to a failure of a deployed hardware system, analysis of failures to determine their causes is a crucial task. Conventionally, to facilitate the determination of the causes of a failure, a scan dump of all of the test scan chains within the hardware digital system is obtained. The scan chain images are then analyzed to determine the cause of the failure. Frequently, particular scan chain bits are hand-selected and input into a simulation model of the digital system in an attempt to reproduce the failure in simulation. Simulation of hardware failures enables the improved signal visibility and stepping capability of a simulator to be leveraged to assist in the determination of the causes of the failures.

This conventional failure analysis is tedious and error prone in that a user must first attempt to determine which bits in the "sea of bits" provided by the scan dump are important to port to the simulation system in order to recreate the error condition. The user must then scan through the scan dump by hand by reference to possibly erroneous paper documentation in order to determine the values of the bits of interest. Finally, the user must program a RTX or other software program to load the latches of the simulation model with the appropriate bit values.

Figure 30:
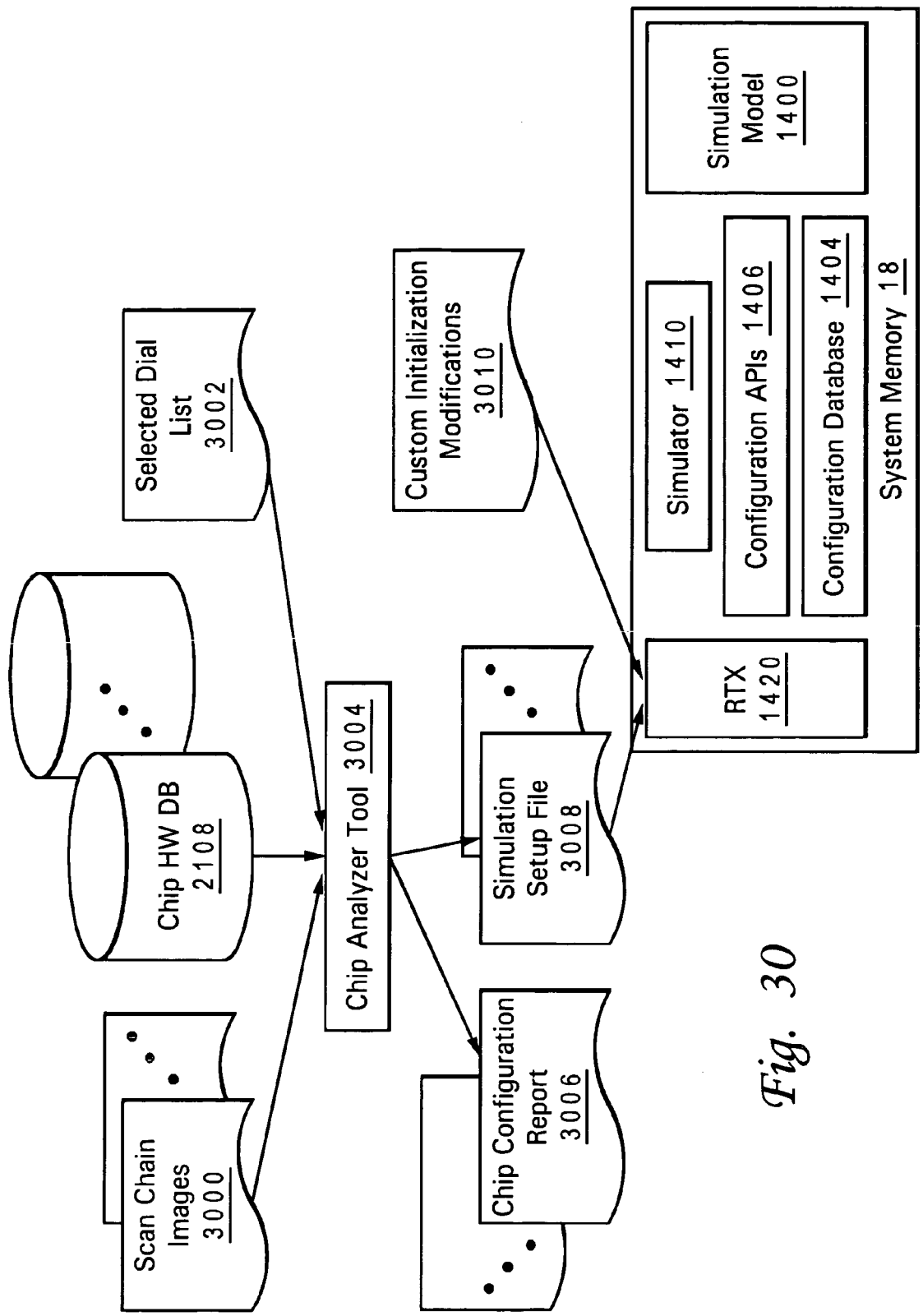
FIG. 30 is a high level flow diagram of an exemplary process for analyzing a selected state of a hardware system, and in particular, a failure state of a hardware system, in accordance with the present invention.

The present invention improves upon such prior art analysis techniques by leveraging the features of the configuration specification language and the hardware and simulation configuration databases described above. With reference now to FIG. 30, there is depicted a high level logical flowchart of an exemplary process for utilizing a simulation model to analyze a selected state of a hardware system, and in particular, a failure state of a hardware system. As shown, the process begins with the operation of a chip analyzer tool 3004, which preferably comprises software executing on a computer system, such as data processing system 6 of FIG. 1. Chip analyzer tool 3004 receives as inputs test scan chain images 3000, which collectively represent the system failure state and which each contain the latch values of all of the latches of a respective integrated circuit chip within a hardware digital design (e.g., a server computer system under test). In addition, chip analyzer tool 3004 receives the per-chip-type chip HW database 2108 for each type of integrated circuit chip within the hardware digital design.

Finally, chip analyzer tool 3004 is provided a selected Dial list 3002, which identifies which Dials within each chip HW database 2108 are deemed relevant to approximate the hardware failure state in simulation.

Chip analyzer tool 3004 processes the scan chain images 3000 and the selected Dial list 3002 by reference to chip HW databases 2108 to generate a respective chip configuration report 3006 and simulation setup file 3008 for each integrated circuit chip in the hardware digital design. Each chip configuration report 3006 comprises a human-readable and printable listing of all of the Dial instances associated with a particular integrated circuit in the hardware digital design, together with the setting (if a legal value is available) of each Dial instance at the point of failure. For Dial instances for which legal values are not available, the underlying latch values are reported. Each simulation setup file 3008 is a machine-readable file specifying the setting (if a legal value is available) of each Dial identified in selected Dial list 3002 that is associated with the corresponding integrated circuit chip. As explained below, an RTX 1420 (FIG. 14) utilizes simulation setup files 3008 to configure a simulation model 1400 of the hardware digital system to a state approximating the failure state of the hardware digital design.

Figure 31:
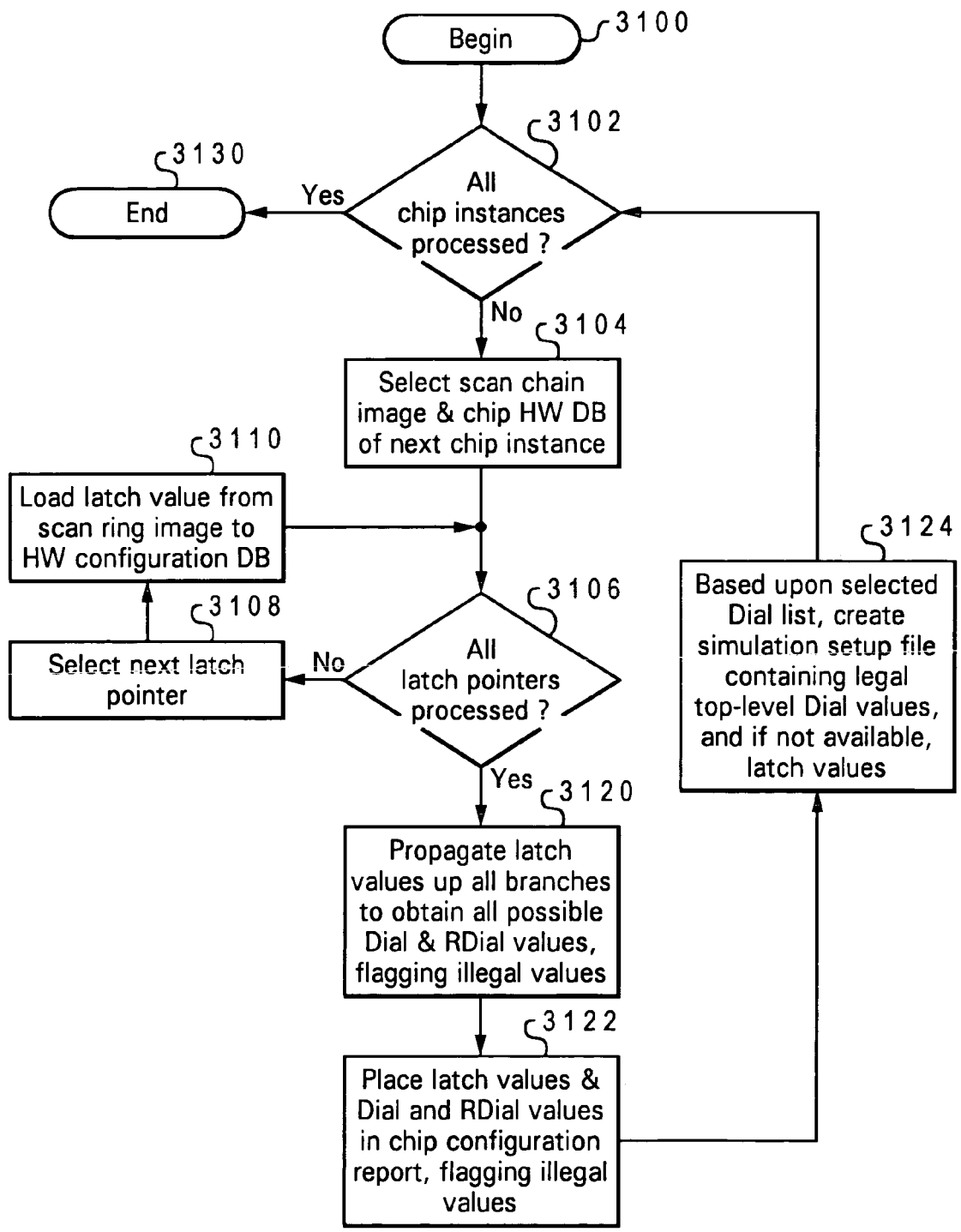
FIG. 31 is a high level logical flowchart of an exemplary method by which the chip analyzer tool of FIG. 30 generates chip configuration reports and simulation setup files utilized to analyze hardware failures in accordance with the present invention.

Referring now to FIG. 31, there is illustrated a high level logical flowchart of an illustrative method by which chip analyzer tool 3004 of FIG. 30 generates the chip configuration reports 3006 and simulation setup files 3008 utilized to analyze hardware failures in accordance with the present invention. As illustrated, the process begins at block 3100 and then proceeds to block 3102, which depicts chip analyzer tool 3004 determining whether the scan chain images 3000 of each integrated circuit chip within the hardware digital design have been processed. If the scan chain images 3000 of all integrated circuit chips have been processed, the process terminates at block 3130. If, however, fewer than all of the scan chain images 3000 have been processed, the scan chain images 3000 and chip HW database 2108 of the next integrated circuit chip to be processed are selected at block 3104.

The process shown in FIG. 31 then enters a processing loop at blocks 3106-3110 in which each latch value of interest scanned from the current integrated circuit chip is processed by reference to the latch pointers 1254 in the latch pointer array 1210 of chip HW database 2108. Specifically, chip analyzer tool 3004 determines at block 3106 whether or not all latch pointers 1254 have been processed. If so, the process passes from block 3106 to block 3120, which is described below. If, however, all latch pointers 1254 have not yet been processed, the next latch pointer 1254 within latch pointer array 1210 is selected for processing at block 3108. Next, at block 3110, chip analyzer tool 3004 utilizes the test scan ring identifier and offset value pair contained in the method name field 2234a (FIG. 23B) of the latch data structure 2230 referenced by the current latch pointer 1254 to locate within scan ring images 3000 the latch value of the hardware latch corresponding to the latch data structure 2230. This latch value is then stored within the appropriate entry of latch value field 2324, which is determined by reference to the position of the chipID of the current integrated circuit chip within chip mapping table 2325. Thereafter, the process returns to block 3106.

In response to a determination at block 3106 that all latch pointers 1254 within the latch pointer array 1210 of the current chip HW database 2108 have been processed, the process proceeds to block 3120. Block 3120 depicts chip analyzer tool 3004 propagating the set of latch values contained in each latch value field 2324 up all branches of the DIDS trees within the chip HW database 2108 by reference to mapping tables 1224 in order to obtain the setting (i.e., input value) of each Dial and RDial, if possible. Given the fact that the latch values within latch value fields 2324 correspond to a hardware failure state, it is frequently the case that an attempt to propagate at least some latch values up a tree will result in at least one "output" value that is not among the legal output values specified within the mapping table 1224 for a Dial or RDial instance. In such cases, the Dial or RDial instance (and any RDial or Dial above it in the same tree) is flagged as having an illegal value. Such illegal values frequently suggest the cause of the hardware failure.

It should be noted that the ability to derive Dial and RDial values from latch values depends upon the invertibility of the configuration specification language introduced by the present invention. That is, without a one-to-one mapping between Dial (and RDial) inputs and outputs, Dial (and RDial) settings cannot be definitely determined from latch values, as shown at block 3120.

Following block 3120, the process proceeds to block 3122, which depicts chip analyzer tool 3004 creating a chip configuration report 3006 for the current integrated circuit chip. As noted above, chip configuration report 3006 is a human-readable file containing a listing of all Dial and RDial instances within the current chip HW database 2108 and their corresponding settings, if any, determined at block 3120. Dial and RDial instances having illegal values are flagged in chip configuration report 3006, and the latch values of the underlying latches are listed to facilitate analysis. As shown at block 3124, chip analysis tool 3004 also creates an RTX-compatible simulation setup file 3008 for the current integrated circuit. Simulation setup file 3008 preferably includes the Dial settings of only the Dial instances specified within selected Dial list 3002, and if a Dial instance specified in selected Dial list 3002 has an illegal value, the latch values of the underlying latches in the latch set controlled by the Dial. These Dial instance settings and latch values can then be applied automatically to a simulation model 1400 by an RTX 1420 running in a simulation environment, as explained below.

It should be appreciated that because the number of latches controlled by Dials is typically only a small percentage of the overall number of latches in an integrated circuit, the designer of the digital system, through the use of the configuration specification language of the present invention to associate Dials with particular configuration latches, has already greatly reduced the number of latch values to be considered in recreating the system failure state and has identified those latches most likely to be necessary to reproduce the hardware failure state. Selected Dial list 3002 further reduces the amount of hardware state information to be ported back into a simulation model 1400 by designating particular user-selected Dial instances (not RDial instances) of interest.

Following block 3124, the process depicted in FIG. 31 returns to block 3102 for the processing of the next integrated circuit chip in the hardware digital design, if any. After all integrated circuit chips within the hardware digital design are processed, the process terminates at block 3130.

Referring again to FIG. 30, following the creation of a respective simulation setup file 3008 for each integrated circuit chip within the hardware digital design in accordance with the process of FIG. 31, the hardware failure state is approximated within a simulation model 1400 of the digital design through the execution of RTX 1420. As an aside, it should be noted that it is generally undesirable to reproduce the exact hardware failure state in simulation because the digital design, by definition, will not operate correctly from the failure state.

In order to approximate the hardware failure state in simulation, RTX 1420 first makes standard API calls to the APIs provided by simulator 1410 in order to perform the normal initialization procedures utilized to initialize simulation model 1400 for simulation. Next, RTX 1420 may optionally make individual user-specified customizations to the configuration of simulation model 1400 based upon the contents of a user-provided custom initialization modifications file 3010. These custom modifications may be made, for example, to adjust a parameter to expose a particular failure mode or to improve the visibility of certain types of failures. Finally, RTX 1420 applies the Dial instance settings and latch values contained in simulation setup files 3008. As described in detail above with reference to FIGS. 14 and 17A, RTX 1420 sets Dial instances through set_Dial() API calls to a configuration API 1406, which, after reflecting the Dial instance settings in simulation configuration database 1404, calls PUTFAC() API 1414 to set corresponding latch values in simulation model 1400. RTX 1420 similarly utilizes API calls to set the configuration latches of simulation model 1400 and latch value fields 1246 (FIG. 12) of configuration database 1404 with the latch values contained within simulation setup files 3008 that correspond to illegal Dial values. With simulation model 1400 thus configured, RTX 1420 directs execution of one or more testcases against simulation model 1400 by simulator 1410 in order to attempt reproduction of the hardware failure state in simulation.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration entities having different rules than the particular exemplary embodiments disclosed herein. In addition, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method in a data processing system for determining the configuration of a digital design including a plurality of latches, said method comprising:
   receiving a read request;
   in response to receiving the read request:
      identifying one or more Dial instances of one or more Dials encompassed by the read request, wherein each of the one or more Dials defines a mapping between each of a plurality of different settings of that Dial and a respective one of a plurality of different Dial output values, and wherein each of the one or more Dial instances is an instantiation of one of the one or more Dials and has an output logically coupled to an associated latch set within the digital design;

accessing a configuration database associated with the digital design to identify a respective latch set associated with each identified Dial instance, each latch set containing a subset of said plurality of latches; and reading, from the digital design, a latch value of each latch in the latch set of each identified Dial instance;

the data processing system determining, by reference to the configuration database, a setting of each of the one or more Dial instances based upon the latch value of each latch in the latch set of that Dial instance, said configuration database specifying, for each of the one or more Dials, a mapping uniquely associating each of a plurality of different settings of that Dial with a respective one of a plurality of different sets of latch values; and the data processing system outputting said setting of each of said one or more identified Dial instances.

2. The method of claim 1, wherein said latch values comprise binary values, and said outputting comprises outputting an enumerated value.

3. The method of claim 1, and further comprising creating said configuration database.

4. The method of claim 3, wherein said digital design is a hardware digital design including a plurality of different types of integrated circuit chips, and wherein said creating comprises creating a respective configuration database for each of said plurality of different types of integrated circuit chips.

5. The method of claim 1, wherein:
said one or more Dial instances include a first Dial instance of a first Dial having a first mapping in said configuration database;
said configuration database includes one or more data structures defining a tree including said first Dial instance and at least a second Dial instance logically coupled between said first Dial instance and latches in said latch set of said first Dial instance;
said determining said setting comprises:
determining a setting of said second Dial instance based upon the latch value of each latch in said latch set of said second Dial instance and a second mapping in said configuration database associated with said second Dial instance; and
determining a setting of said first Dial instance based upon said setting of said second Dial instance and said first mapping.

6. The method of claim 1, wherein said digital design is a hardware digital system, said method further comprising inputting said setting into a simulation system to configure a simulation model of said digital design.

7. The method of claim 6, wherein said inputting comprises inputting said setting oniy if said setting is defined by said mapping as a legal value, and wherein, responsive to a determination that said setting is an illegal value, inputting one or more latch values read from said hardware digital system.

8. The method of claim 6, and further comprising applying said setting to said simulation system following initial configuration of said simulation system.

9. A data processing system for testing a digital design including a plurality of latches having a set of latch values, said data processing system comprising:

processing resources;
data storage;
a configuration database for the digital design within said data storage, wherein, for multiple Dials that each defines a mapping between each of a plurality of different settings of that Dial and a respective one of a plurality of different Dial output values, the configuration database;
defines one or more Dial instances that are instantiations of at least one of the multiple Dials and that each has an output logically coupled to an associated latch set within the digital design containing a subset of the plurality of latches,
associates each Dial instance with its respective associated latch set, and
specifies a mapping uniquely associating each of a plurality of different settings of the Dial with a respective one of a plurality of different sets of latch values;
means, responsive to receipt of a read request, for identifying one or more Dial instances of one or more Dials encompassed by the read request, for accessing the configuration database to identify a respective latch set associated with each identified Dial instance, and for reading from the digital design a latch value of each latch in the latch set of each identified Dial instance;
means for determining, by reference to the configuration database, a setting of each of the one or more Dial instances based upon the latch value of each latch in the latch set of that Dial instance; and
means for outputting said setting of each of said one or more identified Dial instances.

10. The data processing system of claim 9, wherein said latch values comprise binary values, and said means outputting comprises means for outputting an enumerated value.

11. The data processing system of claim 9, wherein said digital design is a hardware digital design including a plurality of different types of integrated circuit chips, and wherein said configuration database comprises a respective chip hardware database for each of said plurality of different types of integrated circuit chips.

12. The data processing system of claim 9, wherein:
said one or more Dial instances include a first Dial instance of a first Dial having a first mapping in said configuration database;
said configuration database includes one or more data structures defining a tree including said first Dial instance and at least a second Dial instance logically coupled between said first Dial instance and latches in said latch set of said first Dial instance;
said means for determining said setting comprises:
means for determining a setting of said second Dial instance based upon the latch value of each latch in said latch set of said second Dial instance and a second mapping in said configuration database associated with said second Dial instance; and
means for determining a setting of said first Dial instance based upon said setting of said second Dial instance and said first mapping.

13. The data processing system of claim 9, wherein said digital design is a hardware digital system, said means for outputting comprising means for outputting said setting in a simulation setup file suitable for configuring a simulation model of said digital design.

14. The data processing system of claim 13, wherein said means for outputting comprises:

means for outputting said setting in said simulation setup file only if said setting is defined by said mapping as a legal value;

means for outputting said set of one or more latch values read from said hardware digital system in said simulation setup file responsive to a determination that said setting is an illegal value.

15. A program product for testing a digital design including a plurality of latches having a set of latch values, said program product comprising:

a tangible computer usable medium; and a program encoded in said computer usable medium, said program including:

means, responsive to receipt of a read request, for identifying one or more Dial instances of one or more Dials encompassed by the read request, for accessing a configuration database of the digital design to identify a respective latch set associated with each identified Dial instance, and for reading from the digital design a latch value of each latch in the latch set of each identified Dial instance, wherein:

each of the one or more Dials defines a mapping between each of a plurality of different settings of that Dial and a respective one of a plurality of different Dial output values, and each of the one or more Dial instances is an instantiation of one of the one or more Dials and has an output logically coupled to its associated latch set within the digital design;

means for determining, by reference to the configuration database, a setting of each of the one or more Dial instances based upon the latch value of each latch in the latch set of that Dial instance, wherein, for each of multiple Dials, said configuration database defines one or more Dial instances, associates each Dial instance with a respective latch set containing a subset of the plurality of latches, and specifies a mapping uniquely associating each of a plurality of different settings of the Dial with a respective one of a plurality of different sets of latch values; and means for outputting said setting of each of said one or more identified Dial instances.

16. The program product of claim 15, wherein said latch values comprise binary values, and said means outputting comprises means for outputting an enumerated value.

17. The program product of claim 15, wherein said digital design is a hardware digital design including a plurality of different types of integrated circuit chips, and further comprising said configuration database, wherein said configuration database comprises a respective chip hardware database for each of said plurality of different types of integrated circuit chips.

18. The program product of claim 15, wherein:

said one or more Dial instances include a first Dial instance of a first Dial having a first mapping in the configuration database;

said configuration database includes one or more data structures defining a tree including said first Dial instance and at least a second Dial instance logically coupled between said first Dial instance and latches in said latch set of said first Dial instance;

said means for determining said setting comprises:

means for determining a setting of said second Dial instance based upon the latch value of each latch in said latch set of said second Dial instance and a second mapping in said configuration database associated with said second Dial instance; and means for determining a setting of said first Dial instance based upon said setting of said second Dial instance and said first mapping.

19. The program product of claim 15, wherein said digital design is a hardware digital system, said means for outputting comprising means for outputting said setting in a simulation setup file suitable for configuring a simulation model of said digital design.

20. The program product of claim 19, wherein said means for outputting comprises:

means for outputting said setting in said simulation setup file only if said setting is defined by said mapping as a legal value;

means for outputting said set of one or more latch values read from said hardware digital system in said simulation setup file responsive to a determination that said setting is an illegal value.

* * * * *